United States Patent
Han et al.

(10) Patent No.: US 12,046,675 B2
(45) Date of Patent: Jul. 23, 2024

(54) MEMORY DEVICE COMPRISING AN ELECTRICALLY FLOATING BODY TRANSISTOR AND METHODS OF USING

(71) Applicant: Zeno Semiconductor, Inc., Sunnyvale, CA (US)

(72) Inventors: Jin-Woo Han, San Jose, CA (US); Dinesh Maheshwari, Fremont, CA (US); Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 18/234,043

(22) Filed: Aug. 15, 2023

(65) Prior Publication Data

US 2023/0395716 A1 Dec. 7, 2023

Related U.S. Application Data

(63) Continuation of application No. 17/963,024, filed on Oct. 10, 2022, now Pat. No. 11,769,832, which is a continuation of application No. 17/092,659, filed on Nov. 9, 2020, now Pat. No. 11,489,073, which is a continuation of application No. 16/682,259, filed on (Continued)

(51) Int. Cl.
| | |
|---|---|
| *H10B 12/00* | (2023.01) |
| *H01L 27/12* | (2006.01) |
| *H01L 29/78* | (2006.01) |
| *G06F 11/10* | (2006.01) |
| *G11C 7/02* | (2006.01) |
| *G11C 11/408* | (2006.01) |
| *G11C 11/4096* | (2006.01) |
| *G11C 29/12* | (2006.01) |
| *G11C 29/52* | (2006.01) |

(52) U.S. Cl.
CPC ...... *H01L 29/7841* (2013.01); *H01L 27/1211* (2013.01); *H10B 12/20* (2023.02); *G06F 11/1068* (2013.01); *G11C 7/02* (2013.01); *G11C 11/4082* (2013.01); *G11C 11/4087* (2013.01); *G11C 11/4096* (2013.01); *G11C 29/12* (2013.01); *G11C 29/52* (2013.01); *H01L 29/785* (2013.01)

(58) Field of Classification Search
CPC .................................................... H10B 12/20
See application file for complete search history.

(56) References Cited

U.S. PATENT DOCUMENTS

| | | |
|---|---|---|
| 4,300,212 A | 11/1981 | Simko |
| 4,959,812 A | 9/1990 | Momodomi et al. |

(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.

(Continued)

*Primary Examiner* — Daniel P Shook
(74) *Attorney, Agent, or Firm* — Law Office of Alan W. Cannon

(57) ABSTRACT

A semiconductor memory cell comprising an electrically floating body having two stable states is disclosed. A method of operating the memory cell is disclosed.

22 Claims, 83 Drawing Sheets

Related U.S. Application Data

Nov. 13, 2019, now Pat. No. 10,854,745, which is a continuation of application No. 16/105,579, filed on Aug. 20, 2018, now Pat. No. 10,529,853, which is a continuation of application No. 15/798,342, filed on Oct. 30, 2017, now Pat. No. 10,079,301.

(60) Provisional application No. 62/552,048, filed on Aug. 30, 2017, provisional application No. 62/461,160, filed on Feb. 20, 2017, provisional application No. 62/451,439, filed on Jan. 27, 2017, provisional application No. 62/415,511, filed on Nov. 1, 2016.

(56) References Cited

U.S. PATENT DOCUMENTS

| | | |
|---|---|---|
| 4,975,764 A | 12/1990 | Hsu |
| 5,304,833 A | 4/1994 | Shigeki et al. |
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,277,689 B1 | 8/2001 | Wong |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,433,391 B1 | 8/2002 | En et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,835,979 B1 | 12/2004 | Liu et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,030,435 B2 | 4/2006 | Gnadinger |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,208,795 B2 | 4/2007 | Carver et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,376,006 B2 | 5/2008 | Bednorz et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,281,022 B2 | 3/2016 | Louie et al. |
| 9,368,625 B2 | 6/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,496,053 B2 | 11/2016 | Han et al. |
| 9,514,803 B2 | 12/2016 | Widjaja et al. |
| 9,524,970 B2 | 12/2016 | Widjaja |
| 9,536,595 B2 | 1/2017 | Louie et al. |
| 9,548,119 B2 | 1/2017 | Han et al. |
| 9,576,962 B2 | 2/2017 | Widjaja et al. |
| 9,589,963 B2 | 3/2017 | Widjaja |
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,578 B2 | 7/2017 | Louie et al. |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,799,392 B2 | 10/2017 | Han et al. |
| 9,812,203 B2 | 11/2017 | Widjaja |
| 9,812,456 B2 | 11/2017 | Widjaja |
| 9,831,247 B2 | 11/2017 | Han et al. |

(56) References Cited

U.S. PATENT DOCUMENTS

| | | |
|---|---|---|
| 9,847,131 B2 | 12/2017 | Widjaja |
| 9,865,332 B2 | 1/2018 | Louie et al. |
| 9,881,667 B2 | 1/2018 | Han et al. |
| 9,893,067 B2 | 2/2018 | Widjaja et al. |
| 9,905,564 B2 | 2/2018 | Widjaja et al. |
| 9,922,711 B2 | 3/2018 | Widjaja |
| 9,922,981 B2 | 3/2018 | Widjaja |
| 9,928,910 B2 | 3/2018 | Widjaja |
| 9,947,387 B2 | 4/2018 | Louie et al. |
| 9,960,166 B2 | 5/2018 | Widjaja |
| 9,978,450 B2 | 5/2018 | Widjaja |
| 10,008,266 B1 | 6/2018 | Widjaja |
| 10,026,479 B2 | 7/2018 | Louie et al. |
| 10,032,514 B2 | 7/2018 | Widjaja |
| 10,032,776 B2 | 7/2018 | Widjaja et al. |
| 10,056,387 B2 | 8/2018 | Widjaja |
| 10,074,653 B2 | 9/2018 | Widjaja |
| 10,079,236 B2 | 9/2018 | Widjaja |
| 10,079,301 B2 | 9/2018 | Han et al. |
| 10,103,148 B2 | 10/2018 | Louie et al. |
| 10,103,149 B2 | 10/2018 | Han et al. |
| 10,109,349 B2 | 10/2018 | Widjaja |
| 10,115,451 B2 | 10/2018 | Han et al. |
| 10,141,046 B2 | 11/2018 | Han et al. |
| 10,141,315 B2 | 11/2018 | Widjaja et al. |
| 10,157,663 B2 | 12/2018 | Louie et al. |
| 10,163,907 B2 | 12/2018 | Widjaja et al. |
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,354,718 B2 | 7/2019 | Louie et al. |
| 10,373,685 B2 | 8/2019 | Louie et al. |
| 10,388,378 B2 | 8/2019 | Widjaja |
| 10,403,361 B2 | 9/2019 | Widjaja |
| 10,453,847 B2 | 10/2019 | Widjaja et al. |
| 10,461,083 B2 | 10/2019 | Han et al. |
| 10,461,084 B2 | 10/2019 | Widjaja |
| 10,468,102 B2 | 11/2019 | Widjaja |
| 10,497,443 B2 | 12/2019 | Widjaja |
| 10,504,585 B2 | 12/2019 | Louie et al. |
| 10,515,968 B2 | 12/2019 | Widjaja |
| 10,522,213 B2 | 12/2019 | Han et al. |
| 10,529,424 B2 | 1/2020 | Widjaja |
| 10,529,853 B2 | 1/2020 | Han et al. |
| 10,546,860 B2 | 1/2020 | Louie et al. |
| 10,553,281 B2 | 2/2020 | Widjaja |
| 10,553,683 B2 | 2/2020 | Han et al. |
| 10,580,482 B2 | 3/2020 | Han et al. |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,076 B2 | 8/2020 | Widjaja |
| 10,748,904 B2 | 8/2020 | Widjaja et al. |
| 10,783,952 B2 | 9/2020 | Louie et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,839,905 B2 | 11/2020 | Louie et al. |
| 10,854,745 B2 | 12/2020 | Han et al. |
| 10,861,548 B2 | 12/2020 | Widjaja |
| 10,867,676 B2 | 12/2020 | Widjaja |
| 10,916,297 B2 | 2/2021 | Han et al. |
| 10,923,183 B2 | 2/2021 | Han et al. |
| 10,978,455 B2 | 4/2021 | Widjaja et al. |
| 10,991,697 B2 | 4/2021 | Louie et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,031,401 B2 | 6/2021 | Han et al. |
| 11,037,929 B2 | 6/2021 | Widjaja |
| 11,063,048 B2 | 7/2021 | Widjaja |
| 11,100,994 B2 | 8/2021 | Louie et al. |
| 11,133,313 B2 | 9/2021 | Widjaja |
| 11,183,498 B2 | 11/2021 | Widjaja et al. |
| 11,201,215 B2 | 12/2021 | Han et al. |
| 11,211,125 B2 | 12/2021 | Widjaja |
| 11,217,300 B2 | 1/2022 | Louie et al. |
| 11,250,905 B2 | 2/2022 | Han et al. |
| 11,295,813 B2 | 4/2022 | Widjaja |
| 11,328,765 B2 | 5/2022 | Han et al. |
| 11,342,018 B2 | 5/2022 | Louie et al. |
| 11,348,922 B2 | 5/2022 | Widjaja et al. |
| 11,348,923 B2 | 5/2022 | Widjaja |
| 11,404,420 B2 | 8/2022 | Widjaja |
| 11,417,657 B2 | 8/2022 | Widjaja et al. |
| 11,417,658 B2 | 8/2022 | Louie et al. |
| 11,488,665 B2 | 11/2022 | Widjaja |
| 11,488,955 B2 | 11/2022 | Widjaja |
| 11,489,073 B2 | 11/2022 | Han et al. |
| 11,545,217 B2 | 1/2023 | Widjaja |
| 11,551,754 B2 | 1/2023 | Widjaja |
| 11,594,280 B2 | 2/2023 | Louie et al. |
| 11,699,484 B2 | 7/2023 | Louie et al. |
| 11,715,515 B2 | 8/2023 | Han et al. |
| 11,727,987 B2 | 8/2023 | Widjaja |
| 11,729,961 B2 | 8/2023 | Widjaja |
| 11,737,258 B2 | 8/2023 | Widjaja et al. |
| 11,742,022 B2 | 8/2023 | Widjaja |
| 2002/0018366 A1 | 2/2002 | von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |

(56) References Cited

U.S. PATENT DOCUMENTS

| | | |
|---|---|---|
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1* | 1/2015 | Widjaja .................. H01L 29/70 257/315 |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0200005 A1 | 7/2015 | Han et al. |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0049190 A1 | 2/2016 | Han et al. |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148674 A1 | 5/2016 | Louie et al. |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025164 A1 | 1/2017 | Han et al. |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0076784 A1 | 3/2017 | Louie et al. |
| 2017/0092351 A1 | 3/2017 | Han et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |
| 2018/0012646 A1 | 1/2018 | Han et al. |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |
| 2018/0096721 A1 | 4/2018 | Louie et al. |
| 2018/0122457 A1 | 5/2018 | Han et al. |
| 2018/0122943 A1 | 5/2018 | Han et al. |
| 2018/0158825 A1 | 6/2018 | Widjaja et al. |
| 2018/0158912 A1 | 6/2018 | Han et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0204611 A1 | 7/2018 | Louie et al. |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0358360 A1 | 12/2018 | Han et al. |
| 2018/0374854 A1 | 12/2018 | Widjaja |
| 2019/0006367 A1 | 1/2019 | Widjaja |
| 2019/0006516 A1 | 1/2019 | Han et al. |
| 2019/0027220 A1 | 1/2019 | Widjaja |
| 2019/0027476 A1 | 1/2019 | Louie et al. |
| 2019/0043554 A1 | 2/2019 | Han et al. |
| 2019/0066768 A1 | 2/2019 | Han et al. |
| 2019/0067289 A1 | 2/2019 | Widjaja et al. |
| 2019/0080746 A1 | 3/2019 | Louie et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295629 A1 | 9/2019 | Louie et al. |
| 2019/0295646 A1 | 9/2019 | Widjaja |
| 2019/0311769 A1 | 10/2019 | Louie et al. |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0035682 A1 | 1/2020 | Han et al. |
| 2020/0051633 A1 | 2/2020 | Widjaja |
| 2020/0075091 A1 | 3/2020 | Louie et al. |
| 2020/0083373 A1 | 3/2020 | Han et al. |
| 2020/0090734 A1 | 3/2020 | Han et al. |
| 2020/0091155 A1 | 3/2020 | Widjaja |
| 2020/0111792 A1 | 4/2020 | Louie et al. |
| 2020/0118627 A1 | 4/2020 | Widjaja |
| 2020/0118628 A1 | 4/2020 | Widjaja |
| 2020/0135863 A1 | 4/2020 | Han et al. |
| 2020/0168267 A1 | 5/2020 | Han et al. |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335156 A1 | 10/2020 | Louie et al. |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0057027 A1 | 2/2021 | Louie et al. |
| 2021/0074358 A1 | 3/2021 | Widjaja |

(56) References Cited

U.S. PATENT DOCUMENTS

| | | |
|---|---|---|
| 2021/0083110 A1 | 3/2021 | Han et al. |
| 2021/0151097 A1 | 5/2021 | Han et al. |
| 2021/0183432 A1 | 6/2021 | Han et al. |
| 2021/0217754 A1 | 7/2021 | Louie et al. |
| 2021/0225844 A1 | 7/2021 | Widjaja et al. |
| 2021/0249078 A1 | 8/2021 | Widjaja |
| 2021/0257025 A1 | 8/2021 | Widjaja |
| 2021/0257365 A1 | 8/2021 | Widjaja |
| 2021/0288051 A1 | 9/2021 | Han et al. |
| 2021/0327880 A1 | 10/2021 | Widjaja |
| 2021/0358547 A1 | 11/2021 | Louie et al. |
| 2021/0375870 A1 | 12/2021 | Widjaja |
| 2021/0398981 A1 | 12/2021 | Widjaja |
| 2022/0059537 A1 | 2/2022 | Widjaja et al. |
| 2022/0085168 A1 | 3/2022 | Han et al. |
| 2022/0093175 A1 | 3/2022 | Widjaja |
| 2022/0115061 A1 | 4/2022 | Louie et al. |
| 2022/0130451 A1 | 4/2022 | Han et al. |
| 2022/0199160 A1 | 6/2022 | Widjaja |
| 2022/0246205 A1 | 8/2022 | Han et al. |
| 2022/0262430 A1 | 8/2022 | Louie et al. |
| 2022/0262800 A1 | 8/2022 | Widjaja |
| 2022/0278104 A1 | 9/2022 | Widjaja et al. |
| 2022/0352168 A1 | 11/2022 | Widjaja |
| 2022/0359522 A1 | 11/2022 | Widjaja et al. |
| 2022/0367472 A1 | 11/2022 | Louie et al. |
| 2023/0024277 A1 | 1/2023 | Widjaja |
| 2023/0035384 A1 | 2/2023 | Han et al. |
| 2023/0045758 A1 | 2/2023 | Widjaja |
| 2023/0125479 A1 | 4/2023 | Widjaja |
| 2023/0128791 A1 | 4/2023 | Widjaja |

OTHER PUBLICATIONS

Campardo G. et al., VLSI Design of Non-Volatile Memories, 2005.
Han et al. Programming/Erasing Characteristics of 45 nm NOR-Type Flash Memory Based on SOI FinFET Structure. vol 47, Nov. 2005, pp. S564-S567.
Headland. Hot electron injection, Feb. 19, 2004.
Lanyon, et al., "Bandgap Narrowing in Moderately to Heavily Doped Silicon", ppl 1014-1018, No. 7, vol. ED-26, 1979.
Lin, et al., A new 1T DRAM Cell with enhanced Floating Body Effect, pp. 1-5, 2006.
Oh, et al., a 4-Bit Double SONOS memory (DSM) with 4 Storage Nodes Per Cell for Ultimate Multi-Bit Operation, pp. 1-2, 2006.
Ohsawa et al., An 18.5ns 128Mb SOI DRAM with a Floating body Cell, IEEE International Solid-State Circuits Conference, 2005, pp. 458-459, 609.
Ohsawa, et al. Autonomous refresh of floating body cell (FBC), 2008, pp. 801-804.
Ohsawa, et al. Autonomous refresh of floating-body cell due to current Anomaly of Impact Ionization, 2009, pp. 2302-2311.
Ohsawa et al., Memory Design Using One-Transistor Gain Cell on SOI, Tech. Digest, IEEE International Solid-State Circuits, vol. 37, No. 11, 2002, pp. 1510-1522.
Ohsawa, et al., "A Novel Capacitor-less DRAM Cell: Floating Body Cell", CRC Press, Taylor & Francis Group, 2012, pp. 1-7.
Okhonin, et al. A Capicitor-Less IT-DRAM Cell, vol. 23, No. 2, Feb. 2002, pp. 85-87.
Okhonin et al. A SOI Capacitor-less 1T-DRAM Concept. 2001, pp. 153-154.
Okhonin, et al., Principles of Transient Charge Pumping on Partially Depleted SOI MOSFETs, IEEE Electron Device Letters, vol. 23, No. 5, May 2002, pp. 279-281.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Robert F. Pierret. Semiconductor Device Fundamentals, ISBN: 0-201-54393-1, 1996, by Addison-Wesley Publishing Company, Inc. PNPN Devices 463-476.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Rothemund, et al., The importance of being modular, vol. 485, May 2012 pp. 584-585.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitor-less 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Waser, Rainer, Resistive non-volatile memory devices (Invited Paper), 2009, pp. 1925-1928.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
International Preliminary Report on Patentability re PCT/US2016/029436, Oct. 31, 2017.
Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.

(56) References Cited

OTHER PUBLICATIONS

Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHZ random cycle, asymmetric 2T gain cell embedded DRAM with a 99.9 percentile retention time of 110 μsec." VLSI Circuits (VLSIC), 2010 IEEE Symposium on. IEEE, 2010, pp. 191-192.
Chun, et al. "A 667 MHZ Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D Dram Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "a survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Kim, et al. Resistive-Memory Embedded Unified RAM (R-URAM, 2009, pp. 2670-2674.
Lu, et al., "A Floating-Body/Gate DRAM Cell Upgraded for Long Retention Time", IEEE Elec. Dev. Letters, vol. 32, No. 6, pp. 731-733, Jun. 2011.
Lu, et al., "A Simplified Superior Floating-Body/Gate DRAM Cell", IEEE Elec. Dev. Letters, vol. 30, No. 3, Mar. 2009, pp. 282-284.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al., "dRAM Design Using the Taper-Isolated Dynamic RAM Cell." Solid-State Circuits, IEEE Journal of 17.2 (1982): 337-344.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Mahatme, et al. "Total ionizing dose effects on ultra thin buried oxide floating body memories." Reliability Physics Symposium (IRPS), 2012 IEEE International, 2012, pp. 1-5.
Moon, et al. "An optically assisted program method for capacitorless 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-26.
Moon, et al. "Fin-width dependence of BJT-based 1T-DRAM implemented on FinFET." Electron Device Letters, vol. 31, No. 9 (2010): 909-911.
Moon, et al. "Ultimately scaled 20nm unified-RAM." Electron Devices Meeting (IEDM), 2010 IEEE International. IEEE, 2010, pp. 12-2.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Pellizzer et al., A 90nm Phase Change Memory Technology for Stand-Alone Non-Volatile Memory Applications, pp. 1-1, 2006.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica et al. Scaled 1T-Bulk devices built with CMOS 90nm technology for low-cost eDRAM applications. Pascale. mazoyer@st. com, 2005, 38-39.
Reisch, "On bistable behavior and open-base breakdown of bipolar

(56) References Cited

OTHER PUBLICATIONS transistors in the avalanche regime-modeling and applications." Electron Devices, IEEE Transactions on 39.6 (1992): 1398-1409.

* cited by examiner

MEMORY DEVICE COMPRISING AN ELECTRICALLY FLOATING BODY TRANSISTOR AND METHODS OF USING

CROSS-REFERENCE

This application is a continuation of co-pending application Ser. No. 17/963,024, filed Oct. 10, 2022, which is a continuation of application Ser. No. 17/092,659, filed Nov. 9, 2020, now U.S. Pat. No. 11,489,073, which is a continuation of application Ser. No. 16/682,259, filed Nov. 13, 2019, now U.S. Pat. No. 10,854,745, which is a continuation of application Ser. No. 16/105,579, filed Aug. 20, 2018, now U.S. Pat. No. 10,529,853, which is a continuation of application Ser. No. 15/798,342, filed Oct. 30, 2017, now U.S. Pat. No. 10,079,301, which applications and patents are hereby incorporated herein, in their entireties, by reference thereto, and to which applications we claim priority. application Ser. No. 15/798,342 claims the benefit of U.S. Provisional Application No. 62/415,511, filed Nov. 1, 2016, which application is hereby incorporated herein, in its entirety, by reference thereto.

Application Ser. No. 15/798,342 claims the benefit of U.S. Provisional Application No. 62/451,439, filed Jan. 27, 2017, which application is hereby incorporated herein, in its entirety, by reference thereto.

Application Ser. No. 15/798,342 claims the benefit of U.S. Provisional Application No. 62/461,160, filed Feb. 20, 2017, which application is hereby incorporated herein, in its entirety, by reference thereto.

Application Ser. No. 15/798,342 claims the benefit of U.S. Provisional Application No. 62/552,048, filed Aug. 30, 2017, which application is hereby incorporated herein, in its entirety, by reference thereto.

FIELD OF THE INVENTION

The present invention relates to semiconductor memory technology. More specifically, the present invention relates to a semiconductor memory device comprising an electrically floating body transistor and an access transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), all of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), all of which are hereby incorporated herein, in their entireties, by reference thereto).

Widjaja and Or-Bach describe a bi-stable SRAM cell incorporating a floating body transistor, where more than one stable state exists for each memory cell (for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Pat. No. 9,230,651, "Memory Device Having Electrically Floating Body Transistor" ("Widjaja-3"), all of which are hereby incorporated herein, in their entireties, by reference thereto). This bi-stability is achieved due to the applied back bias which causes impact ionization and generates holes to compensate for the charge leakage current and recombination.

In a memory array comprising rows and columns of memory cells, performing an operation on a memory cell of the array may trigger a change in its surrounding memory cells, a condition often referred to as disturb. There is a continuing need for improving disturb resistance in memory cells. Two-transistor memory cells, for example as described in "Capacitorless Twin-Transistor Random Access Memory (TTRAM) on SOI", F. Morishita et al, Custom Integrated Circuits Conference, 2005, pp. 435-438, "A configurable enhanced TTRAM macro for system-level power management unified memory", F. Morishita et al., Solid-State Circuits, IEEE Journal of, vol. 42 no. 4 (2007), pp. 853-861, "A high-density scalable twin transistor RAM (TTRAM) with verify control for SOI platform memory IPs", K. Arimoto et al., Solid-State Circuits, IEEE Journal of, vol. 42, no. 11 (2007), pp. 2611-2619, and "A Scalable ET2RAM (SE-TRAM) with Verify Control for SoC Platform Memory IP on SOI", K. Arimoto et al. pp. 429-432, Custom Integrated Circuits Conference, 2006, U.S. patent application Ser. No. 14/380,779, "Memory Cell Comprising First and Second Transistors and Methods of Operating" ("Widjaja-4"), all of which are hereby incorporated herein, in their entireties, by reference thereto, may improve the disturb resistance of the memory cells.

SUMMARY OF THE INVENTION

A semiconductor memory cell comprising an electrically floating body transistor and an access transistor is disclosed. A method of operating the memory cell is disclosed.

According to one aspect of the present invention, a semiconductor memory cell is provided that includes: a memory transistor comprising a bi-stable floating body transistor having a first floating body region and a back-bias region configured to generate impact ionization when the memory cell is in one of first and second states, and wherein the back-bias region is configured so as not to generate impact ionization when the memory cell is in the other of the first and second states; and an access device; wherein the access device comprises a second floating body region; and wherein the bi-stable floating body transistor and the access device are electrically connected in series.

In at least one embodiment, a capacitance of the first floating body region is different from a capacitance of the second floating body region.

In at least one embodiment, the memory transistor further comprises a first gate region, and the access device further comprises a second gate region.

In at least one embodiment, a length of the first gate region is less than a length of the second gate region.

In at least one embodiment, a length of the first gate region is greater than a length of the second gate region.

In at least one embodiment, a volume of the first floating body region is smaller than a volume of the second floating body region.

In at least one embodiment, a capacitance of the first gate region is different from a capacitance of the second gate region.

In at least one embodiment, at least one dummy gate region is provided between the memory transistor and the access device.

In at least one embodiment, the memory transistor comprises a first gate region; wherein a work function of the dummy gate region is higher than a work function of the first gate region.

In at least one embodiment, the semiconductor memory cell is a multi-port memory cell.

In at least one embodiment, the semiconductor memory cell comprises a fin structure.

According to another aspect of the present invention, a semiconductor memory cell includes: a first transistor having a first floating body; a second transistor having a second floating body; a buried layer underlying both of the first and second floating bodies; a first source line region contacting the first floating body; a first drain region separated from the first source line region and contacting the first floating body; a first gate insulated from the first floating body; an insulating member insulating the first floating body from the second floating body; a second source line region contacting the second floating body; a second drain region separated from the second source line region and contacting the second floating body; and a second gate insulated from the second floating body; wherein the first drain region is electrically connected to the second source line region; and wherein a capacitance of the first floating body is different from a capacitance of the second floating body.

In at least one embodiment, a volume of the first floating body is less than a volume of the second floating body.

In at least one embodiment, a length of the first gate is less than a length of the second gate.

In at least one embodiment, a length of the first gate is greater than a length of the second gate.

In at least one embodiment, the semiconductor memory cell further includes at least one dummy gate region between the first transistor and the second transistor.

In at least one embodiment, a work function of the dummy gate region is greater than a work function of the first gate.

In at least one embodiment, the first transistor and the second transistor have the same conductivity type.

In at least one embodiment, the semiconductor memory cell is a multi-port memory cell.

In at least one embodiment, the semiconductor memory cell includes a fin structure.

These and other advantages and features of the invention will become apparent to those persons skilled in the art upon reading the details of the memory cells, arrays and methods as more fully described below.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION OF THE INVENTION

Before the present memory cells, memory arrays and processes are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the bit line" includes reference to one or more bit lines and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1:
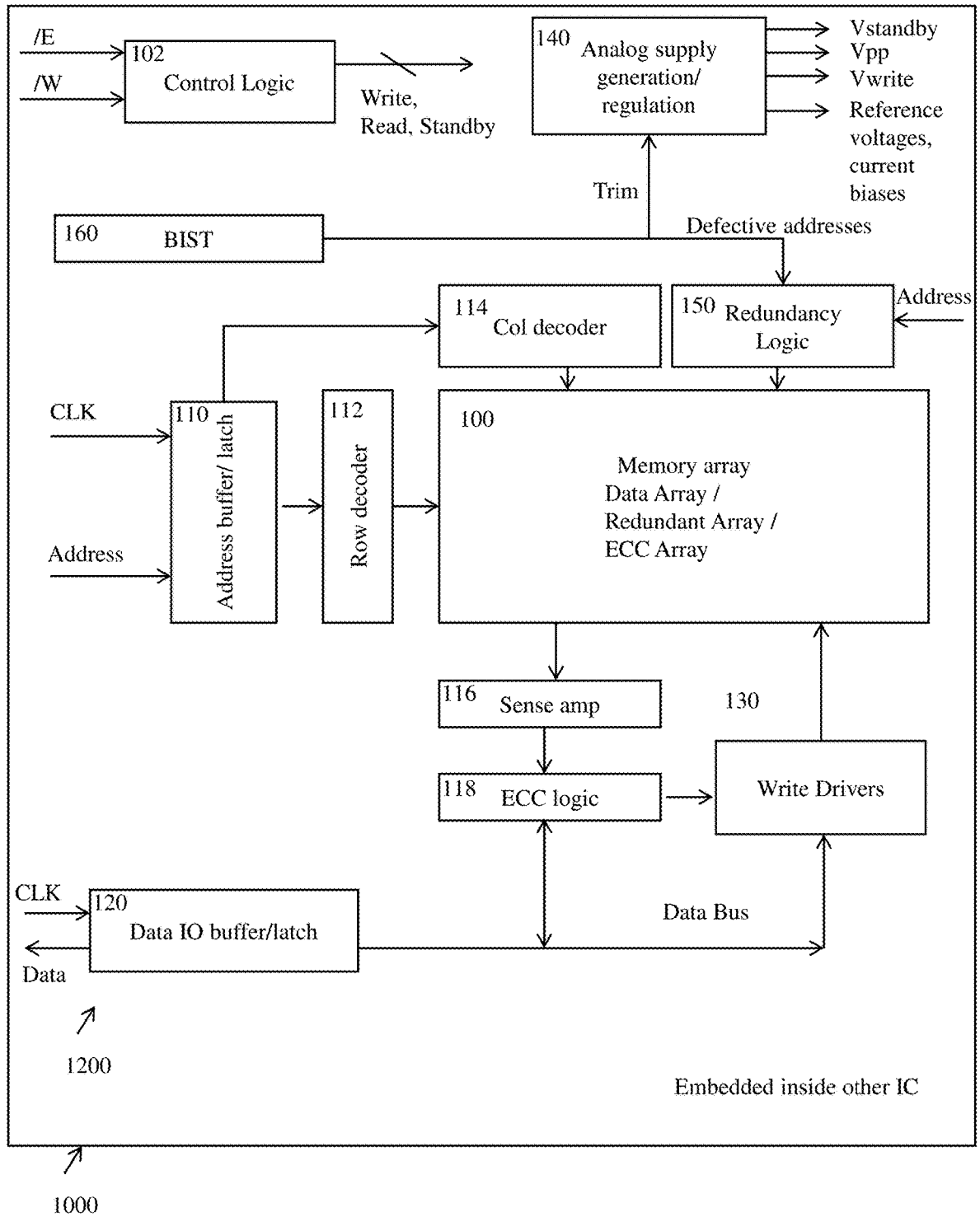
FIG. 1 is a block diagram for a memory instance.

FIG. 1 illustrates a memory instance 1200, comprising memory array 100 and periphery circuitries associated with the memory array 100. Examples of the periphery circuitries are shown in FIG. 1: control logic 102 which receives for example enable (/E) and write (/W) signals and controls the operation of the memory array 100; address buffer 110, which transmits the address received to row decoder 112 and column decoder 114; reading circuitry such as sense amplifier 116 and error correction circuit (ECC) 118; data buffer 120, which outputs the read data or transmits the write data into write drivers 130; analog supply generators and/or regulator 140 which provides additional voltage levels needed for the memory array operation; redundancy logic 150 which may be used to increase the yield of the memory instance; built-in-self-test (BIST) 160 which may be used to set the trim levels for the supply generator 140 and/or replace the defective units with redundant array. The BIST may also sense the chip temperature and trim the voltage levels of the supply generator according to the temperature. The memory instance may be a discrete memory component or it may be embedded inside another integrated circuit device 1000.

Figure 2:
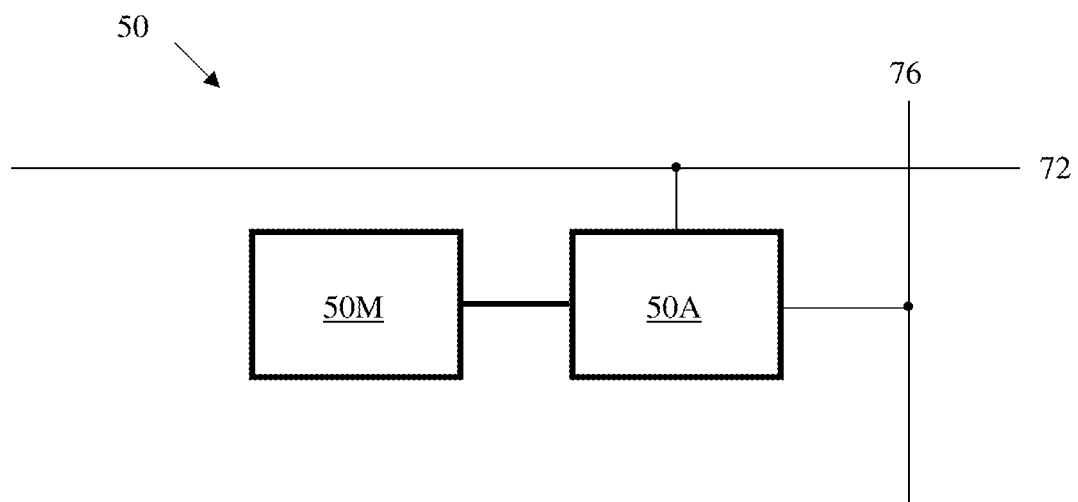
FIG. 2 schematically illustrates a memory cell which comprises memory device and an access device that are connected in series.

Memory array 100 may comprise a plurality of memory cells 50, each of which comprises memory device 50M and access device 50A that are connected in series, as illustrated in FIG. 2. Memory cell 50 is a generic representation of a memory cell comprising a memory device and access device. Memory device 50M functions to store the state of the memory cell 50, and is accessed through the access device 50A. The access device 50A is connected to terminals, for example the word line terminal 72 and the bit line terminal 76 as shown in FIG. 2, which are used to select a memory cell 50 in a memory array 100 comprising a plurality of rows and columns of memory cells 50. In a series connection, such as in memory device 50M and access device 50A, the same current flows through each of the devices 50M and 50A. Therefore, the access device 50A can be used to turn-off or deselect an unselected memory cell 50 during read or write operations. A memory cell 50 comprising a floating body transistor as memory device 50M has been described for example in U.S. Patent Application Publication No. 2015/0023105, "Memory Cell Comprising First and Second Transistors and Method of Operating", which is hereby incorporated herein, in its entirety, by reference thereto.

Figure 3A:
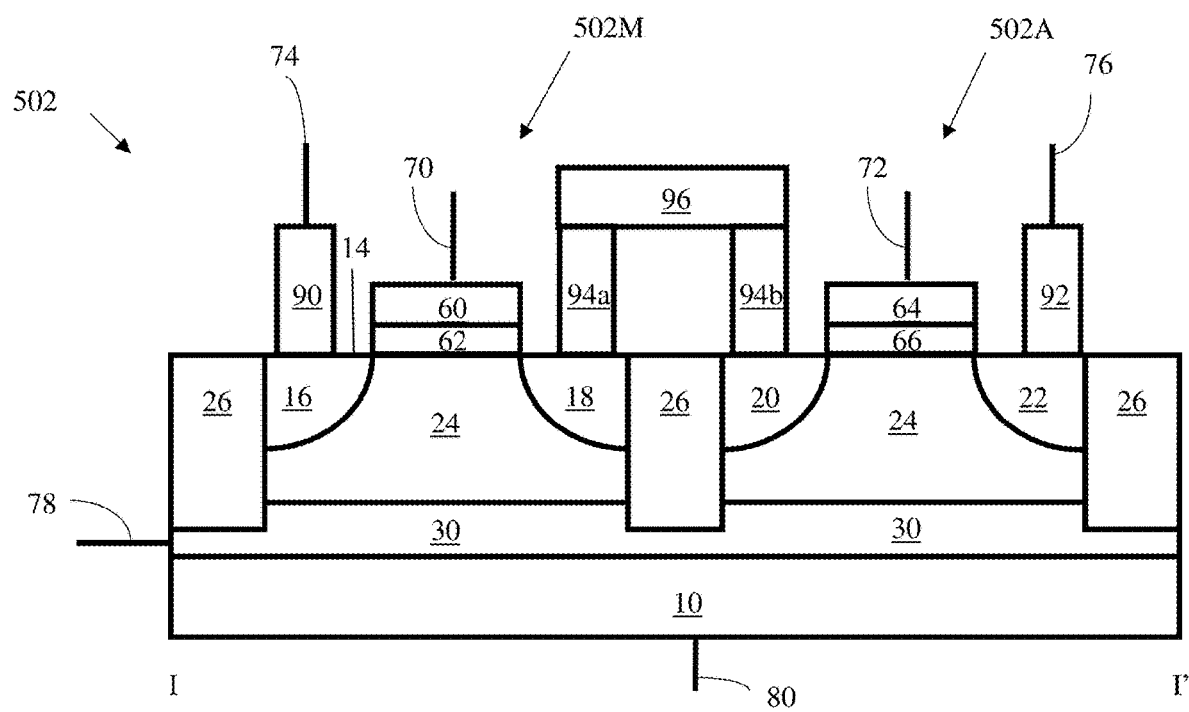
FIGS. 3A and 3B are schematic, cross-sectional illustrations of a memory cell according to an embodiment of the present invention.

Referring to FIG. 3A, a memory cell 502 according an embodiment of the present invention is shown. Memory device 502 comprises two transistors: transistor 502M having an electrically floating body 24 and access transistor 502A. Memory cell 502 includes a substrate 10 of a first conductivity type such as p-type, for example. Substrate 10 is typically made of silicon, but may also comprise, for example, germanium, silicon germanium, gallium arsenide, carbon nanotubes, or other semiconductor materials. In some embodiments of the invention, substrate 10 can be the bulk material of the semiconductor wafer. In other embodiments, substrate 10 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate will usually be drawn as the semiconductor bulk material as it is in FIG. 3A.

Memory cell 502 also comprises a buried layer region 30 of a second conductivity type, such as n-type, for example; a floating body region 24 of the first conductivity type, such as p-type, for example; and source/drain regions 16 and 18 of the second conductivity type, such as n-type, for example. Buried layer 30 may be formed by an ion implantation process on the material of substrate 10. Alternatively, buried layer 30 can be grown epitaxially on top of substrate 10.

The floating body region 24 of the memory transistor 502M having a first conductivity type is bounded on top by surface 14, source line region 16, drain region 18, and insulating layer 62, on the sides by insulating layer 26, and on the bottom by buried layer 30, while the floating body region 24 of the access transistor 502A is bounded on top by surface 14, source region 20, bit line region 22, and insulating layer 66, on the sides by insulating layer 26, and on the bottom by buried layer 30. Floating body 24 may be the portion of the original substrate 10 above buried layer 30 if buried layer 30 is implanted. Alternatively, floating body 24 may be epitaxially grown. Depending on how buried layer 30 and floating body 24 are formed, floating body 24 may have the same doping as substrate 10 in some embodiments or a different doping, if desired in other embodiments.

A gate 60 of the memory transistor 502M is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

A gate 64 of the access transistor 502A is positioned in between the source region 20 and the bit line region 22. The gate 64 is insulated from the floating body region 24 by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides.

Figure 20A:
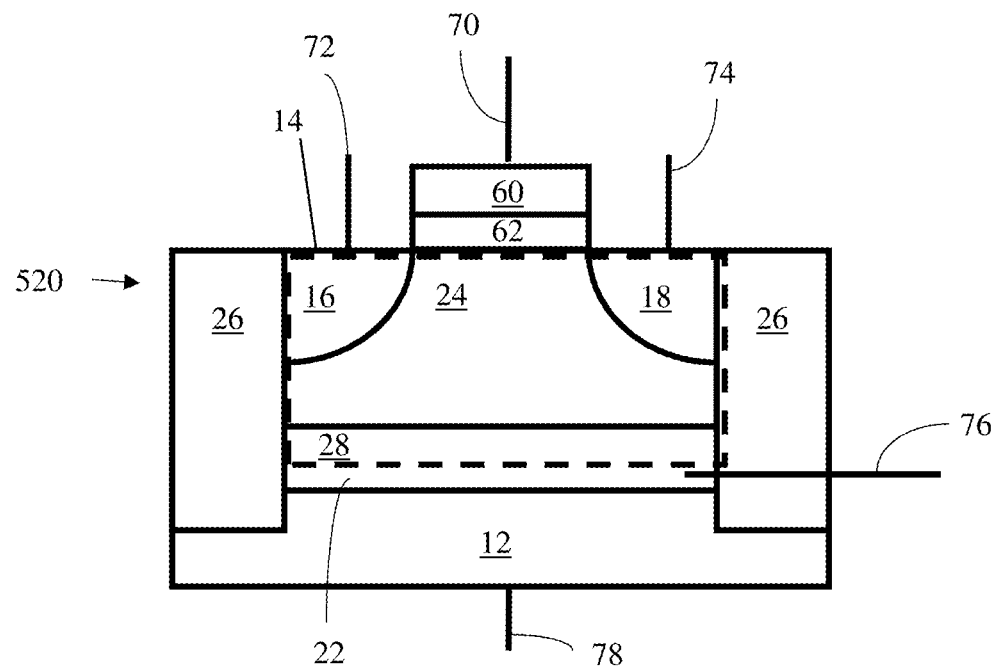
FIG. 20A is a schematic, cross-sectional illustration of a memory cell according to another embodiment of the present invention.

Insulating layers 26 (like, for example, shallow trench isolation (STI)), may be made of silicon oxide, for example, though other insulating materials may be used. Insulating layers 26 insulate floating body transistor 40 from adjacent floating body transistor 40 and adjacent access transistor 42. The bottom of insulating layer 26 may reside inside the buried region 30 allowing buried region 30 to be continuous as shown in FIG. 3A. Alternatively, the bottom of insulating layer 26 may reside below the buried region 30. This requires a shallower insulating layer 28, which insulates the floating body region 24, but allows the buried layer 30 to be continuous in the perpendicular direction of the cross-sectional view shown in FIG. 3A (for example, see the insulating layer 26 and the shallower insulating layer 28 in FIG. 20A, which allows for buried layer 22 (FIG. 20A) to be continuous in the perpendicular direction of the cross-sectional view shown in FIGS. 3A and 20A, but discontinuous to adjacent memory cells in the "same plane" as the cross-sectional view shown in FIGS. 3A and 20A). For simplicity, only memory cell 502 with continuous buried region 30 in all directions will be shown from hereon.

The drain region 18 of the memory transistor 502M is connected to the source region 20 of the access transistor 502A through a conductive element 96, 94a, 94b. Conductive element 90 connects the source line region 16 of the memory transistor 502M (which may be referred to as the source line region 16 of the memory device 502 interchangeably) to the source line (SL) terminal 74, while conductive element 92 connects the bit line region 22 of the access transistor 502A (which may be referred to as the bit line region 22 of the memory device 502 interchangeably) to the bit line (BL) terminal 76. The conductive elements 90, 92, 96, 94a, 94b may be formed of, but not limited to, cobalt, tungsten or silicided silicon.

In addition to the SL terminal 74 and BL terminal 76, memory cell 502 also includes word line 1 (WL1) terminal 70, which is electrically connected to the gate of the memory transistor 502M, word line 2 (WL2) terminal 72, which is electrically connected to the gate 64 of the access transistor 502A, buried well (BW) terminal 78, which is electrically connected to the buried well region 30 of the floating body transistor 502M, and substrate (SUB) terminal 80, which is connected to the substrate region 10.

The memory cell 502 comprises memory transistor 502M and access transistor 502A having the same conductivity type. For example, both memory transistor 502M and access transistor 502A may be n-channel transistors. The access transistor 502A may have different gate and gate insulating layer stacks from the memory transistor 502M such that the capacitive coupling from the gate region 64 to the floating body region 24 of the access transistor 502A is lower than that of the memory transistor 502M. For example, the gate 64 of the access transistor may be made of different materials from the gate 60 of the memory transistor. Similarly the gate insulating layer 66 of the access transistor may be made of different materials or may have different thickness from the gate insulating layer 62.

Figure 3B:
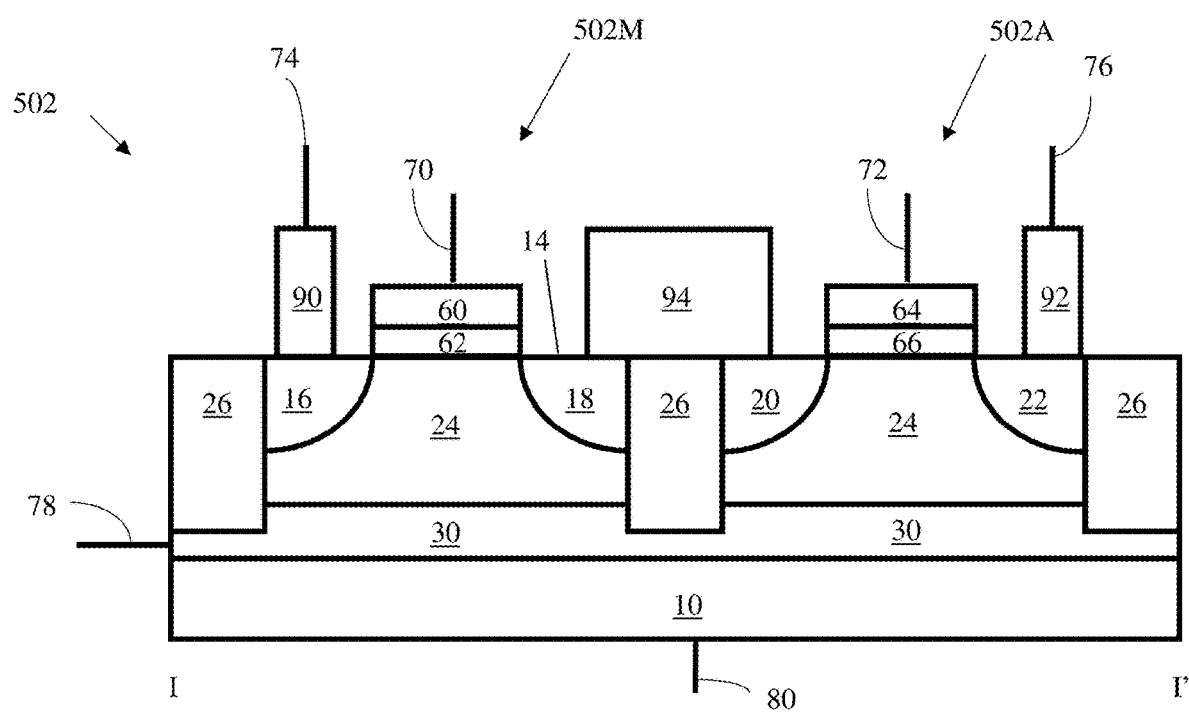

In an alternative embodiment shown in FIG. 3B, the drain region 18 of the memory device 502M and the source region 20 of the access device 502A may be connected through a conductive element 94.

Several operations can be performed to memory cell 502, such as: holding, read, write logic-1 and write logic-0 operations and have been described, for example, in Widjaja-4.

Figure 4:
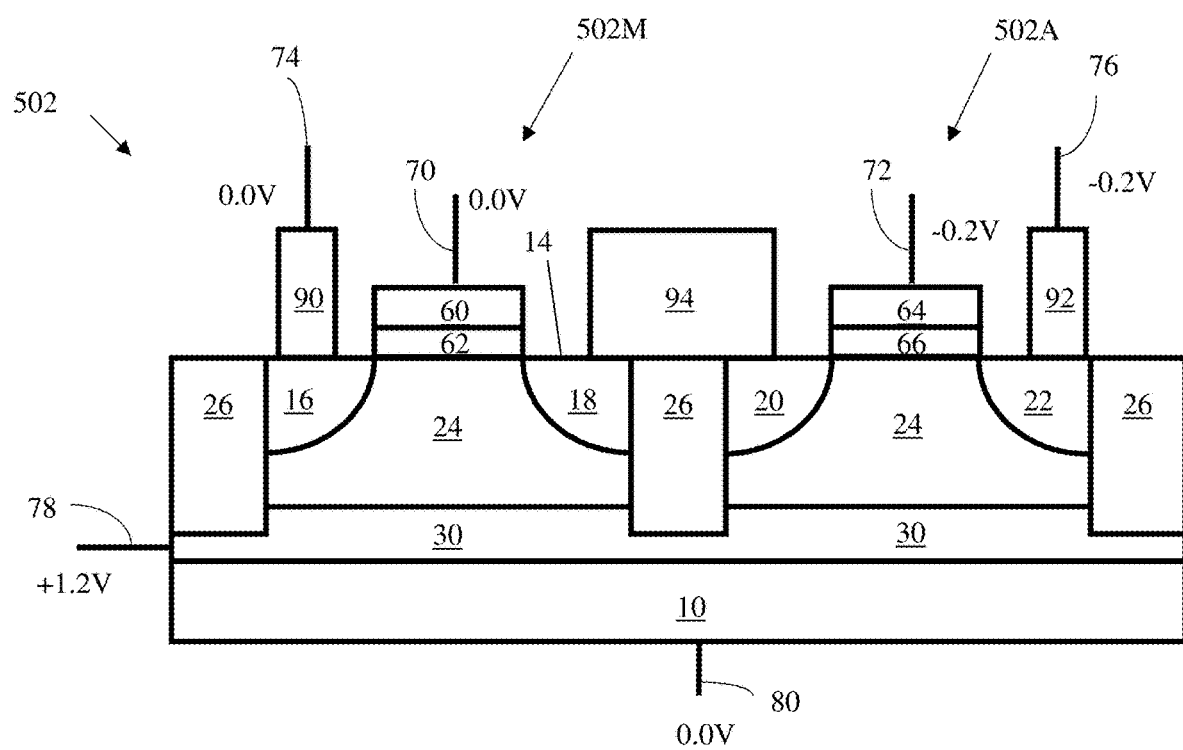
FIG. 4 schematically illustrates bias conditions applied to the memory cell of FIGS. 3A-3B during a holding operation.

During the operation of memory cell 502, to prevent a positive charge accumulation in the floating body region 24 of access transistor 502A, a negative voltage may be applied to the bit line region 22. A negative voltage may also be applied to the gate region 64 of the access transistor 502A, to prevent the negative voltage applied to the bit line region 22 to propagate to the memory transistor 502M. The level of the negative voltage applied to the bit line region 22 may be decided to conditionally remove the positive charges only when the floating body is positively charged but not cause to flow a forward biased junction current when the floating body is neutrally charged. Such voltage may range from −0.05V to −0.6V. FIG. 4 illustrates exemplary bias conditions for the holding operation of the memory cell 502: about 0.0 volts is applied to WL1 terminal 70, about −0.2 volts is applied to WL2 terminal 72, about 0.0 volts is applied to SL terminal 74, about −0.2 volts is applied to BL terminal 76, about 0.0 volts is applied to SUB terminal 78, and a positive voltage like, for example, +1.2 volts is applied to BW terminal 78. In other embodiments, different voltages may be applied to the various terminals of memory cell 502 as a matter of design choice and the exemplary voltages described are not limiting in any way.

Figure 5:
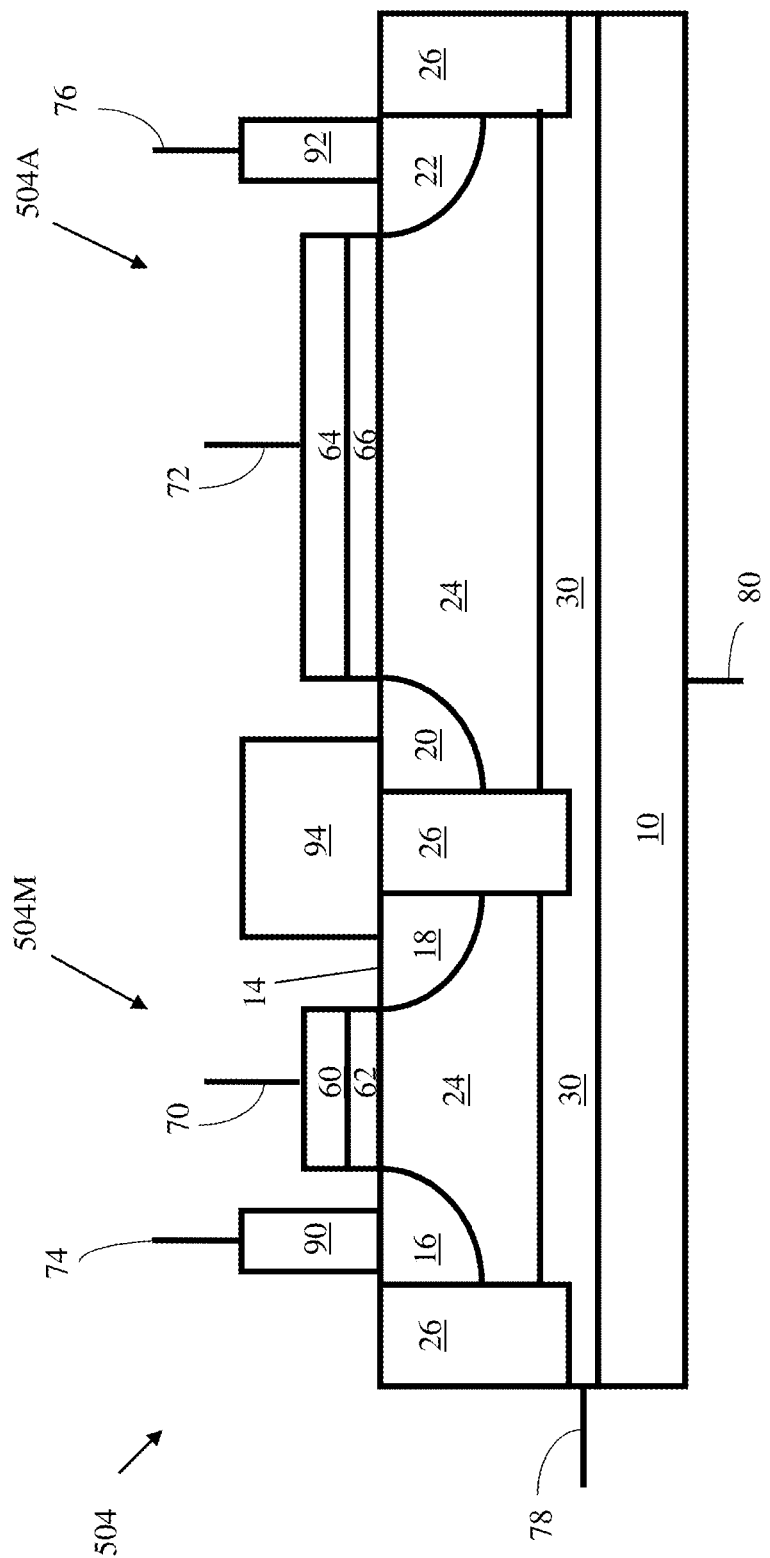
FIG. 5 schematically illustrates a cross-sectional view of a memory cell according to another embodiment of the present invention.

FIG. 5 illustrates memory cell 504 according to another embodiment of the present invention. Memory cell 504 comprises memory transistor 504M and access transistor 504A having different volumes of floating body regions 24 relative to one another. Therefore, the floating body capacitance of the floating body regions 24 will be different. The access transistor 504A of the memory cell 504 is illustrated having a larger floating body region 24 than floating body region 24 of memory cell 504 (and longer gate region 64 than the length of gate region 60). Depending on the capacitive coupling of the gate region 64 to the floating body region 24, capacitive coupling of the bit line region 22 to the floating body region 24, the capacitive coupling of the source region 20 to the floating body region, and the capacitive coupling from the buried well region 30 to the floating body region 24 compared to the corresponding capacitive coupling of the memory transistor 504M, the access transistor 504A may have a smaller floating body region 24 (and shorter gate region 64 than the length of gate region 60).

Figure 6:
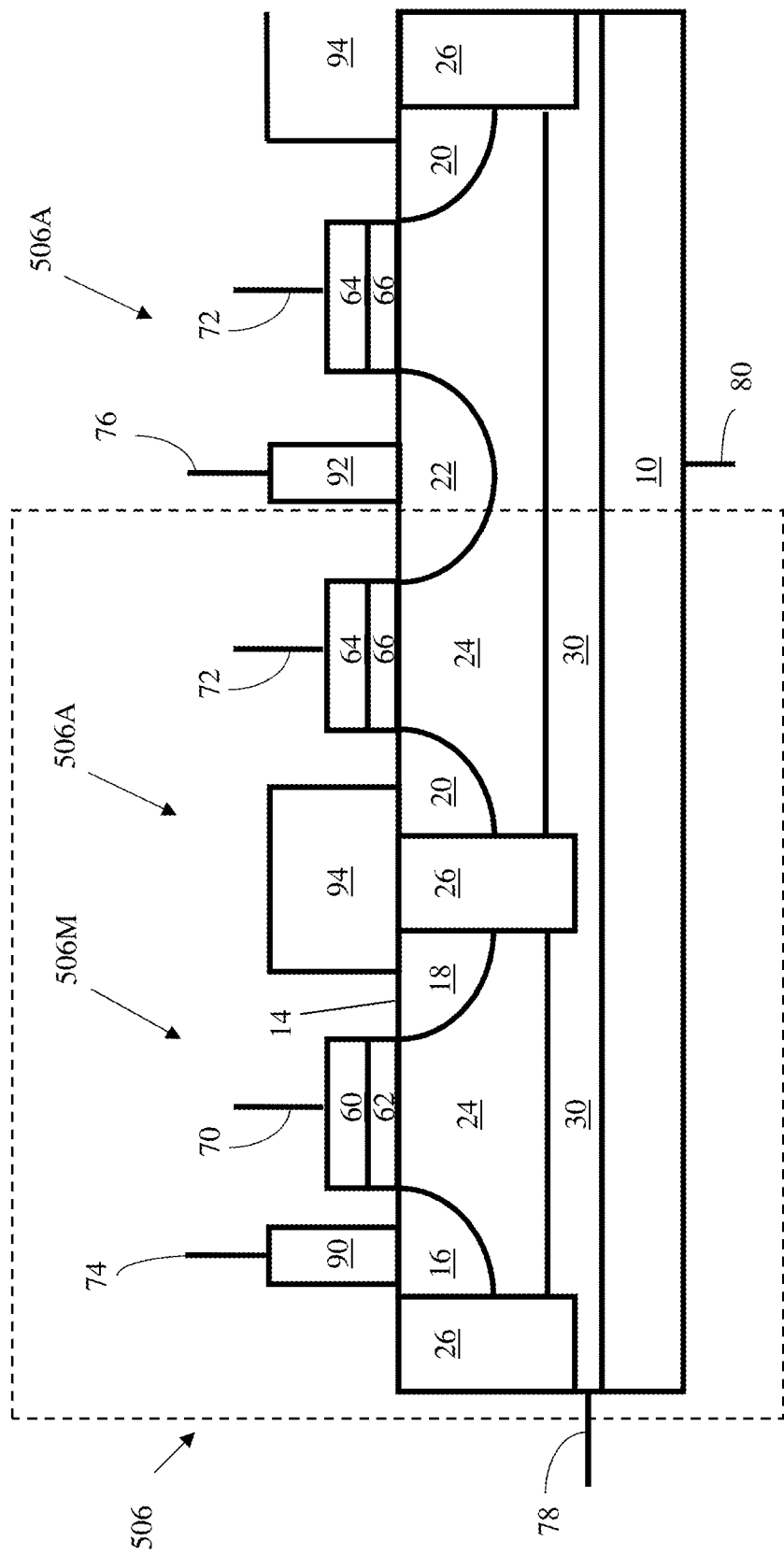
FIG. 6 schematically illustrates a cross-sectional view of a memory cell according to another embodiment of the present invention.
Figure 7:
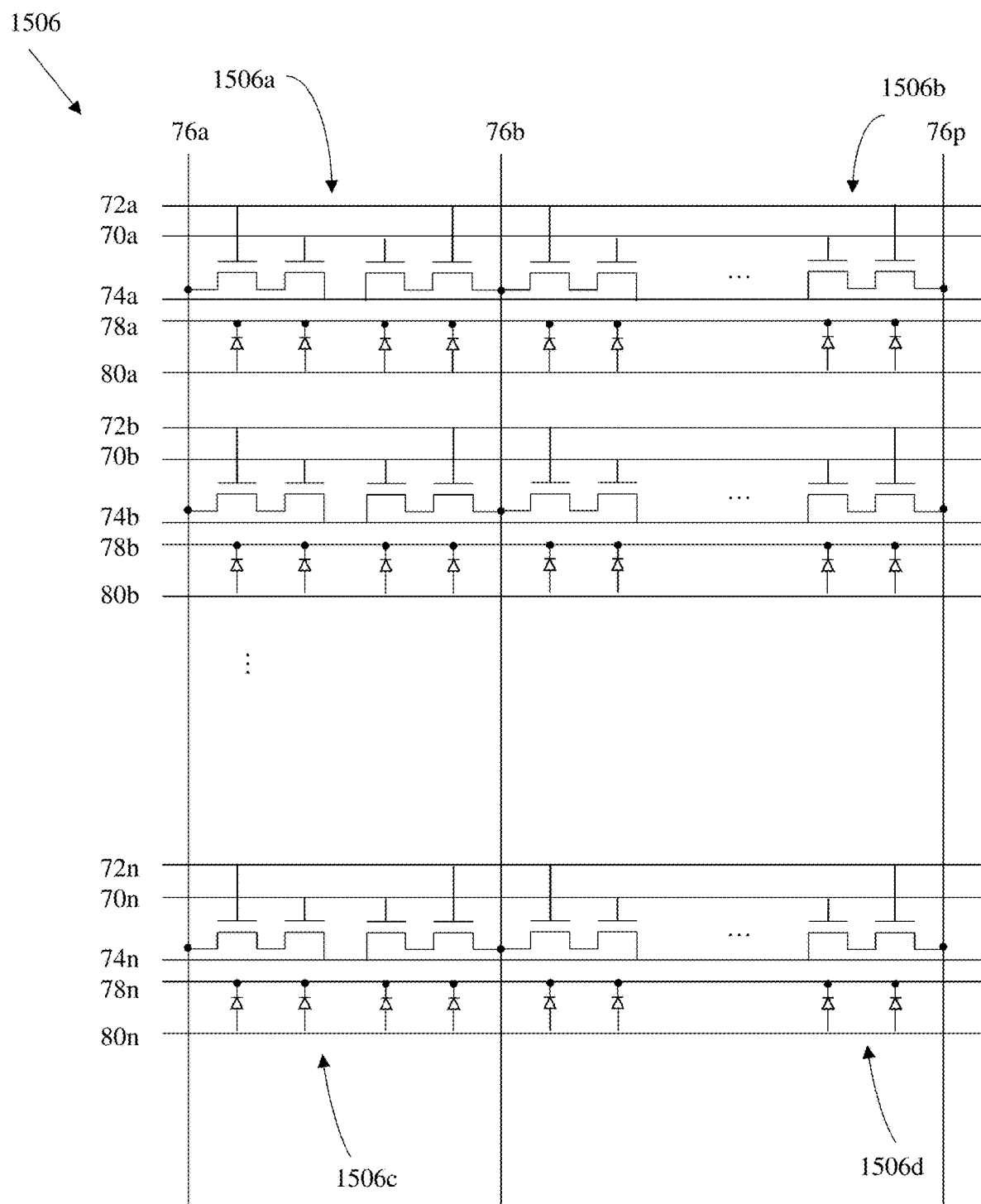
FIG. 7 schematically illustrates a circuit representation of a memory array comprising memory cells illustrated in FIG. 5.

FIG. 6 illustrates memory cell 506 according to another embodiment of the present invention. The bit line region 22 is shared between adjacent access transistors 506A. An exemplary memory array 1506 comprising memory cells 506 is shown in FIG. 7, illustrating bit line region 22 (connected to BL terminals 76 (i.e., 76a, 76b, . . . , 76p) is shared between adjacent memory cells 506. As a result, the floating body region 24 of the access transistor 506A is now larger than the floating body region 24 of the memory transistor 506M while the gate length of the access transistor 506A and the memory transistor 506M is identical.

Figure 8:
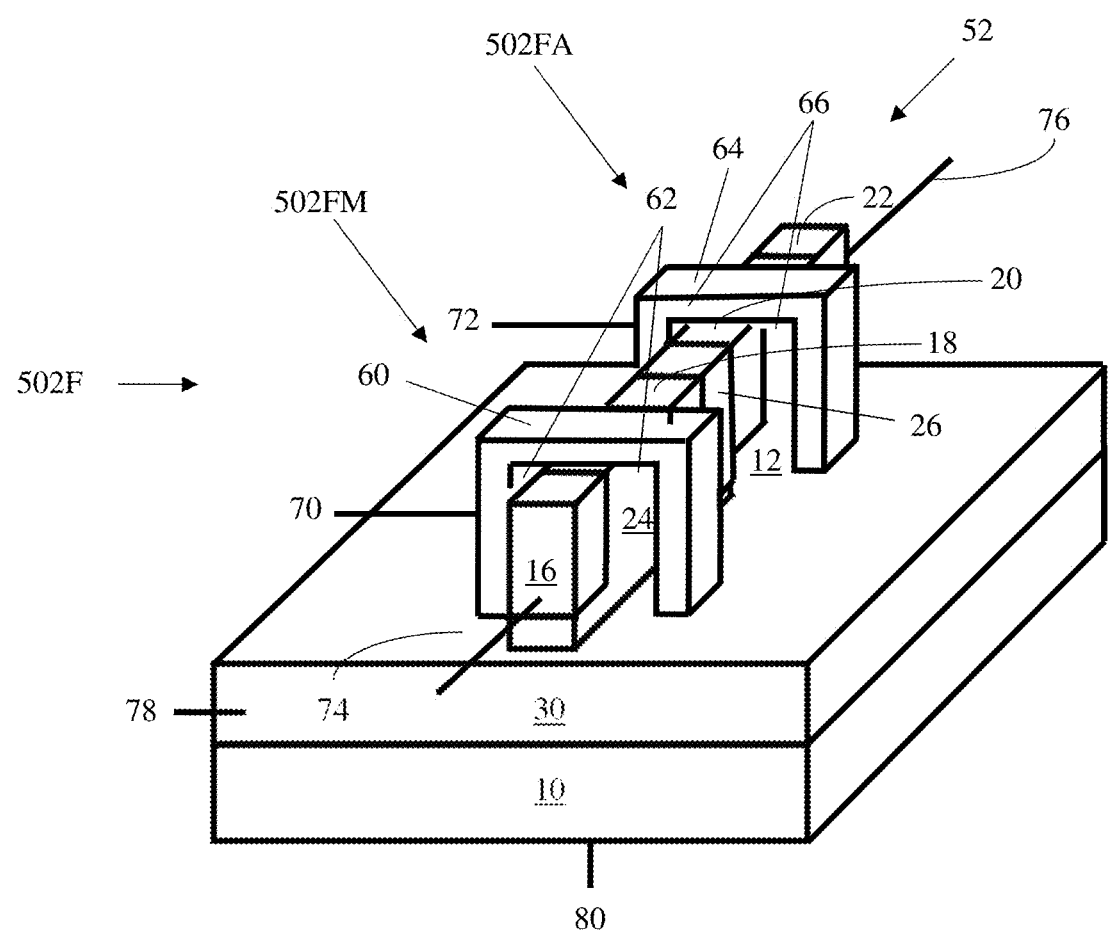
FIG. 8 is a cross-sectional, schematic illustration of a fin-type memory cell device according to an embodiment of the present invention.

Memory cells 502, 504, and 506 may also comprise a fin structure. FIG. 8 schematically illustrates a three-dimensional memory cell 502F comprising a fin structure 52.

Figure 9A:
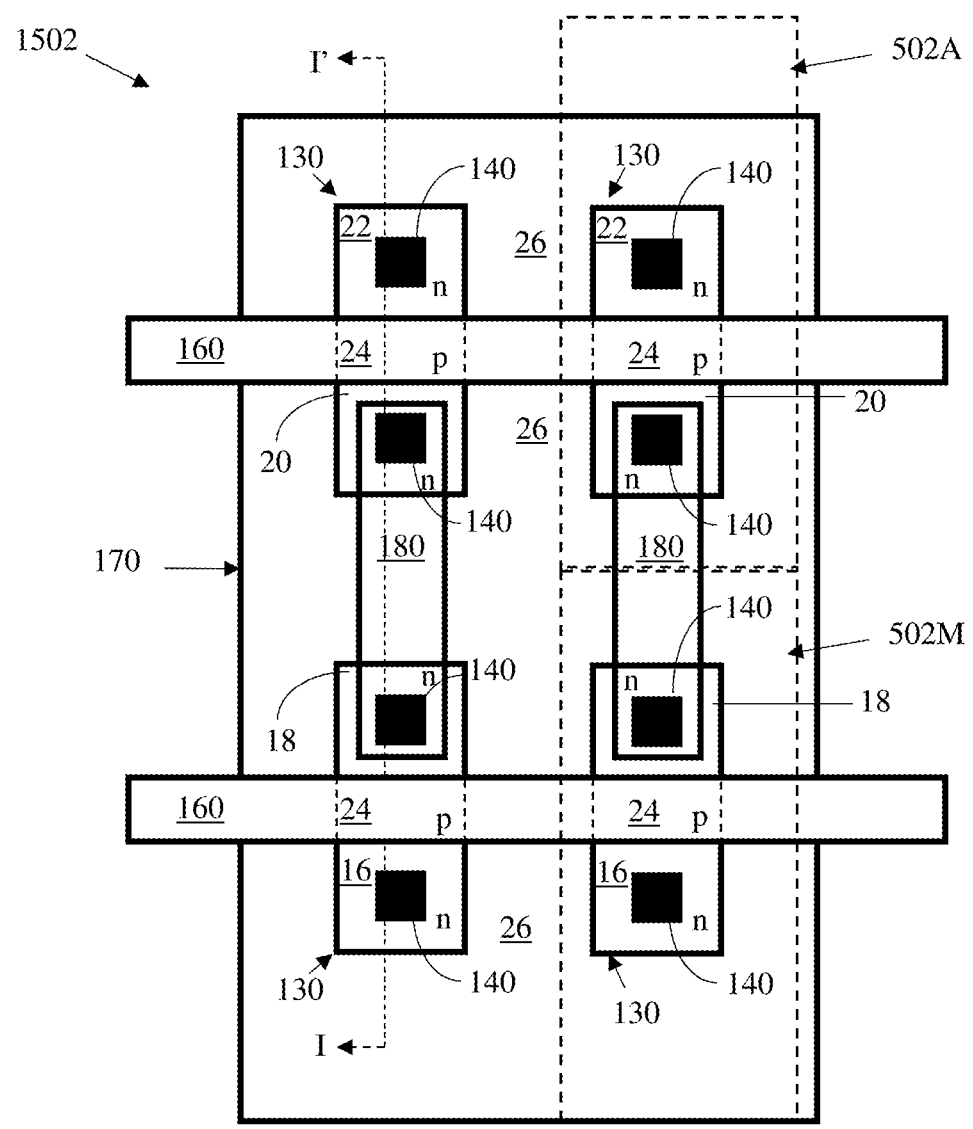
FIGS. 9A, 9B, and 9C are schematic, layout views of a memory array according to an embodiment of the present invention.
Figure 9B:
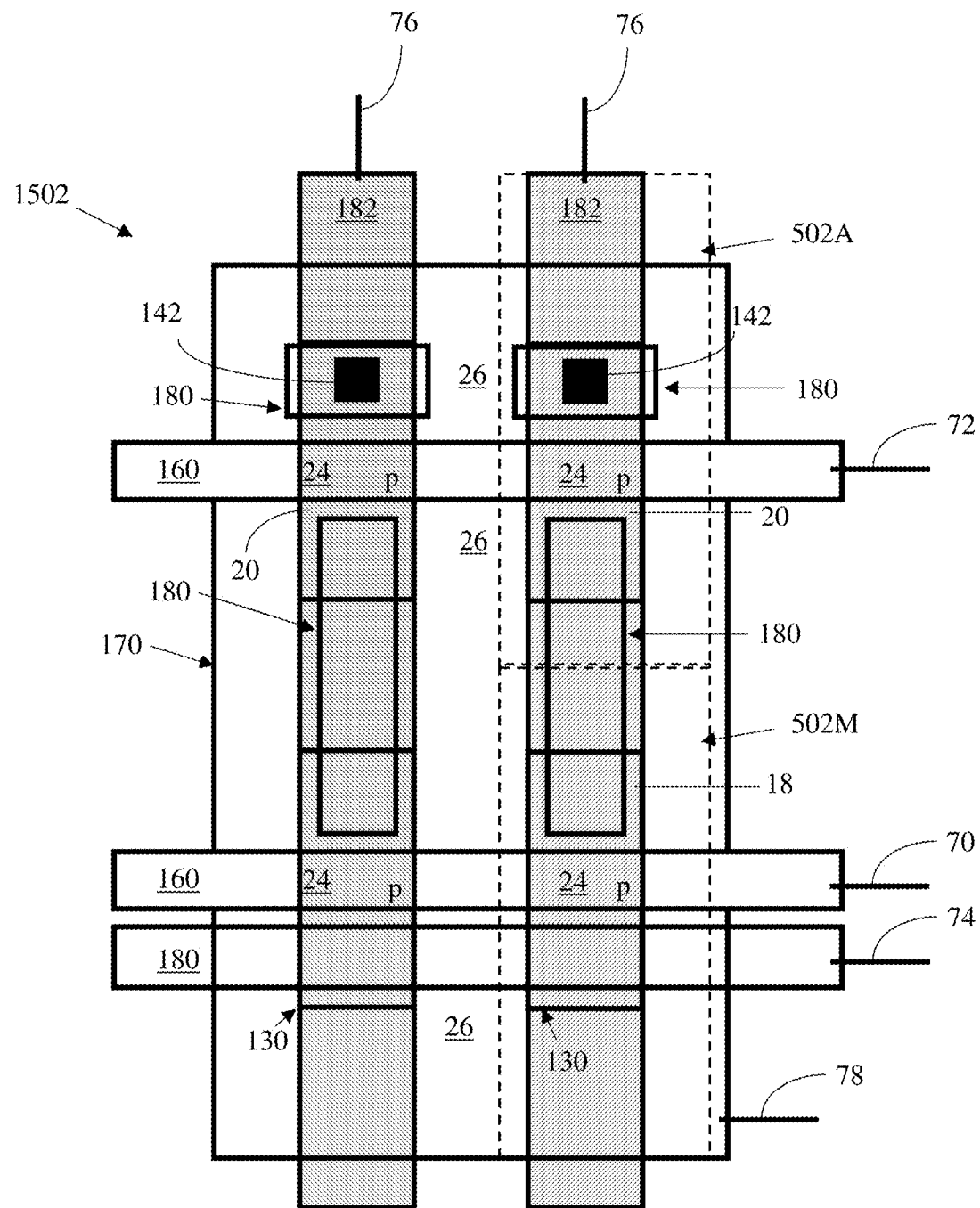

FIGS. 9A and 9B illustrate exemplary layout views of a memory array 1502 comprising a plurality of rows and columns of memory cells 502, where both memory device 502M and access device 502A are of the same conductivity type, for example where both memory device 502M and access device 502A are n-channel transistors. The memory device 502M is formed by the DIFF 130, POLY 160, and BNWL layers 170, while the access device 502A is formed by the DIFF 130 and POLY 160 layers. Also illustrated in FIG. 9A is CONT 140 and MTL1 180, which forms the series connection between memory device 502M and access device 502A.

Referring to the layout view shown in FIG. 9A and the cross-sectional view shown in FIG. 3A, the active regions of the memory device 502M, which comprise floating body region 24, source line region 16, drain region 18, are defined by the DIFF layer 130. The insulating layer 26 is defined by the space between the DIFF layers 130. The gate region 60 is defined by the POLY layer 160, while the buried layer 30 is defined by the BNWL layer 170. The buried layer 30 is designed such that when a back bias is applied to the buried layer 30, impact ionization is generated when the memory device 502M is in logic-1 state, but no impact ionization is generated when the memory device 502M is in logic-0 state, for example as described in U.S. Pat. No. 9,230,651, "Memory Device Having Electrically Floating Body Transistor", which is hereby incorporated herein, in its entirety, by reference thereto.

Referring to the layout view shown in FIG. 9A and the cross-sectional view shown in FIG. 3A, the active regions of the access device 502A, which comprise floating body region 24, source region 20, bit line region 22, are defined by the DIFF layer 130. The insulating layer 26 is defined by the space between the DIFF layers 130. The gate region 64 is defined by the POLY layer 160.

Figure 9C:
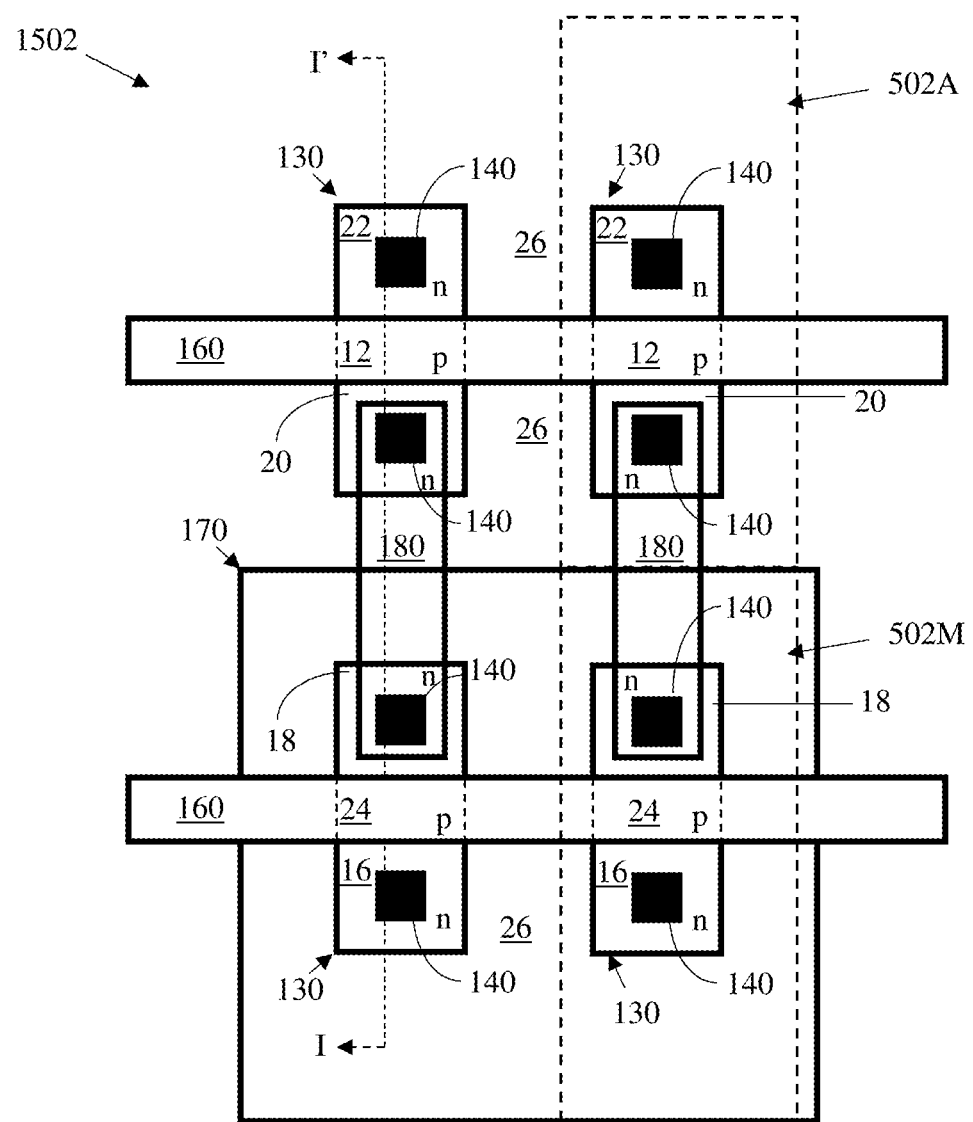

In another embodiment illustrated in the layout view in FIG. 9C, the buried layer 30 (defined by BNWL layer 170) is only formed underneath the memory device 502M. The well region of the access device 502A is connected to the substrate region 12.

Conductive element 90 connects the source line region 16 of the memory device 502M (which may be referred to as the source line region 16 of the memory device 502 interchangeably) to the source line (SL) terminal 74 (through another conductive element similar to conductive element 96 defined by layer MTL1 180, shown separately in FIG. 9B for clarity), while conductive element 92 connects the bit line region 22 of the access device 502A (which may be referred to as the bit line region 22 of the memory device 502 interchangeably) to the bit line (BL) terminal 76 (through another conductive element similar to conductive element 96 defined by MTL1 layer 180, which is then connected to MTL2 layer 182 through a conductive element similar to conductive elements 90, 92, 94a, and 94b defined by VIA1 layer 142, shown separately in FIG. 9B for clarity). The conductive elements 92, 94a, and 94b may be formed of, but not limited to, tungsten or silicided silicon.

Referring to both the layout view shown in FIGS. 9A and 9B and the cross-sectional view shown in FIG. 3A, the conductive elements 90, 92, 94a, and 94b are defined by CONT 140, and the conductive element 96 is defined by MTL1 layer 180.

For a three-dimensional memory cell structure, for example memory cell 502F comprising a fin structure 52 extending substantially perpendicular to, and above the top surface of the substrate 10, the fin 52 as shown in FIG. 8, is defined by DIFF layer 30 in FIGS. 9A-9C.

Figure 10:
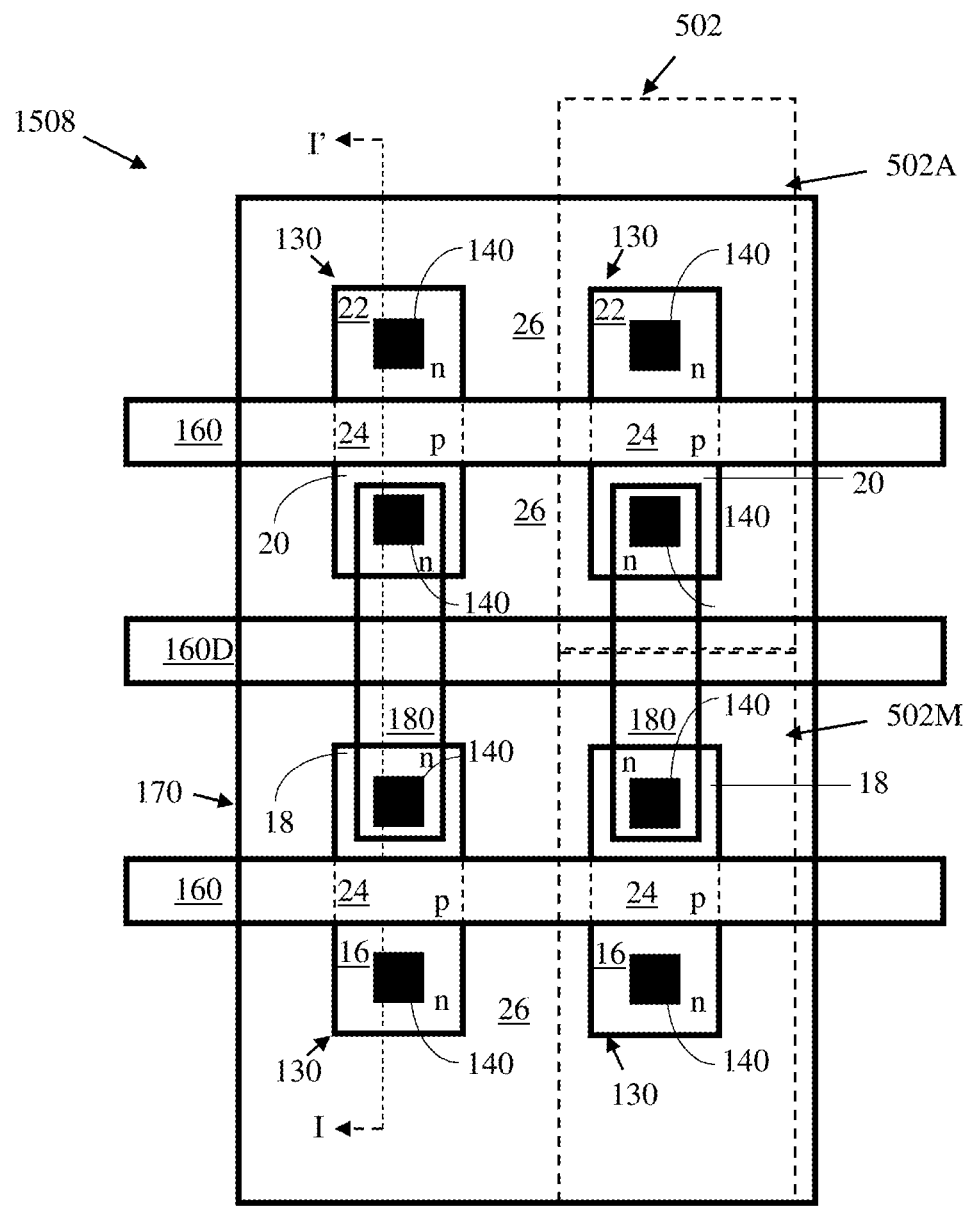
FIG. 10 is a schematic, layout view of a memory array according to another embodiment of the present invention.

FIG. 10 shows a layout view of memory array 1508 according to another embodiment of the present invention. Relative to the memory array 1502 of FIGS. 9A-9B, memory array 1508 includes an additional dummy POLY layer 160D which does not overlay a DIFF region 130 (hence being referred to as dummy layer). The dummy layer 160D for example may be a result of restrictive design rules (which guides the layout drawing of the layers) for better lithography patterning process. As shown in FIG. 10, the unit cell of the memory cell 502 comprises three POLY 160 regions, one 160D to define the dummy region and two 160 to define the transistor regions (overlapping with DIFF layer 130, where one defines the memory device 502M and the other defines the access device 502A). Depending on the process technology node, more than one dummy POLY layer 160D may be used.

Memory cell 502 is used as an illustrative example to describe the layout view in FIG. 10. The use of dummy POLY layer 160D may also be used for memory cells 504, 506, 502F, 504F, and 506F.

Figure 11:
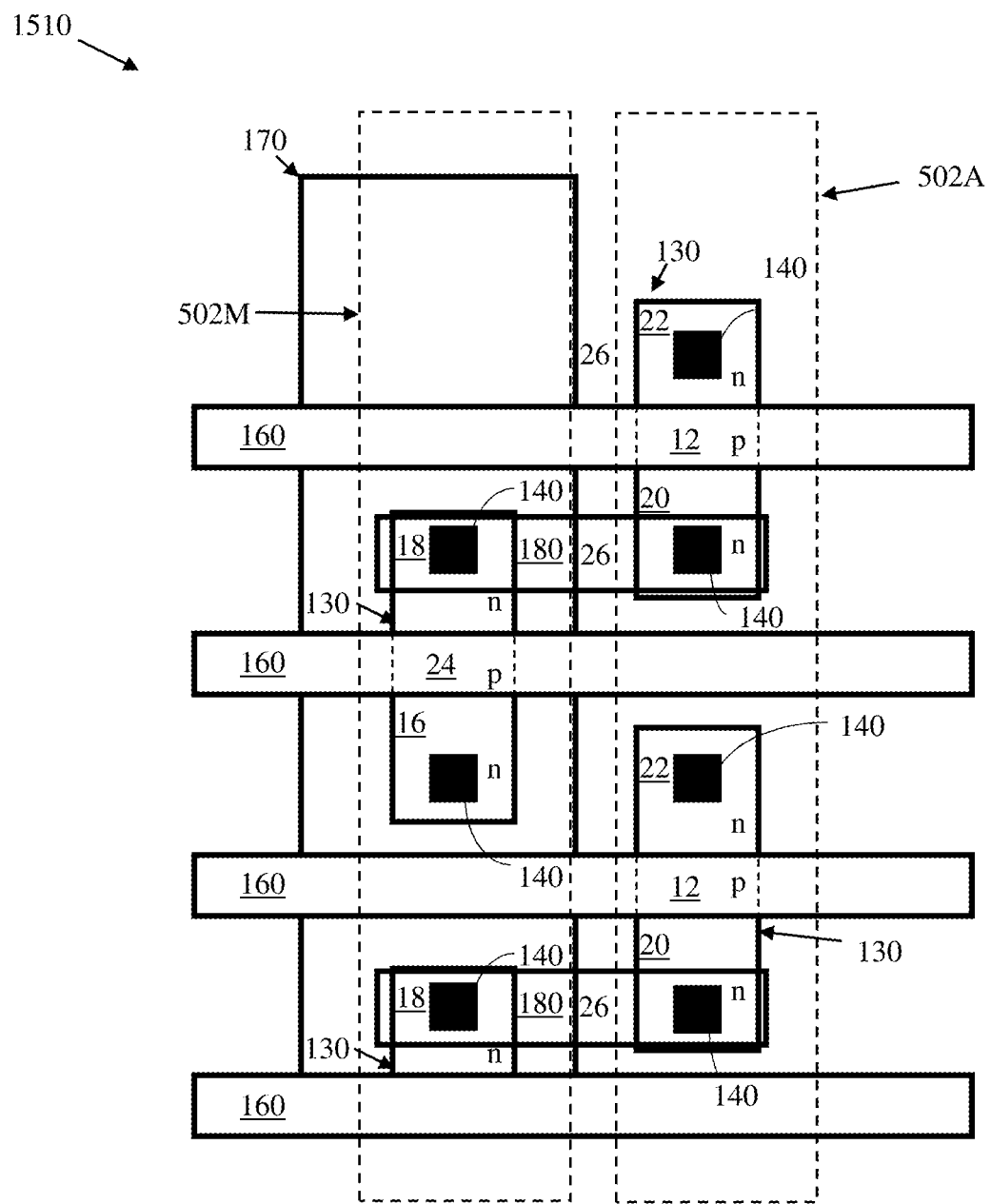
FIG. 11 is a schematic, layout view of a memory array according to another embodiment of the present invention.

FIG. 11 illustrates a schematic layout view of memory array 1510 according to another embodiment of the present invention where the DIFF layers 130 are arranged in a staggered or zig-zag pattern. As a result, memory device 502M and access device 502A in adjacent columns do not share the same POLY layer 160. In the example illustrated in FIG. 11, the memory devices 502M are positioned in the left column, while the access devices 502A are positioned in the right column. In the exemplary array shown in FIG. 11, the buried well region 30 (defined by the BNWL layer 170) is only formed underneath the memory devices 502M. In FIG. 11, the first POLY layer 160 (from the top) defines the gate region 64 of an access device 502A in the right column shown and the second POLY layer 160 (from the top) defines the gate region 60 of a memory device 502M in the left column shown. Subsequently, the third POLY layer 160 defines another gate region 64 of another access device 502A.

Memory cell 502 is used as an illustrative example to describe the layout view in FIG. 11. The arrangement of DIFF layers 130 in a staggered or zig-zag pattern may also be used for memory cells 504, 506, 502F, 504F, and 506F. Furthermore, the buried well region 30 (defined by the BNWL layer 170) may also be formed underneath both memory device 502M and access device 502A.

Figure 12:
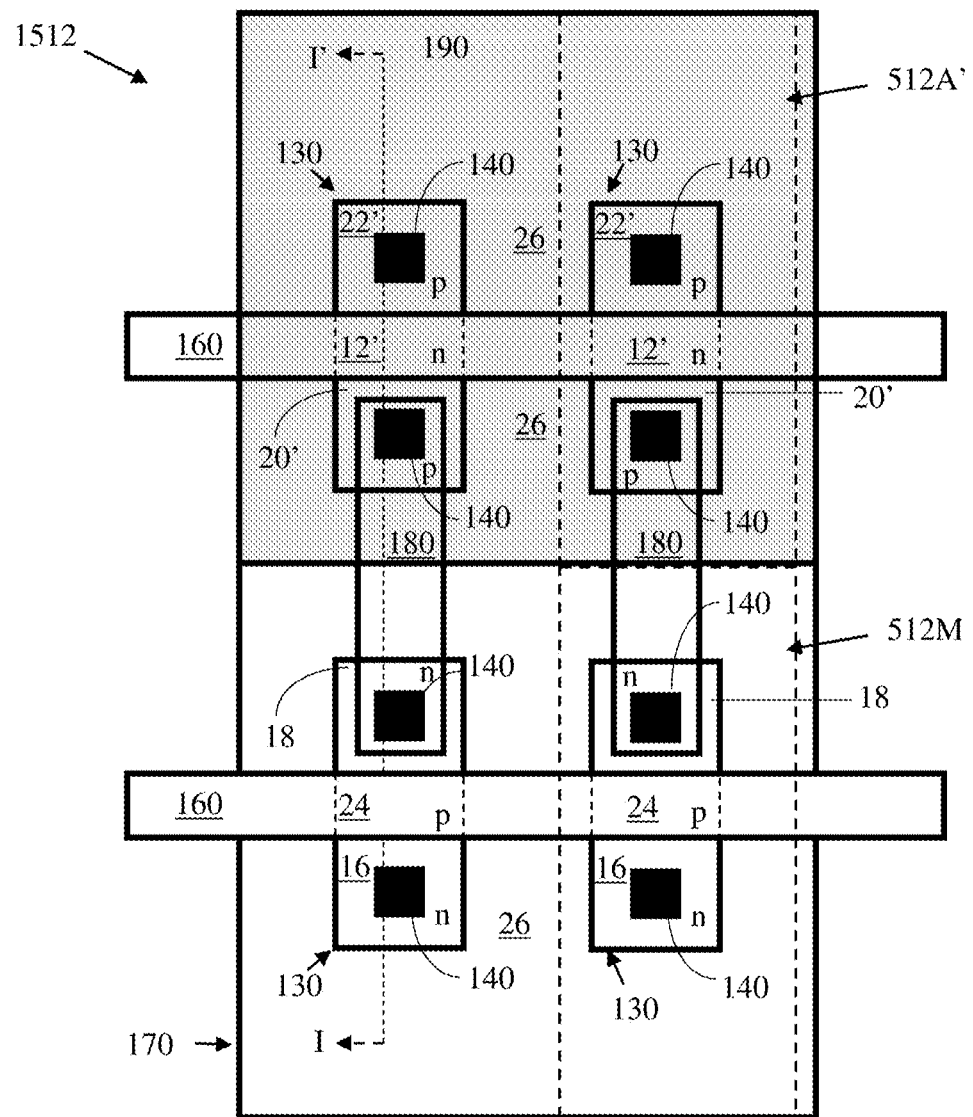
FIG. 12 is a schematic, layout view of a memory array according to another embodiment of the present invention.
Figure 13:
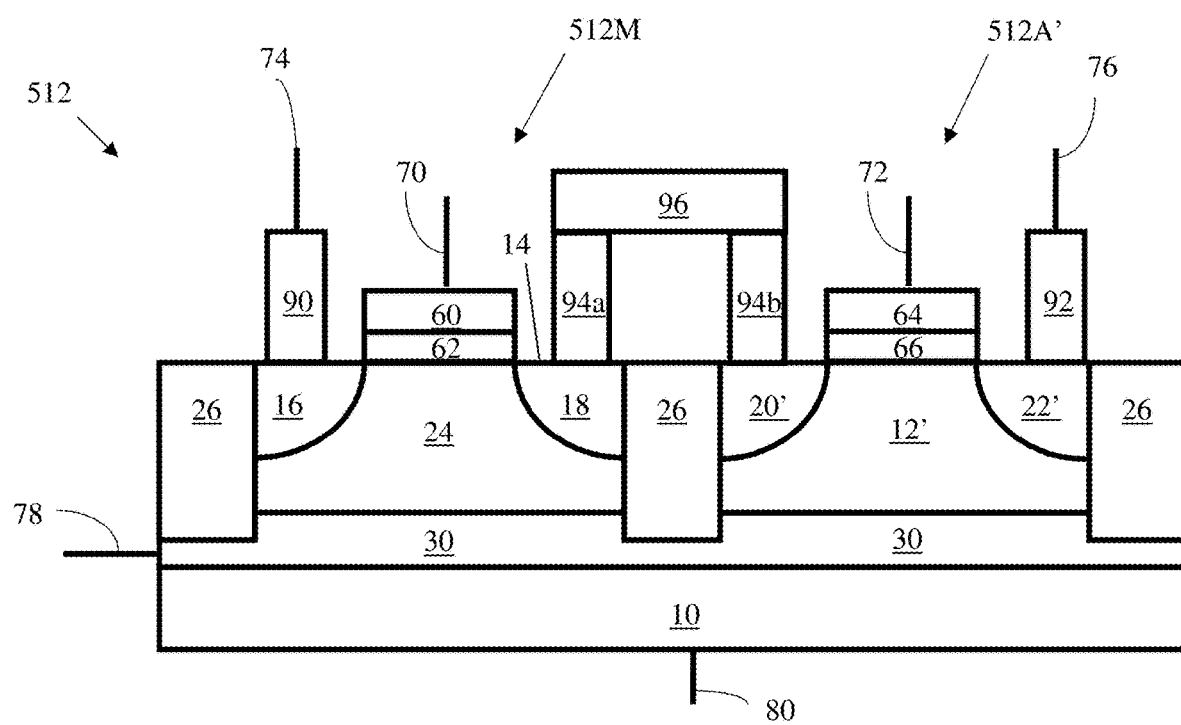
FIG. 13 is a schematic, cross-sectional view of a memory cell according to another embodiment of the present invention.

FIGS. 12 and 13 illustrate schematic layout and cross-sectional views of memory array 1512 comprising a plurality of rows and columns of memory cells 512 according to another embodiment of the present invention, where the memory device 512M and access device 512A' have different conductivity type. For example, memory device 512M is an n-channel transistor, while access device 512A' is a p-channel transistor. The memory device 512M comprises a floating body region 24 having a first conductivity type, such as p-type. Access transistor 512A' comprises a well region 12' of the second conductivity type, such as n-type, source region 20' and bit line region 22' of the first conductivity type, such as p-type. The well region 12' of the second conductivity type is electrically connected to the buried well region 30, and is therefore not floating.

Referring to the layout view shown in FIG. 12, the BNWL layer 170 encloses both memory device 512M and access device 512A', as the buried layer is formed underneath both memory device 512M and access device 512A'. The well region 12' of the access device 512A' is defined by the layer 190. Similarly, the source region 20' and bit line region 22' of the access device 512A' are defined using a different layer from the source line region 16 and drain region 18 of the memory device 512M.

Memory array 1512 may be implemented in three-dimensional structure similar to what is shown in FIG. 8. Memory array 1512 may also require dummy POLY layers as shown in FIG. 10. The arrangement of DIFF layers 130 in a zig-zag pattern illustrated in FIG. 11 may also be applied to memory array 1512.

Figure 14:
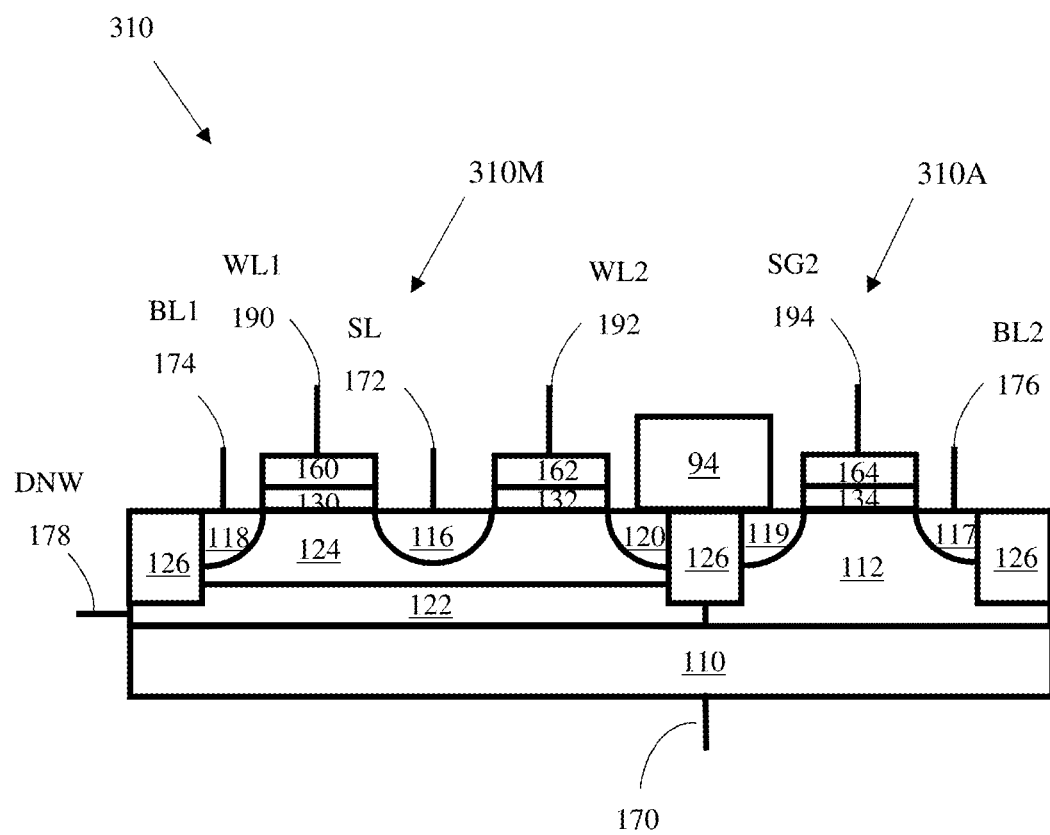
FIG. 14 is a schematic, cross-sectional view of a multi-port memory cell according to another embodiment of the present invention.

FIG. 14 illustrates a schematic cross-sectional view of a multi-port memory cell 310 according to another embodiment of the present invention. Memory cell 310 comprises a bi-stable floating body transistor 310M having a floating body region 124 having a first conductivity type, for example p-type. A buried layer region 122 having a second conductivity type, for example n-type, is formed underneath the floating body region 124. The buried layer 122 is designed such that when a back bias is applied to the buried layer 122, impact ionization is generated when the memory device 310 is in logic-1 state, but no impact ionization is generated when the memory device 310 is in logic-0 state, for example as described in U.S. Pat. No. 9,230,651, "Memory Device Having Electrically Floating Body Transistor", which is hereby incorporated herein, in its entirety, by reference thereto.

The bi-stable floating body transistor 310M also comprises regions 116, 118, and 120 having a second conductivity type, and gate regions 160 and 162 insulated from the floating body region 124 by insulating layers 130 and 132, respectively.

Memory cell 310 also comprises an access transistor 310A having a well region 112 having a second conductivity type, for example n-type, regions 117 and 119 having a first conductivity type, for example p-type, and a gate region 164 insulated from the well region 112 by an insulating layer 134. The region 119 of the access transistor is connected to the region 120 of the bi-stable floating body transistor 120 through a conductive element 94, forming a series connection between the access transistor 310A and the bi-stable floating body transistor 310M.

Memory cell 310 includes word line #1 (WL1) terminal 190 electrically connected to gate 160, word line #2 (WL2) terminal 192 electrically connected to gate 162, a source line (SL) terminal 172 electrically connected to region 116, a bit line #1 (BL1) terminal 174 electrically connected to region 118, a select gate #2 (SG2) terminal 194 electrically connected to gate 164, bit line #2 (BL2) terminal 176 electrically connected to region 117, buried well (BW) terminal 178 electrically connected to the buried layer 122, and substrate (SUB) terminal 170 electrically connected to the substrate region 110. WL1 terminal 190 and BL1 terminal 174 may be referred to herein as 'port #1', while WL2 terminal 192, SG2 terminal 194, and BL2 terminal 176 may be referred to herein as 'port #2'.

Several operations can be performed to memory cell 310, such as: holding, read, write logic-1 and write logic-0 operations. The read and write operations can be performed on memory cell 310 through port #1 and port #2.

The holding operation of the bi-stable floating body transistor has been described for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Pat. No. 9,230,651, "Memory Device Having Electrically Floating Body Transistor" ("Widjaja-3"), all of which are hereby incorporated herein, in their entireties, by reference thereto. The holding operation may be performed by applying a positive bias to the BW terminal 178, zero or negative bias on the WL1 terminal 190, WL2 terminal 192, a positive bias to the SG2 terminal 194, about zero potential on the BL1 terminal 174, BL2 terminal 176, SL terminal 172, and substrate terminal 78.

In one embodiment the bias conditions for the holding operation for memory cell 310 are: 0.0 volts is applied to WL1 terminal 190, 0.0 volts is applied to WL2 terminal 192, +1.2 volts is applied to SG2 terminal 194, about 0.0 volts is applied to the SL terminal 172, BL1 terminal 174, BL2 terminal 176, and SUB terminal 170, and a positive voltage like, for example, +1.2 volts is applied to BW terminal 178. In other embodiments, different voltages may be applied to the various terminals of memory cell 310 as a matter of design choice and the exemplary voltages described are not limiting in any way.

The read and write operations of memory cell 310 through port #1 have also been described in Widjaja-1, Widjaja-2, and Widjaja-3.

A read operation may be performed through port #1 for example by applying the following bias conditions: a positive voltage is applied to the BW terminal 178, zero voltage is applied to SL terminal 172, a positive voltage is applied to the selected BL1 terminal 174, and a positive voltage greater than the positive voltage applied to the selected BL1 terminal 174 is applied to the selected WL1 terminal 190, and zero voltage is applied to the SUB terminal 170. The unselected BL1 terminals will remain at zero voltage and the unselected WL1 terminals will remain at zero or negative voltage.

In one particular non-limiting embodiment, about 0.0 volts is applied to SL terminal 172, about +0.4 volts is applied to the selected BL1 terminal 174, about +1.2 volts is applied to the selected WL1 terminal 190, about +1.2 volts is applied to BW terminal 178, and about 0.0 volts is applied to the SUB terminal. The unselected BL1 terminals 174 remain at 0.0 volts and the unselected WL1 terminals 190 remain at 0.0 volts. However, these voltage levels may vary.

A write "0" operation of the memory cell 310 may be performed by applying the following bias conditions: a negative bias is applied to SL terminal 172, zero or negative voltage is applied to WL1 terminal 190, and zero or positive voltage is applied to BW terminal 178, and zero voltage is applied to the BL1 terminal 174 and SUB terminal 170. The SL terminal 172 for the unselected cells will remain grounded. Under these conditions, the p-n junction between 124 and 116 is forward-biased, evacuating any holes from the floating body 124.

In one particular non-limiting embodiment, about −0.5 volts is applied to SL terminal 172, about −0.5 volts is applied to WL1 terminal 190, about 0.0 volts is applied to the BL1 terminal 174, and about +1.2 volts is applied to terminal 178. However, these voltage levels may vary, while maintaining the relative relationships between the charges applied, as described above.

An alternative write "0" operation that allows for individual bit writing may be performed by applying a positive voltage to WL1 terminal 190, a negative voltage to BL1 terminal 174, zero or positive voltage to SL terminal 172, and zero or positive voltage to BW terminal 178, and zero voltage to SUB terminal 170. Under these conditions, the floating body 124 potential will increase through capacitive coupling from the positive voltage applied to the WL1 terminal 190. As a result of the floating body 124 potential increase and the negative voltage applied to the BL1 terminal 174, the p-n junction between 124 and 118 is forward-biased, evacuating any holes from the floating body 124. To reduce undesired write "0" disturb to other memory cells 310 in a memory array, the applied potential can be optimized as follows: if the floating body 124 potential of state "1" is referred to as $V_{FB1}$, then the voltage applied to the WL1 terminal 190 is configured to increase the floating body 124 potential by $V_{FB1}/2$ while $-V_{FB1}/2$ is applied to BL1 terminal 174. A positive voltage can be applied to SL terminal 172 to further reduce the undesired write "0" disturb on other memory cells 310 in a memory array. The unselected cells will remain at holding state, i.e. zero or negative voltage applied to WL1 terminal 190 and zero voltage applied to BL1 terminal 174.

In one particular non-limiting embodiment, the following bias conditions are applied to the selected memory cell 310: a potential of about 0.0 volts is applied to SL terminal 172, a potential of about −0.2 volts is applied to BL1 terminal 174, a potential of about +1.2 volts is applied to WL1 terminal 190, about +1.2 volts is applied to BW terminal 178, and about 0.0 volts is applied to SUB terminal 170; while about 0.0 volts is applied to SL terminal 172, about 0.0 volts is applied to BL1 terminal 174, about 0.0 volts is applied to WL1 terminal 190, and about +1.2 volts is applied to BW terminal 178 of the unselected memory cells. However, these voltage levels may vary.

A write "1" operation may be performed by applying a positive voltage to WL1 terminal 190, a positive voltage to BL1 terminal 174, zero or positive voltage to SL terminal 172, and zero or positive voltage to BW terminal 178, and zero voltage to SUB terminal 170.

In one particular non-limiting embodiment, the following bias conditions are applied to the selected memory cell 310: a potential of about 0.0 volts is applied to SL terminal 172, a potential of about +1.2 volts is applied to BL1 terminal 174, a potential of about +1.2 volts is applied to WL1 terminal 190, about +1.2 volts is applied to BW terminal 178, and about 0.0 volts is applied to SUB terminal 170; while about 0.0 volts is applied to SL terminal 172, about 0.0 volts is applied to BL1 terminal 174, about 0.0 volts is applied to WL1 terminal 190, and about +1.2 volts is applied to BW terminal 178 of the unselected memory cells. However, these voltage levels may vary.

Read and write operations through port #2 can be performed by first turning on the access transistor connected in series with the bi-stable floating body transistor, for example as described in U.S. Patent Application Publication No. 2015/0023105, "Memory Cell Comprising First and Second Transistors and Method of Operating", which is hereby incorporated herein, in its entirety, by reference thereto.

A read operation may be performed through port #2 for example by applying the following bias conditions: a positive voltage is applied to the BW terminal 178, zero voltage is applied to SL terminal 172, a positive voltage is applied to the selected BL2 terminal 176, and zero or a positive voltage is applied to the selected WL2 terminal 192, and zero voltage is applied to the SUB terminal 170. For p-type transistor illustrated in FIG. 14, the access transistor is turned on by applying zero or negative voltage to the selected SG2 terminal 194. The unselected BL2 terminals will remain at zero voltage and the unselected WL2 terminals will remain at zero or negative voltage, while the unselected access transistors will remain off by applying a positive voltage to the unselected SG2 terminals.

In one particular non-limiting embodiment, about 0.0 volts is applied to SL terminal 172, about +0.4 volts is applied to the selected BL2 terminal 176, about volts is applied to the selected WL2 terminal 192, about −0.5 volts is applied to SG2 terminal 194, about +1.2 volts is applied to BW terminal 178, and about 0.0 volts is applied to the SUB terminal. The unselected BL2 terminals 176 remain at volts, the unselected WL2 terminals 192 remain at 0.0 volts, and the unselected SG2 terminals 194 remain at about +1.2 volts. However, these voltage levels may vary.

A write "0" operation may be performed through port #2 for example by applying the following bias conditions: a positive voltage is applied to the BW terminal 178, zero voltage is applied to SL terminal 172, a negative voltage is applied to the selected BL2 terminal 176, and a positive voltage is applied to the selected WL2 terminal 192, and zero voltage is applied to the SUB terminal 170. For p-type transistor illustrated in FIG. 14, the access transistor is turned on by applying zero or negative voltage to the selected SG2 terminal 194. The unselected BL2 terminals will remain at zero voltage and the unselected WL2 terminals will remain at zero or negative voltage, while the unselected access transistors will remain off by applying a positive voltage to the unselected SG2 terminals.

In one particular non-limiting embodiment, about 0.0 volts is applied to SL terminal 172, about −0.2 volts is applied to the selected BL2 terminal 176, about +1.2 volts is applied to the selected WL2 terminal 192, about −0.5 volts is applied to SG2 terminal 194, about +1.2 volts is applied to BW terminal 178, and about 0.0 volts is applied to the SUB terminal. The unselected BL2 terminals 176 remain at volts, the unselected WL2 terminals 192 remain at 0.0 volts, and the unselected SG2 terminals 194 remain at about +1.2 volts. However, these voltage levels may vary.

A write "1" operation may be performed through port #2 for example by applying the following bias conditions: a positive voltage is applied to the BW terminal 178, zero voltage is applied to SL terminal 172, a positive voltage is applied to the selected BL2 terminal 176, a positive voltage is applied to the selected WL2 terminal 192, and zero voltage is applied to the SUB terminal 170. For p-type transistor illustrated in FIG. 14, the access transistor is turned on by applying zero or negative voltage to the selected SG2 terminal 194. The unselected BL2 terminals will remain at zero voltage and the unselected WL2 terminals will remain at zero or negative voltage, while the unselected access transistors will remain off by applying a positive voltage to the unselected SG2 terminals.

In one particular non-limiting embodiment, about 0.0 volts is applied to SL terminal 172, about +1.2 volts is applied to the selected BL2 terminal 176, about +1.2 volts is applied to the selected WL2 terminal 192, about −0.5 volts is applied to SG2 terminal 194, about +1.2 volts is applied to BW terminal 178, and about 0.0 volts is applied to the SUB terminal. The unselected BL2 terminals 176 remain at volts, the unselected WL2 terminals 192 remain at 0.0 volts, while the unselected SG2 terminals 194 remain at about +1.2 volts. However, these voltage levels may vary.

From the foregoing it can be seen that memory cell 310 may function as a multi-port memory cell. Port #1 and port #2 can both be used as read and access port. It may also be configured, for example, such that port #1 is used only for read operation and port #2 is used for both read and write operations.

Figure 15A:
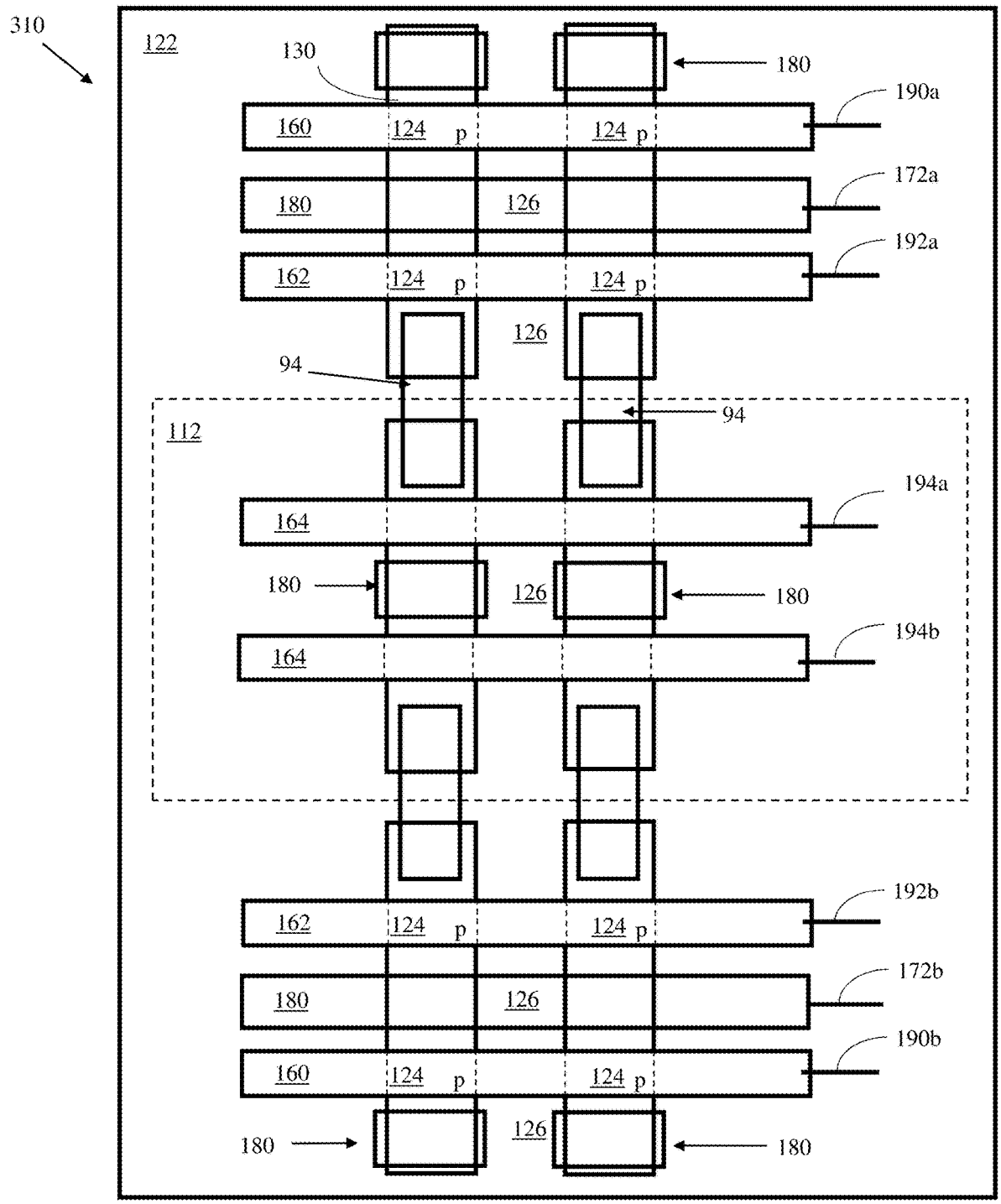
FIGS. 15A and 15B are schematic, layout views of a memory array comprising two rows and two columns of multi-port memory cells according to another embodiment of the present invention.
Figure 15B:
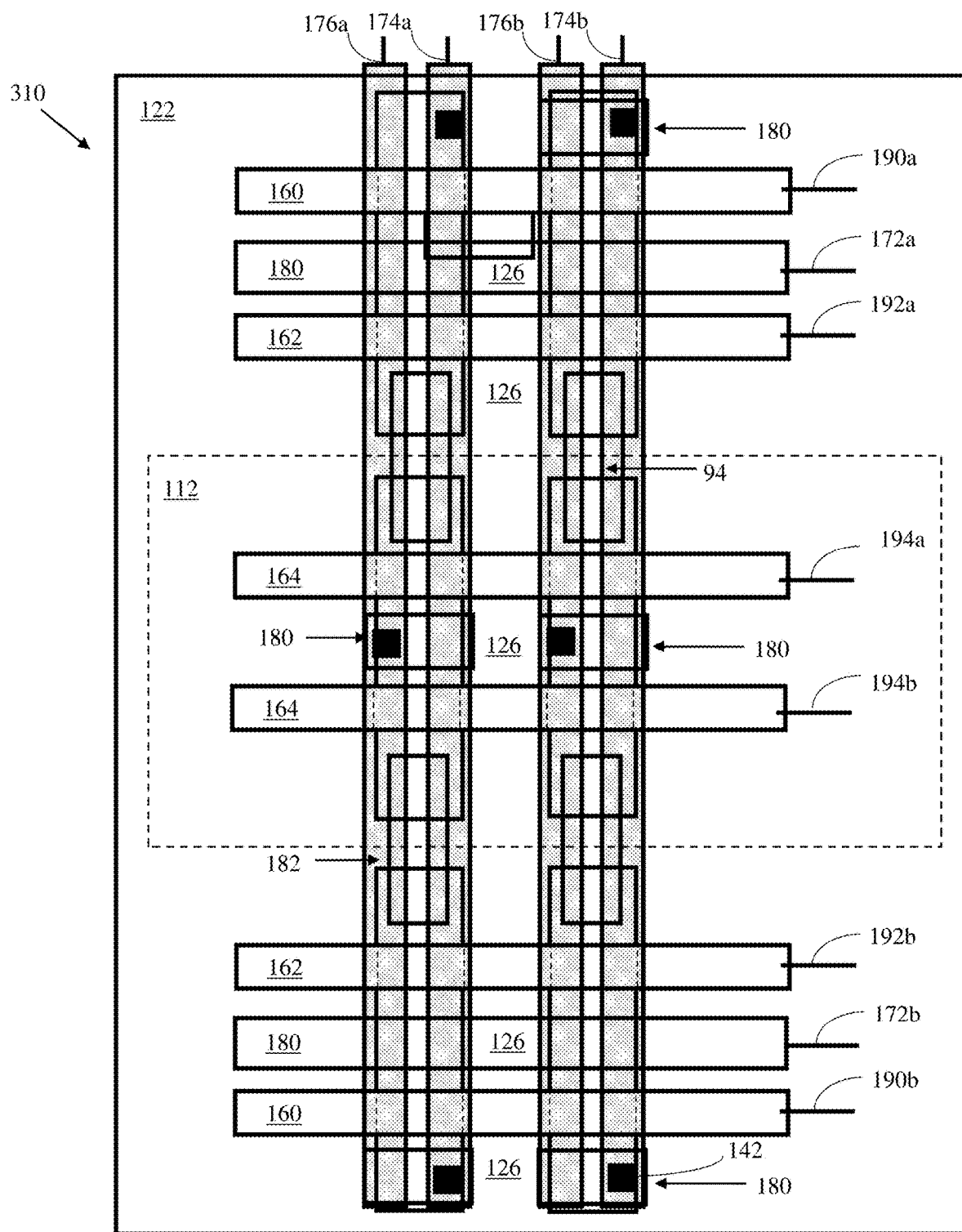
Figure 16:
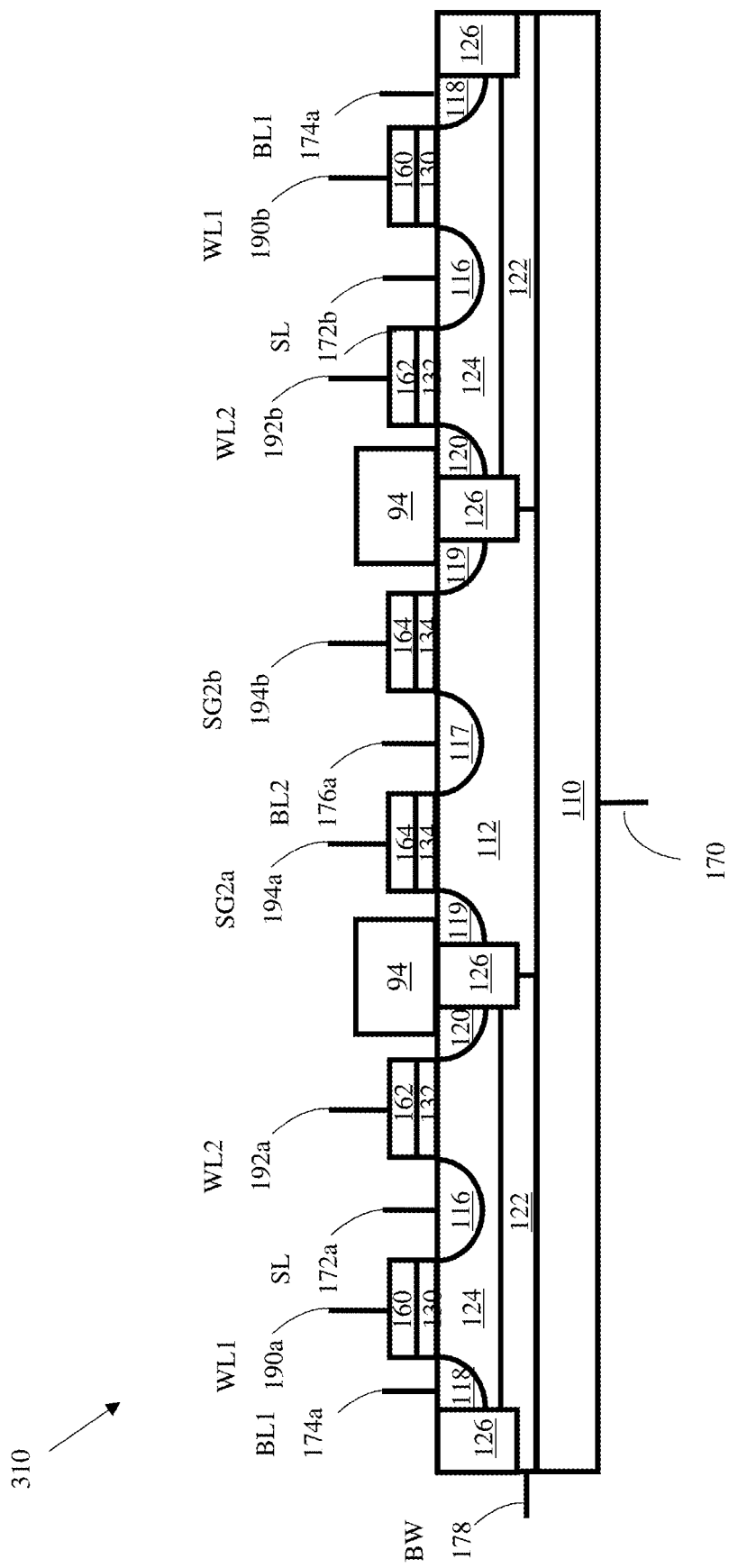
FIG. 16 is a schematic, cross-sectional view of two rows of multi-port memory cells illustrated in FIGS. 15A and 15B.

FIGS. 15A, 15B, and 16 illustrate schematic layout and cross-sectional views of a memory array comprising two rows and two columns of memory cells 310, where adjacent memory cells 310 are mirrored to share the contact or via to the region 117 (see FIG. 16), connecting it to the BL2 terminal 176. For simplicity, not all the layers are shown in FIGS. 15A, 15B, and 16.

Referring to the layout views shown in FIGS. 15A and 15B, the active regions of the bi-stable floating body transistor and access transistor are defined by the DIFF layer 130, while the spaces between the DIFF layer 130 define the insulating layers 126. The gate regions are defined by the POLY layers 160, 162, and 164, while layer 180 defines a metal layer MTL1. The WL1 terminal 190a, WL2 terminal 192a, SG2 terminal 194a, along with SL1 terminal 172a define a row of memory cells 310, while WL1 terminal 190b, WL2 terminal 192b, SG2 terminal 194b, and the SL1 terminal 172b define another row of memory cells 310.

FIG. 15B shows the connections to the MTL2 layer 182, which form electrical connections to the BL1 terminal 174 and BL2 terminal 176. The BL1 terminal 174a and BL2 terminal 176a define a column of memory cells 310, while BL1 terminal 174b and BL2 terminal 176b define another column of memory cells 310. The MTL2 layer 182 is connected to the MTL1 layer 180 through a via layer 142.

Figure 17:
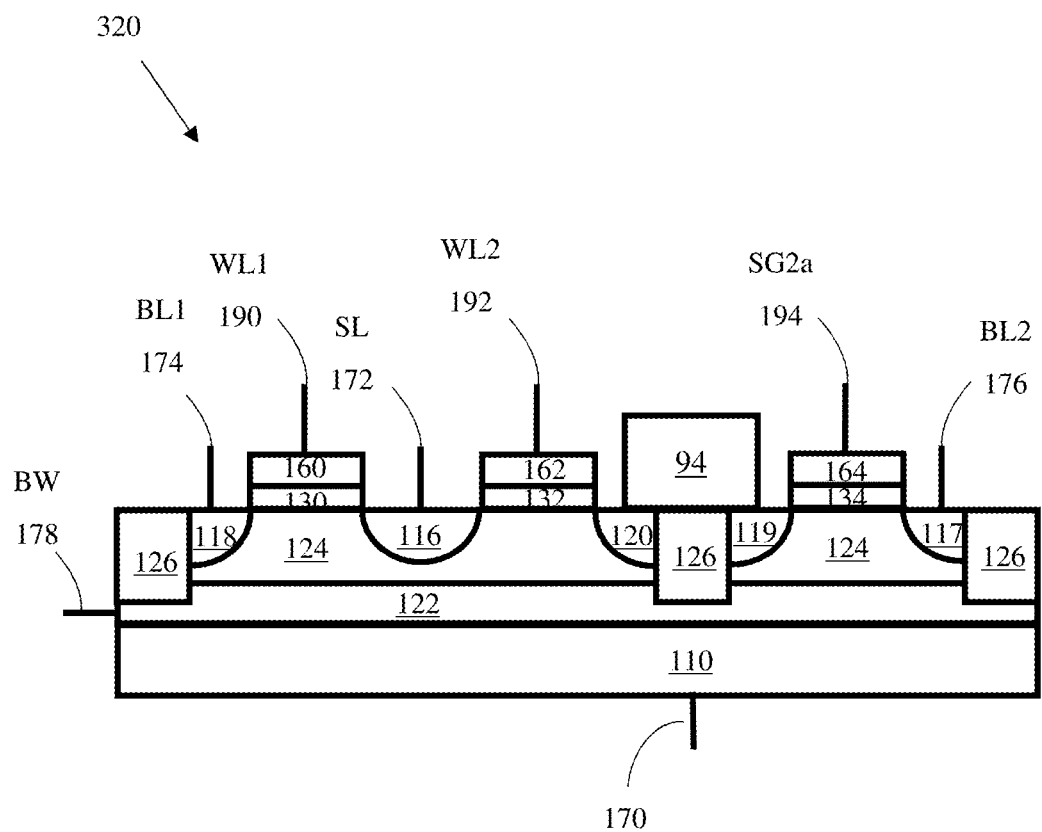
FIG. 17 is a schematic, cross-sectional view of a multi-port memory cell according to another embodiment of the present invention.

FIG. 17 illustrates a schematic cross-sectional view of a multi-port memory cell 320 according to another embodiment of the present invention, where both bi-stable floating body transistor and access transistor have the same conductivity type, for example n-type transistors.

Multi-port memory cells 310 and 320 may also be implemented in three-dimensional structure similar to what is shown in FIG. 8. A memory array comprising a plurality of multi-port memory cells 310 and 320 may also require dummy POLY layers as shown in FIG. 10. The arrangement of DIFF layers 130 in a zig-zag pattern illustrated in FIG. 11 may also be applied to memory arrays comprising a plurality of multi-port memory cells 310 or 320.

Figure 18:
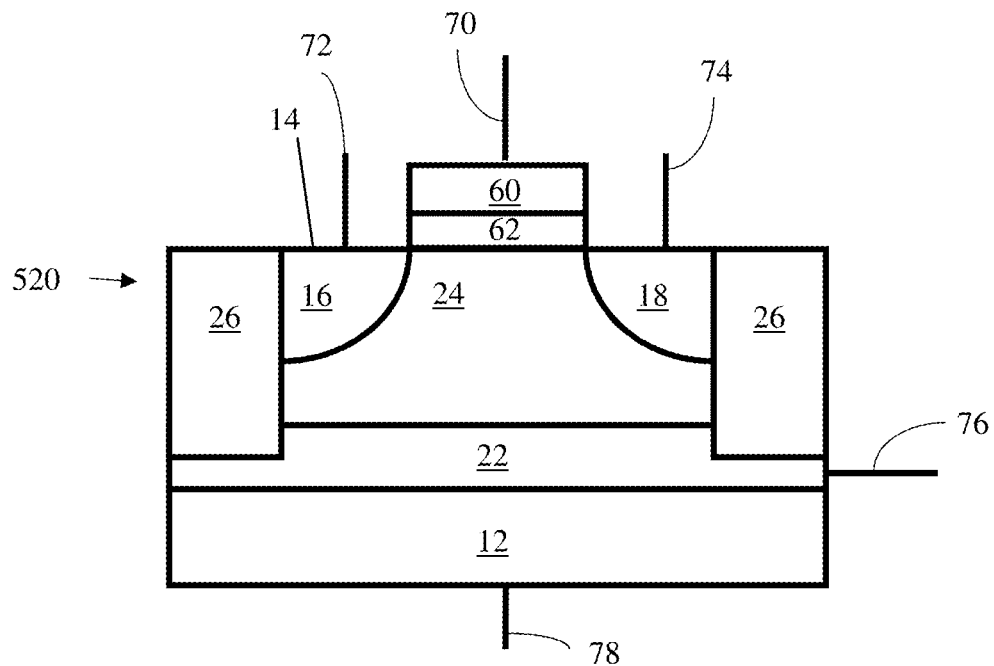
FIGS. 18 and 19 schematically illustrate cross-sectional views of variants of a memory cell according to an embodiment of the present invention.

A memory array of the present invention may comprise a plurality of memory cells 520 according to another embodiment of the present invention. FIG. 18 is a schematic, cross-sectional illustration of memory cell 520. Memory cell 520 may function as a memory device 50M illustrated in FIG. 2. Memory cell 520 includes a substrate 12 of a first conductivity type such as p-type, for example. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 19, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 18.

Memory cell 520 also includes a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by source line region 16, drain region 18, and insulating layer 62 (or by surface 14 in general), on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 19:
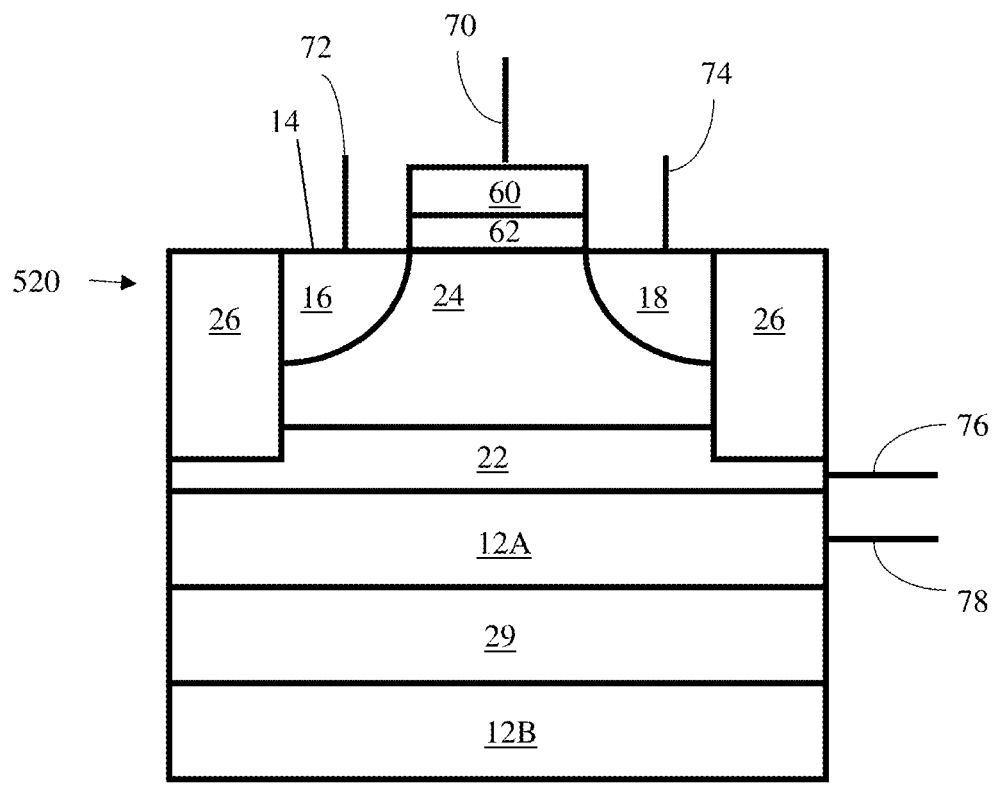
Figure 20B:
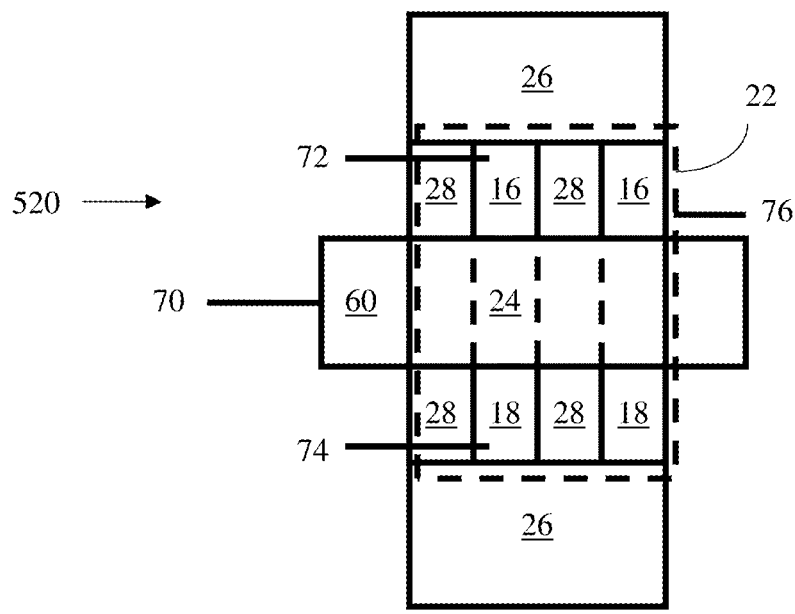
FIG. 20B is a schematic, top-view illustration of the memory cell shown in FIG. 20A.

Insulating layers 26 (like, for example, shallow trench isolation (STI)), may be made of silicon oxide, for example, though other insulating materials may be used. Insulating layers 26 insulate memory cell 50 from adjacent memory cell 50. The bottom of insulating layer 26 may reside inside the buried region 22 allowing buried region 22 to be continuous as shown in FIGS. 18 and 19. Alternatively, the bottom of insulating layer 26 may reside below the buried region 22 as in FIGS. 20A and 20B (shown better in FIG. 20A). This requires a shallower insulating layer 28, which insulates the floating body region 24, but allows the buried layer 22 to be continuous in the perpendicular direction of the cross-sectional view shown in FIG. 20A. For simplicity, only memory cell 520 with continuous buried region 22 in all directions will be shown from hereon.

Cell 520 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 21:
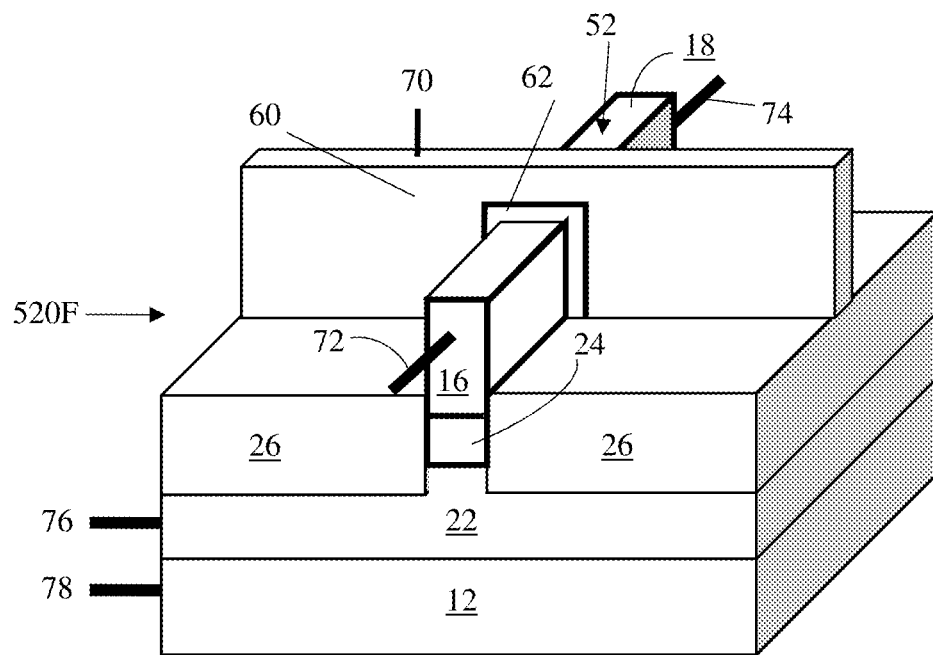
FIGS. 21 and 22 are schematic, three-dimensional views of variants of a memory cell having a fin structure according to an embodiment of the present invention.
Figure 22:
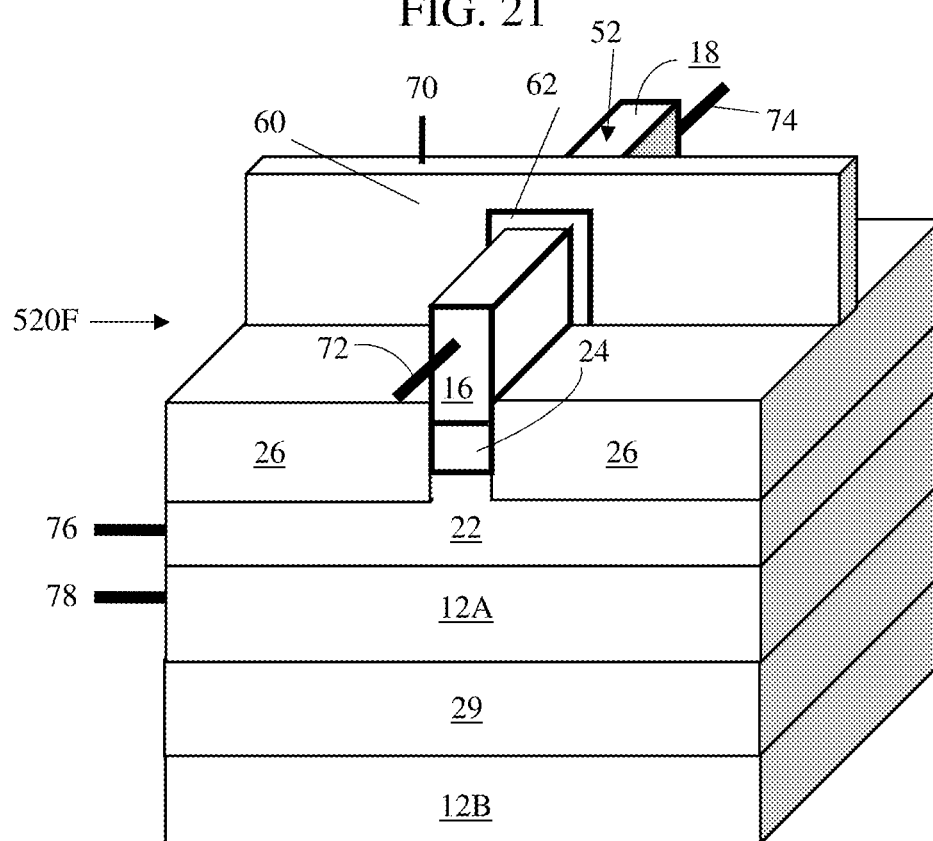

FIGS. 21 and 22 illustrate a schematic three-dimensional views of memory cell 520F having a fin structure according to another embodiment of the present invention. Memory cell 520F has a fin structure 52 fabricated on substrate 12 of a first conductivity type such as p-type for example, so as to extend from the surface of the substrate to form a three-dimensional structure, with fin 52 extending substantially perpendicular to and above the top surface of the substrate 12. Fin structure 52 is semiconductive and is built on buried well layer 22 of a second conductivity type such as n-type for example, which is itself built on top of substrate 12. Alternatively, buried well 22 could be a diffusion region inside substrate 12 with the rest of the fin 52 constructed above it, or buried well 22 could be a conductive layer on top of substrate 12 connected to all the other fin 52 structures in a manner similar to memory cell 520 described above. Fin 52 is typically made of silicon, but may comprise germanium, silicon germanium, gallium arsenide, carbon nanotubes, or other semiconductor materials known in the art. In other embodiments, substrate 12A can be a well of the first conductivity type embedded in either a well 29 of the second conductivity type or, alternatively, in the bulk of the semiconductor wafer of the second conductivity type, such as n-type, for example as shown in FIG. 22. To simplify the description, the substrate 12 will usually be drawn as the semiconductor bulk material as it is in FIG. 21.

Figure 23:
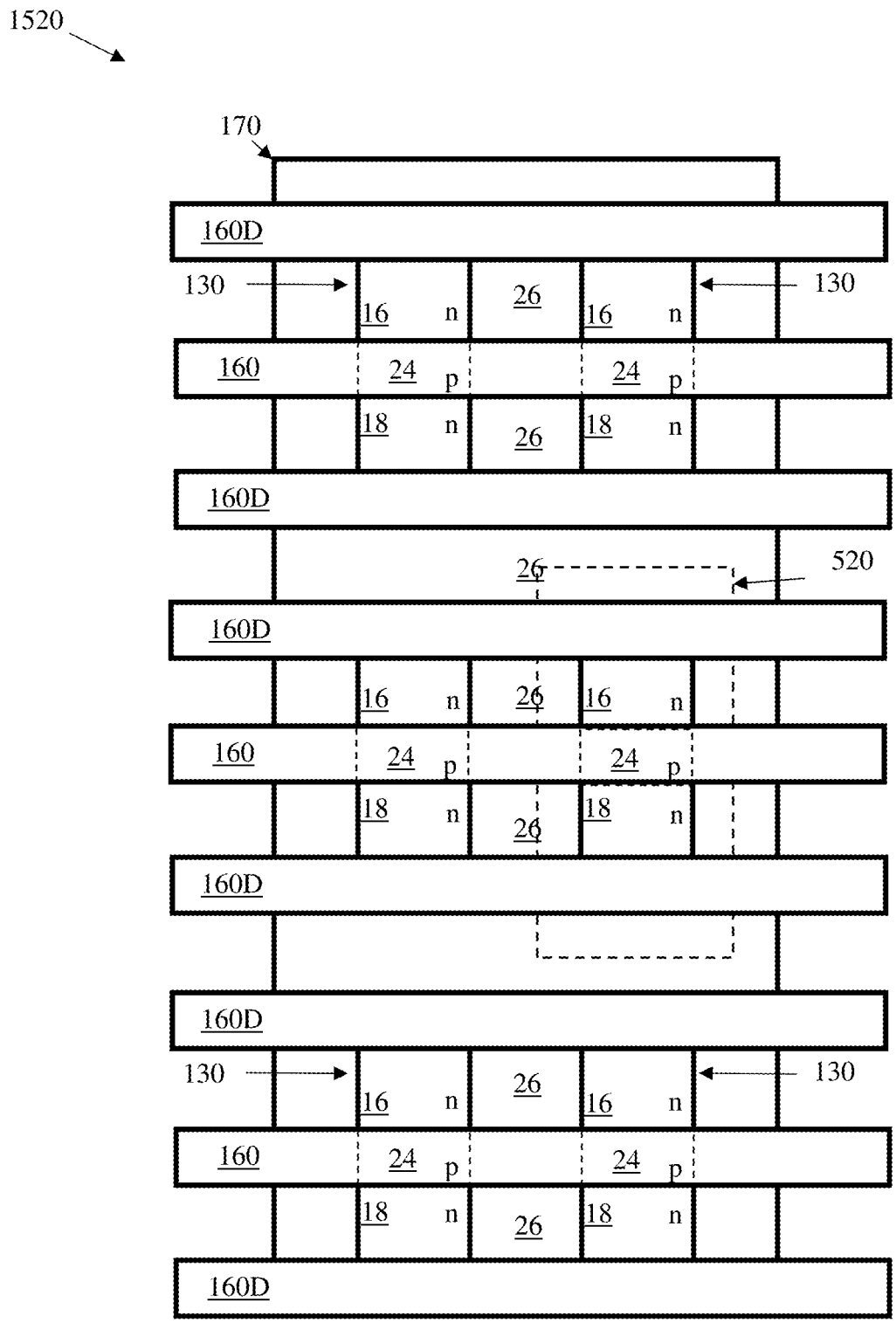
FIGS. 23-26 schematically illustrate layout views of a memory array according to another embodiment of the present invention.

FIG. 23 illustrates a layout view of memory array 1520 according to another embodiment of the present invention. The memory array 1520 is located within a buried well region 170 layer. The memory array 1520 includes additional dummy POLY layers 160D which only partially overlay a DIFF region 130 (hence being referred to as dummy layer). The dummy layer 160D for example may be a result of restrictive design rules (which guides the layout drawing of the layers) for better lithography patterning process. The DIFF layers 130 define the active regions of the memory cell (regions between the insulating layers shown in the cross-sectional view in FIG. 20A), where the layers in between the DIFF layers 130 define the insulating layers 26. The POLY layers 160 and dummy POLY layers 160D define the gate region 60 shown in the cross-sectional view of FIG. 20A.

As shown in FIG. 23, the unit cell of the memory cell 520 comprises three POLY 160 regions: two 160D to define the dummy region and another 160 to define the transistor region (fully overlapping with DIFF layer 130). The overlap between POLY 160 and DIFF 130 layers form the channel region of the memory cell 520, for example the region beneath gate region 60 and dielectric layer 62, between the source line region 16 and bit line region 18 shown in FIG. 18.

Figure 24:
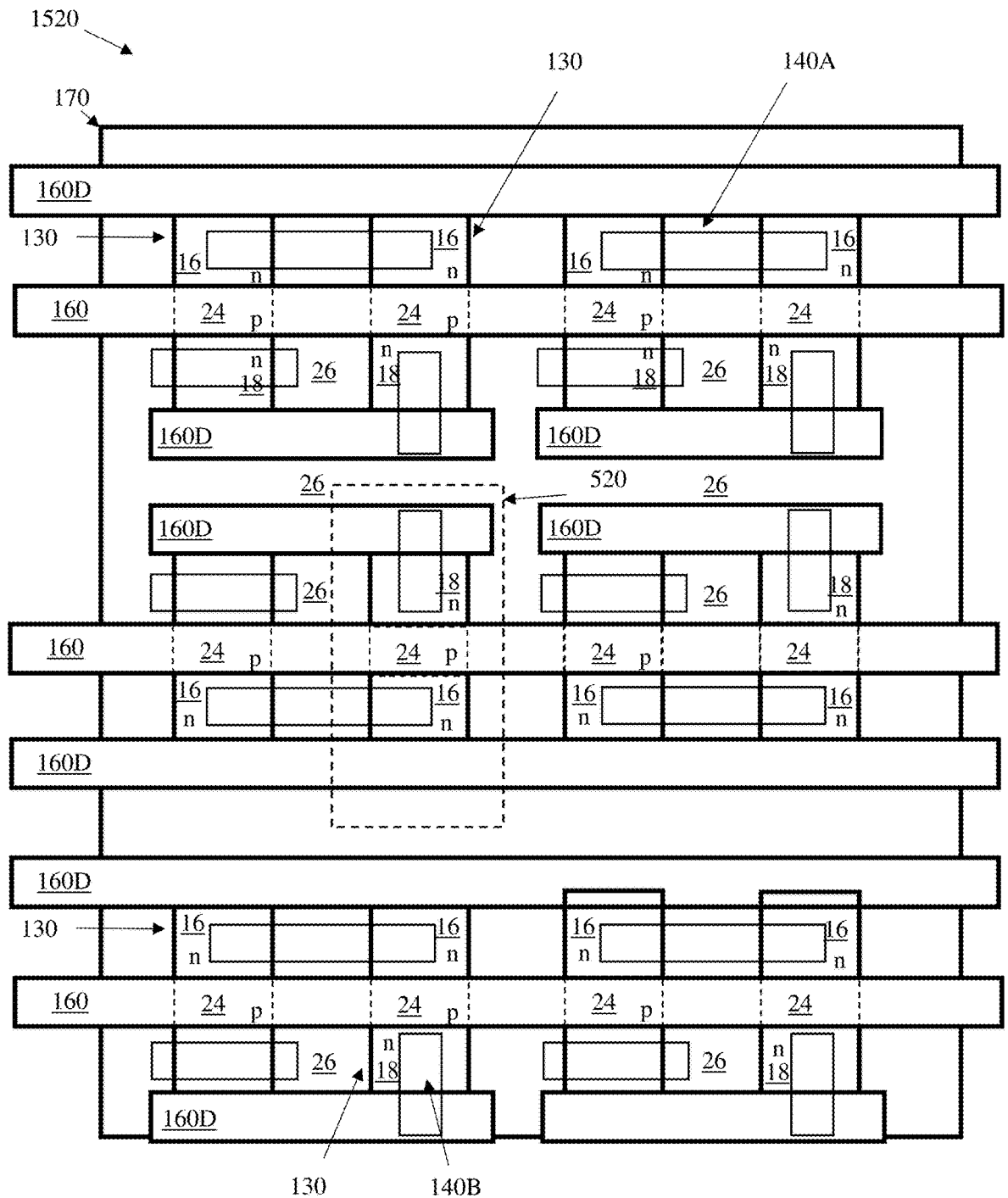

FIG. 24 illustrates a layout view of memory array 1520, illustrating examples on how electrical contact to the source line region 16 and bit line region 18 are formed. In the exemplary layout view shown in FIG. 24, two different CONT layers are shown: CONT-A 140A which is used to form connection to the DIFF region 130, and CONT-B 140B which is used to form between DIFF region 130 and the dummy POLY layer 160D. The dummy POLY layers 160D are cut into shorter lines (for example, compared to the dummy POLY layers 160D shown in FIG. 23) to prevent electrical shorts between adjacent memory cells 520 connected through CONT-B 140B layers. The dummy POLY 160D layers could be cut using a POLYCUT layer perpendicular to POLY direction, for example, to etch a continuous dummy POLY 160D layer.

Figure 25:
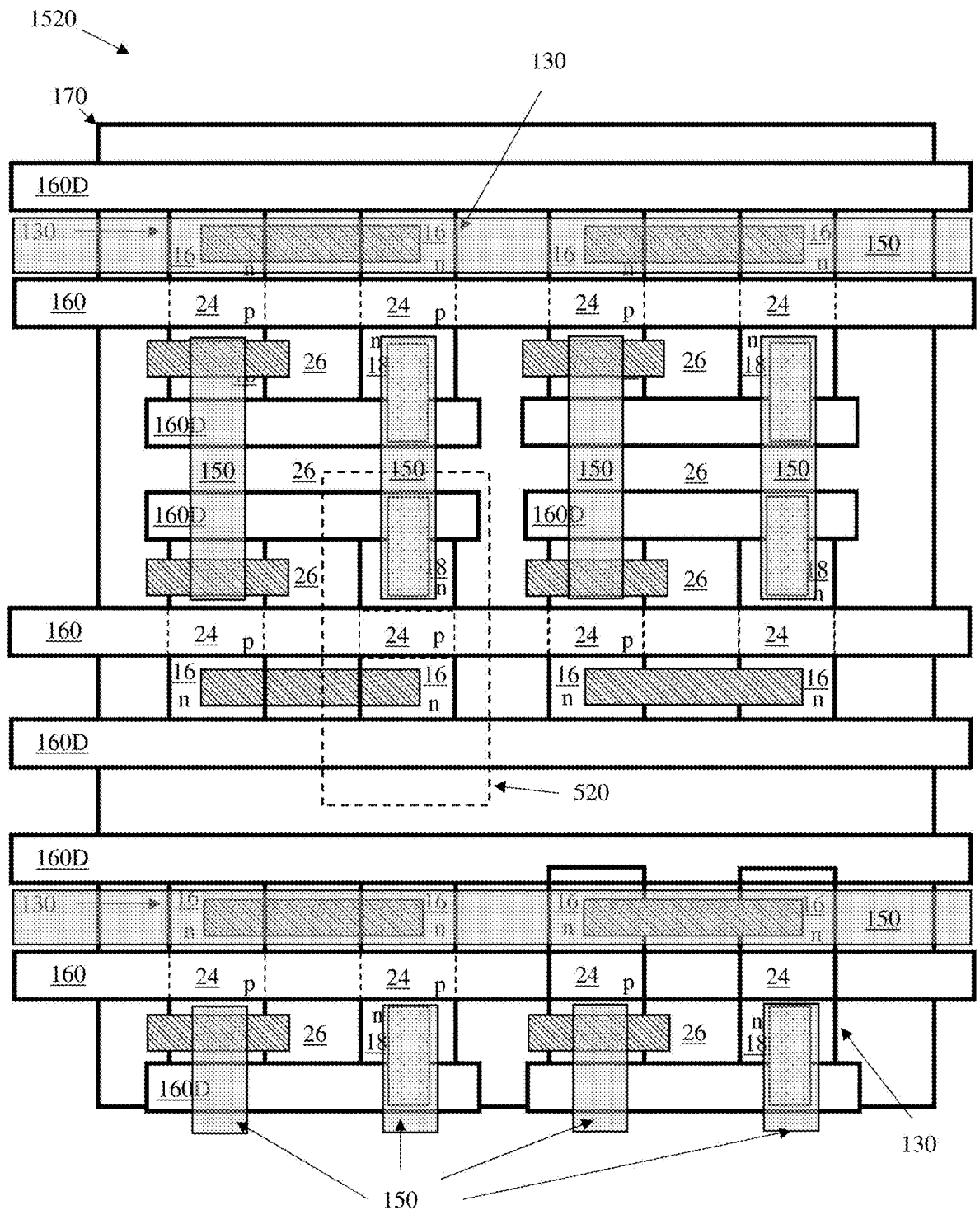
Figure 26:
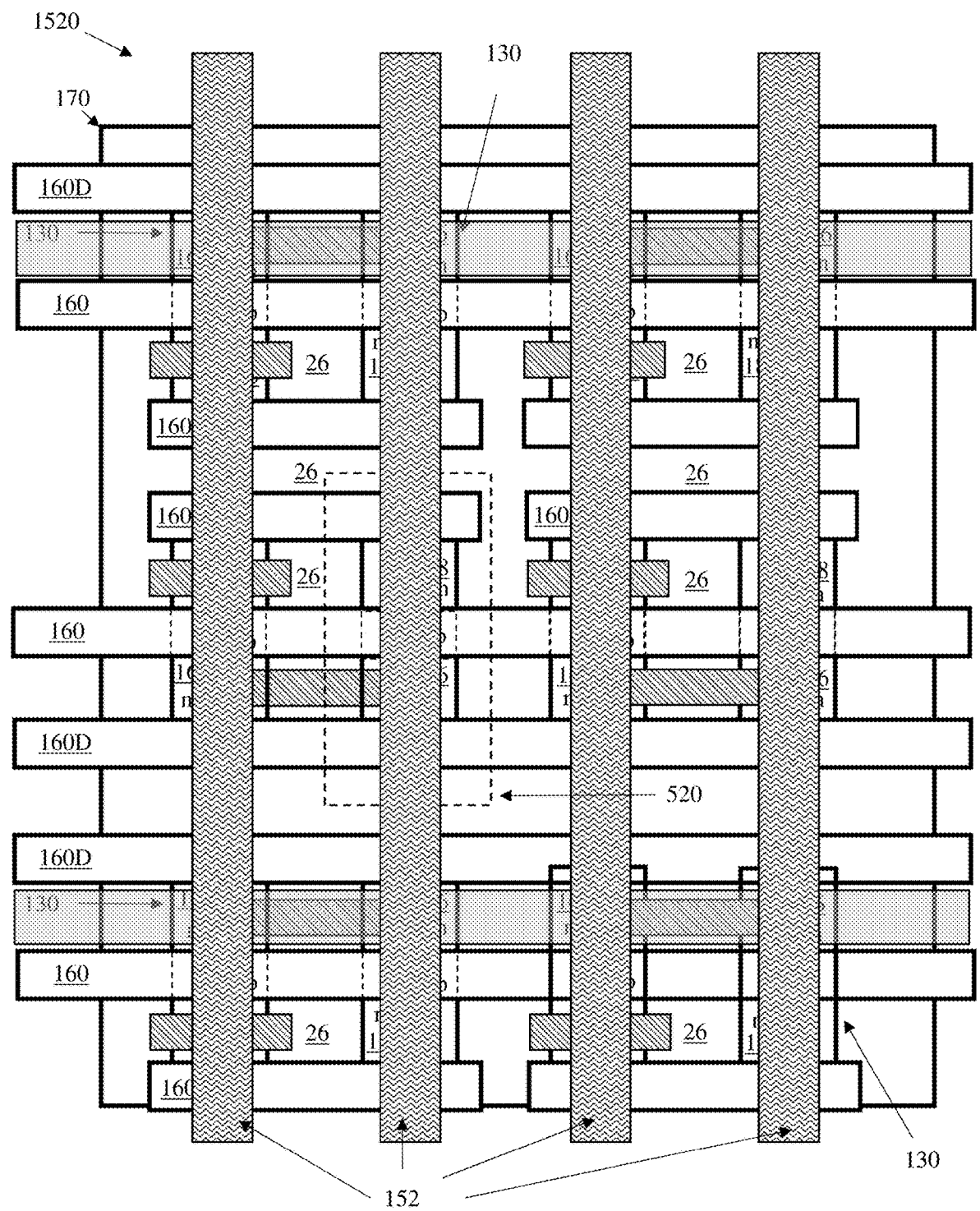

FIG. 25 illustrates the conductive METAL1 150 layers, for example metal layers which connect the different regions of the memory cells 520 through the CONT layers. In the example illustrated in FIG. 25, a METAL1 150 layer connects source line regions 16 of adjacent memory cells 520 through CONT-A layers 140A (which may then be connected to a SL terminal 72), and bit line regions 18 of two neighboring memory cells 50 through CONT-A 140A and CONT-B 140B layers. The bit line regions 18 connected by METAL1 150 layer may then be connected by a METAL2 layers 152 to BL terminals 74, for example as shown in FIG. 26.

Figure 27:
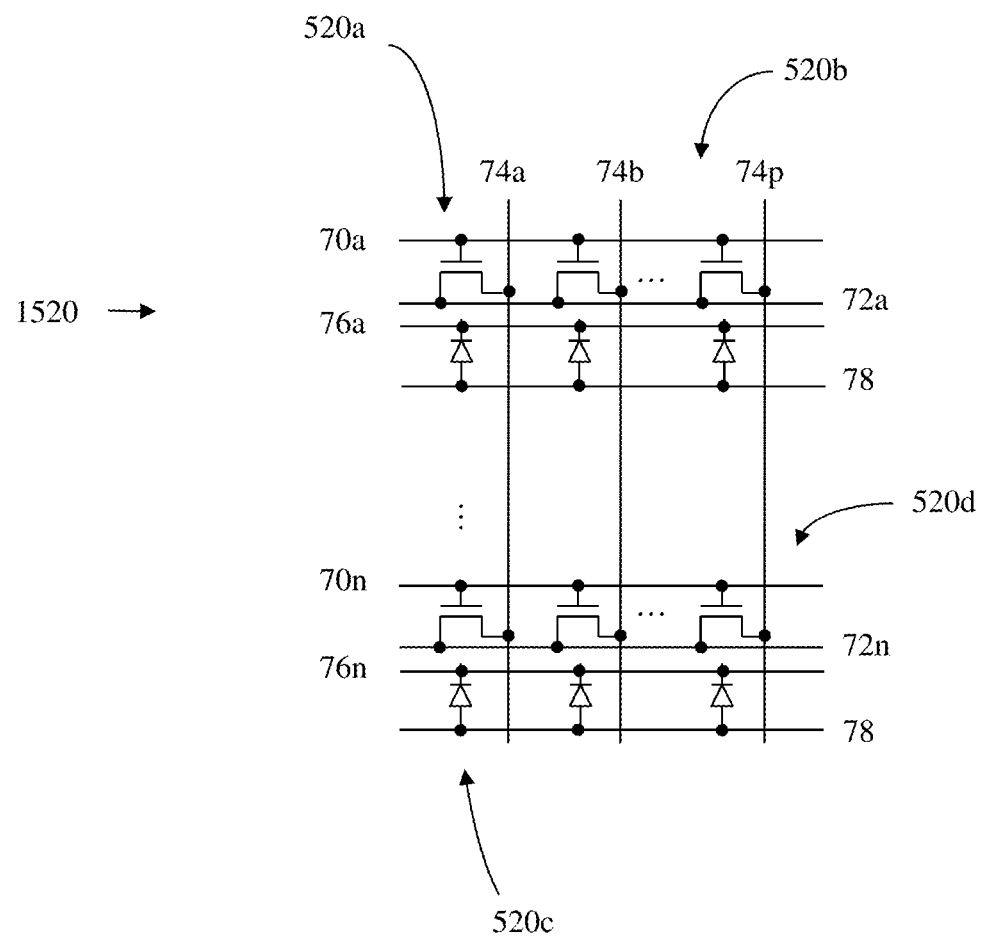
FIG. 27 schematically illustrates a memory array of memory cells of the type shown in FIGS. 23-26 according to an embodiment of the present invention.

FIG. 27 schematically illustrates an exemplary embodiment of a memory array 1520 of memory cells 520 (four exemplary instances of memory cell 520 being labeled as 520a, 520b, 520c and 520d) arranged in rows and columns. In many, but not necessarily all, of the figures where memory array appears, representative memory cell 520a will be representative of a "selected" memory cell 520 when the operation being described has one (or more in some embodiments) selected memory cell(s) 520. In such figures, representative memory cell 520b will be representative of an unselected memory cell 520 sharing the same row as selected representative memory cell 520a, representative memory cell 520c will be representative of an unselected memory cell 520 sharing the same column as selected representative memory cell 520a, and representative memory cell 520d will be representative of an unselected memory cell 520 sharing neither a row or a column with selected representative memory cell 520a.

Figure 28A:
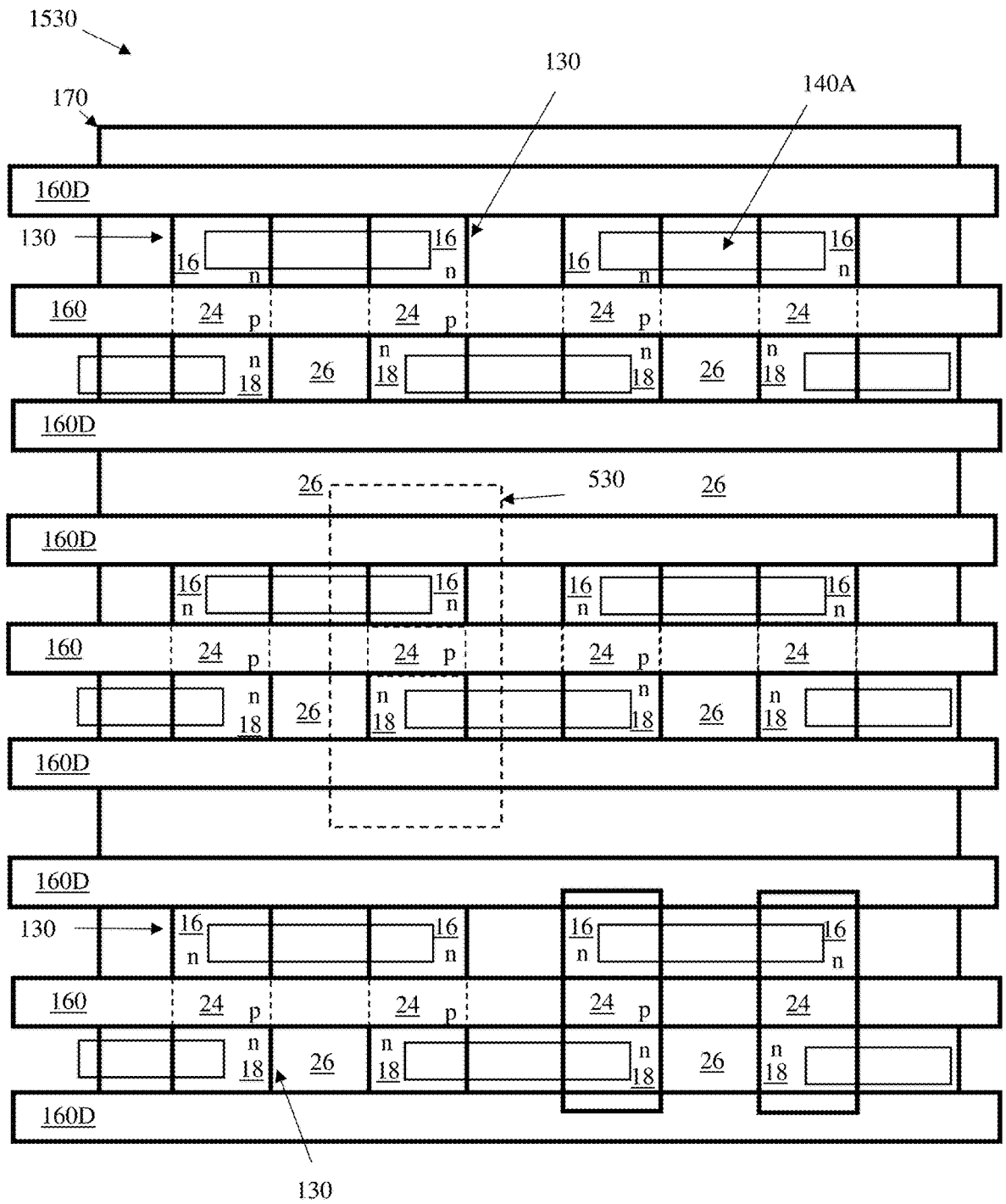
FIGS. 28A and 28B schematically illustrate layout views of a memory array according to another embodiment of the present invention.
Figure 28B:
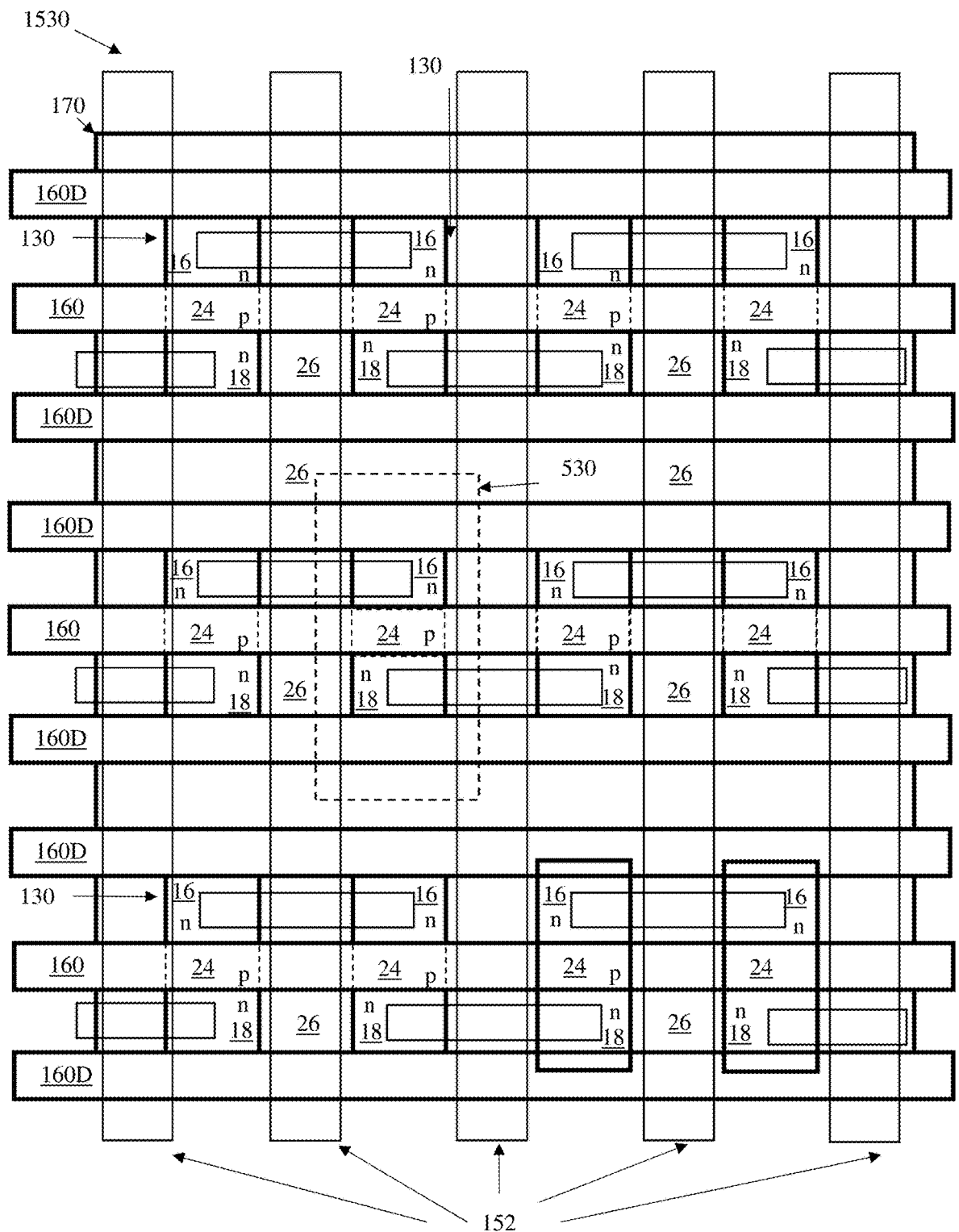

FIGS. 28A and 28B illustrate an exemplary memory array 1530 of memory cells 530 according to another embodiment of the present invention. CONT-A layers 140A are used to connect two neighboring source line regions 16 and two neighboring bit line regions 18 of adjacent memory cells 530 in an alternating pattern, such that only one of the two memory cells connected by one CONT-A layer 140A is the same as the two memory cells connected by another CONT-A layer 140A. Conductive METAL layers 152 are then used to connect the source line regions 16 and bit line regions 18 of the memory cells to the BL terminals 74.

Figure 29:
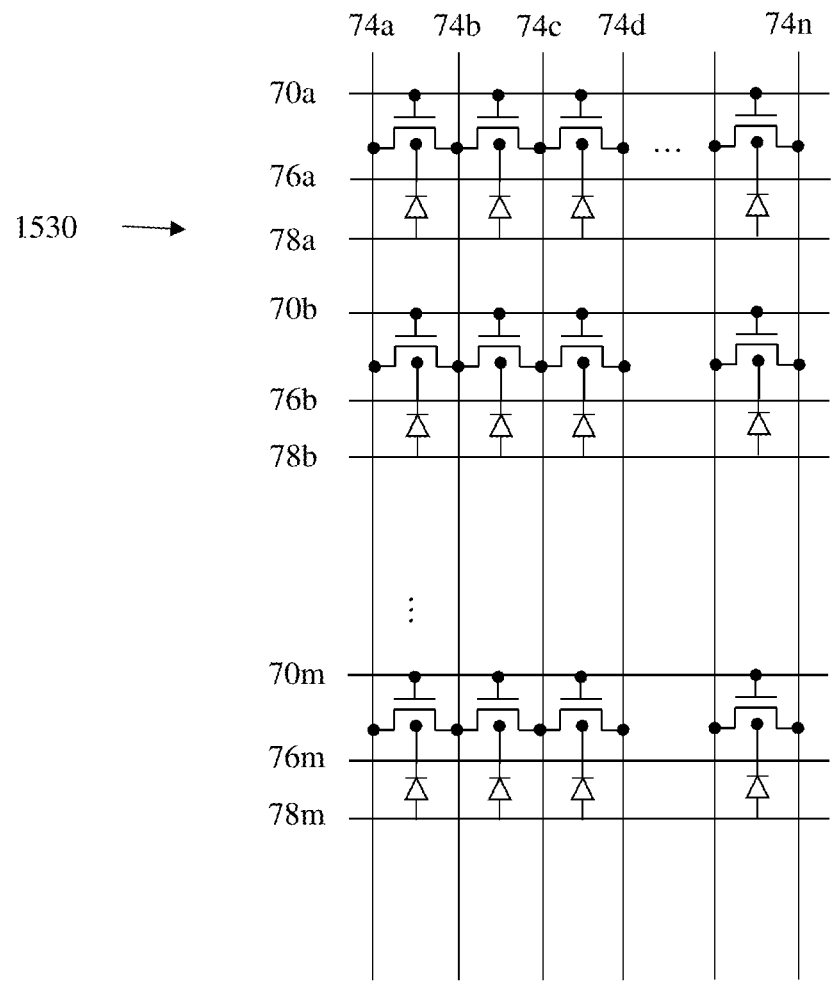
FIG. 29 schematically illustrates a memory array of memory cells according to another embodiment of the present invention.

FIG. 29 illustrates an exemplary embodiment of the memory array 1530, where each BL terminal 74 is shared by adjacent memory cells 530, connecting the source line regions 16 or bit line regions 18 of adjacent memory cells 530.

Several operations can be performed by memory cell 530 such as holding, read, write logic-1 and write logic-0 operations, and have been described in U.S. Pat. No. 9,230,651 to Widjaja et al., titled "Memory Device Having Floating Body Transistor" ("Widjaja-3") and U.S. Pat. No. 8,077,536, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 30:
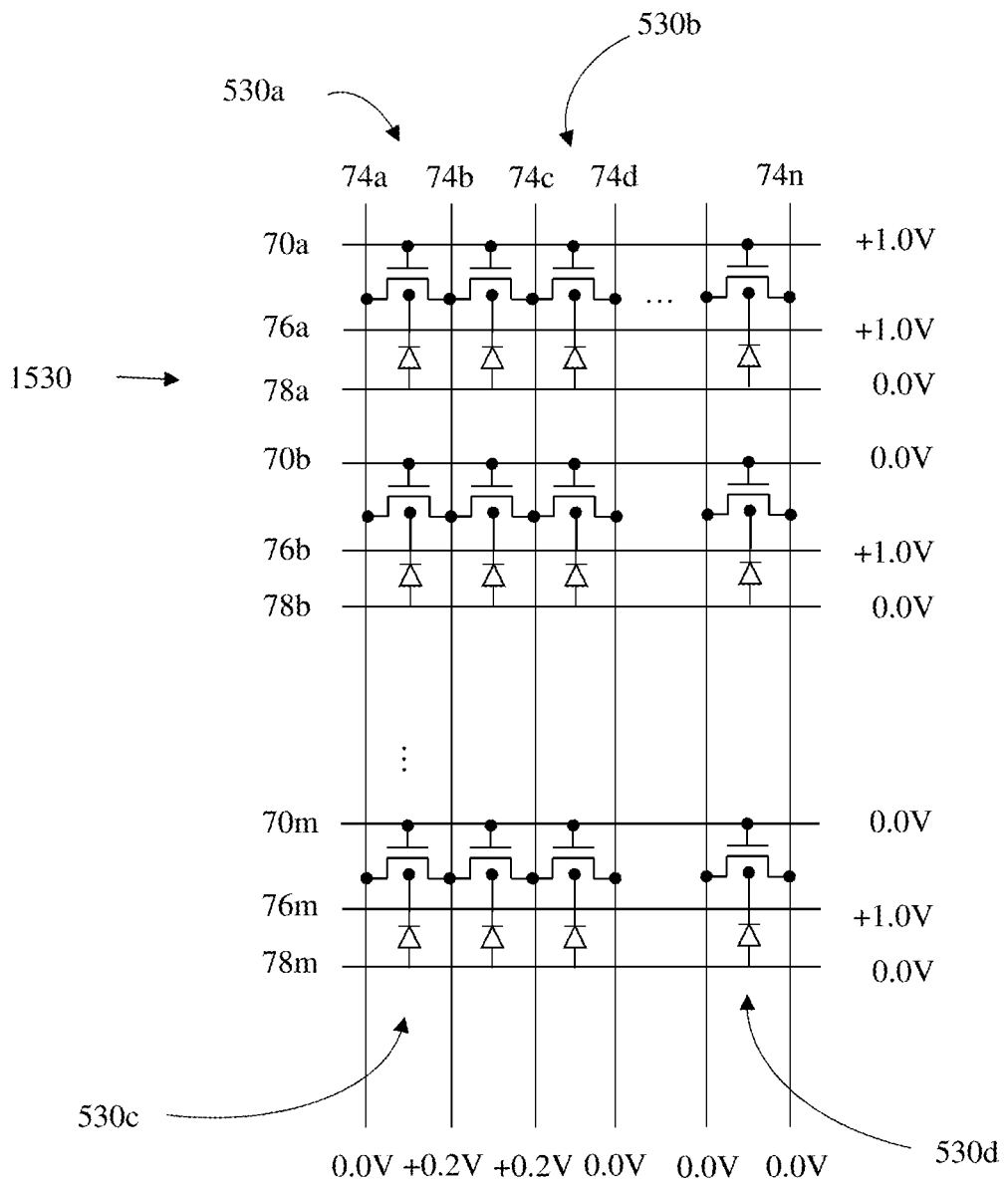
FIG. 30 schematically illustrates a read operation performed on a memory array according to an embodiment of the present invention.

FIG. 30 illustrates a read operation performed on memory array 1530. A read operation is performed by applying a positive bias on the selected WL terminal 70, applying a positive bias to the first selected BL terminal 74b (less positive than the positive bias applied to the selected WL terminal 70), zero bias to the second selected BL terminal 74a, a positive bias applied to the BW terminal 76, and zero bias applied to the substrate terminal 78.

In the shared BL architecture of memory array 1530 shown in FIG. 29, applying a positive voltage to the selected BL terminal 74 will result in current flow through two adjacent memory cells 530 if the adjacent BL terminals 74 (adjacent to the selected BL terminal 74) are grounded (or at a lower bias than the selected BL terminal 74). In order to ensure that the current only flows through the selected memory cell 530, the same positive bias could be applied to the BL terminal adjacent to the selected BL terminal. In the exemplary read operation shown in FIG. 30, a positive bias is applied to the BL terminals 74b and 74c. As a result, electrical current will only flow through the memory cells 530a (between BL terminals 74b and 74a) and 530b (between BL terminals 74c and 74d). In this manner, two memory cells 530a and 530b can simultaneously be read if desired.

In one embodiment the bias conditions for the read operation on memory cell 530 are: +1.0 volts is applied to selected WL terminal 70, 0 V is applied to unselected WL terminal 70, +0.2 volts is applied to the first selected BL terminals 74 (BL terminals 74b and 74c in FIG. 30) and 0 volts to the second selected BL terminals (BL terminals 74a and 74d in FIG. 30), 0 volts is applied to unselected BL terminal 74, a positive voltage, for example, +1.0 volts is applied to BW terminal 76, and 0 volts is applied to the substrate terminal 78. In other embodiments, different voltages may be applied to the various terminals of memory cell 530 and the exemplary voltages described are not limiting.

Figure 31:
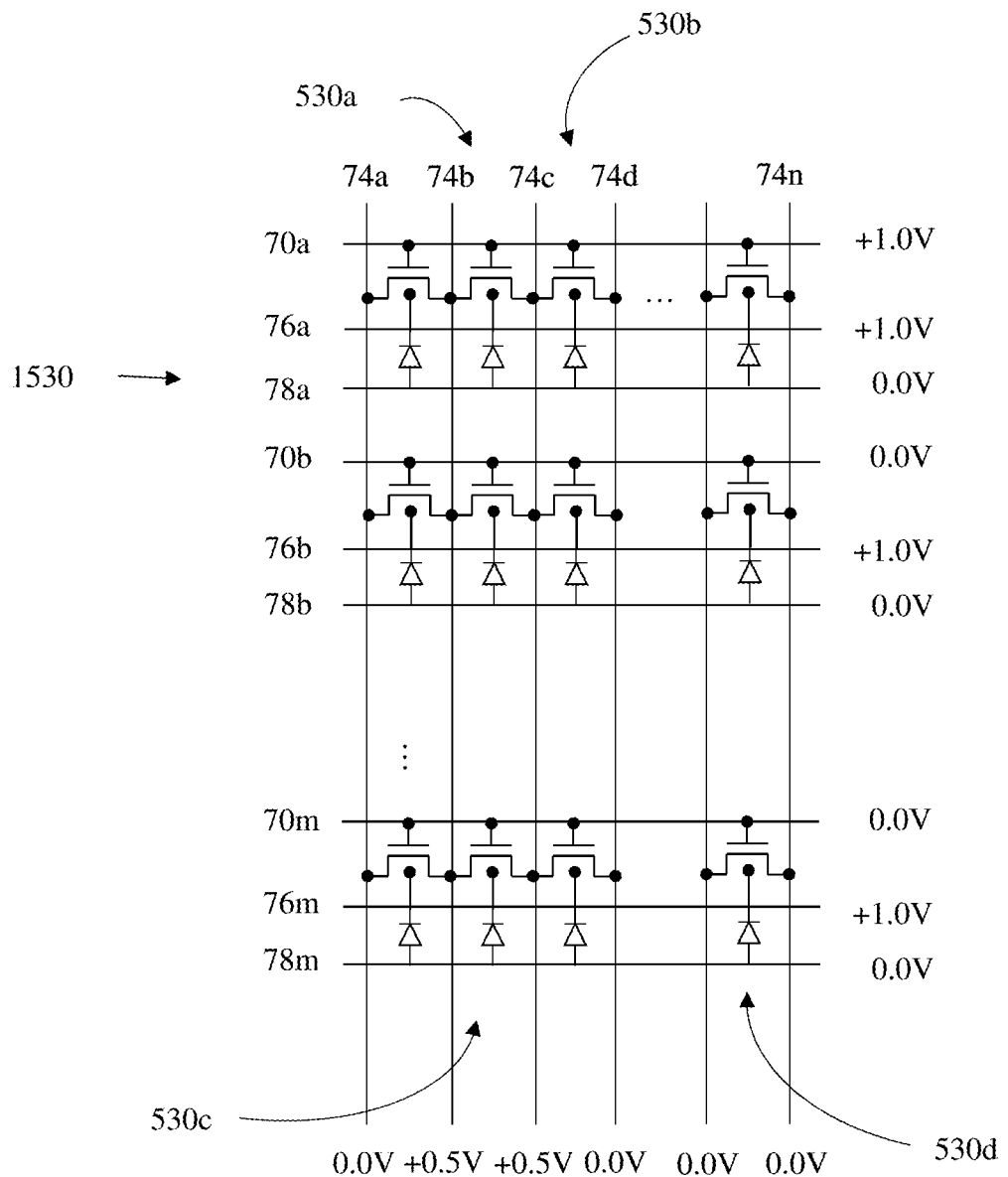
FIG. 31 schematically illustrates a write logic-1 operation performed on a memory array according to an embodiment of the present invention.

FIG. 31 illustrates an example of a write logic-1 operation performed on memory array 1530. The write logic-1 operation can be performed through capacitive coupling from the gate 60, source line region 16, and bit line region 18 to the floating body region 24. The operating region for the write logic-1 operation has been described for example in U.S. application Ser. No. 14/825,268, "Memory Device Comprising of an Electrically Floating Body Transistor" ("Han"), which is hereby incorporated herein, in its entirety, by reference thereto.

In the shared BL architecture of memory 1530 shown in FIG. 29, applying a pulse of positive voltage specified in Han to the selected BL terminal 74 will result in writing two adjacent memory cells. Therefore, as shown in FIG. 31, a pulse of lower positive voltage (for example Vdd/2, where Vdd is the operating voltage) is applied to both selected BL terminals 74b and 74c connected to the selected memory cell.

In one embodiment the bias conditions for the write logic-1 operation on memory cell 530 are: +1.0 volts is applied to selected WL terminal 70, 0 V is applied to unselected WL terminal 70, +0.5 volts is applied to the selected BL terminals 74 (BL terminals 74b and 74c connected to the selected cell 530a in FIG. 31), 0 volts is applied to unselected BL terminal 74, a positive voltage, for example, +1.0 volts is applied to BW terminal 76, and 0 volts is applied to the substrate terminal 78. In other embodiments, different voltages may be applied to the various terminals of memory cell 530 and the exemplary voltages described are not limiting.

Applying +0.5 volts to the selected BL terminals 74 will avoid writing to the adjacent memory cells 530 sharing the same BL terminal 74 (for example compared to applying +1.0 volts to both WL terminal 70 and BL terminals 74). The selected memory cell 530 will receive capacitive coupling from both source line region 16 and bit line region 18 connected to the selected BL terminals 74 (e.g. BL terminals 74b and 74c in FIG. 31).

Figure 32:
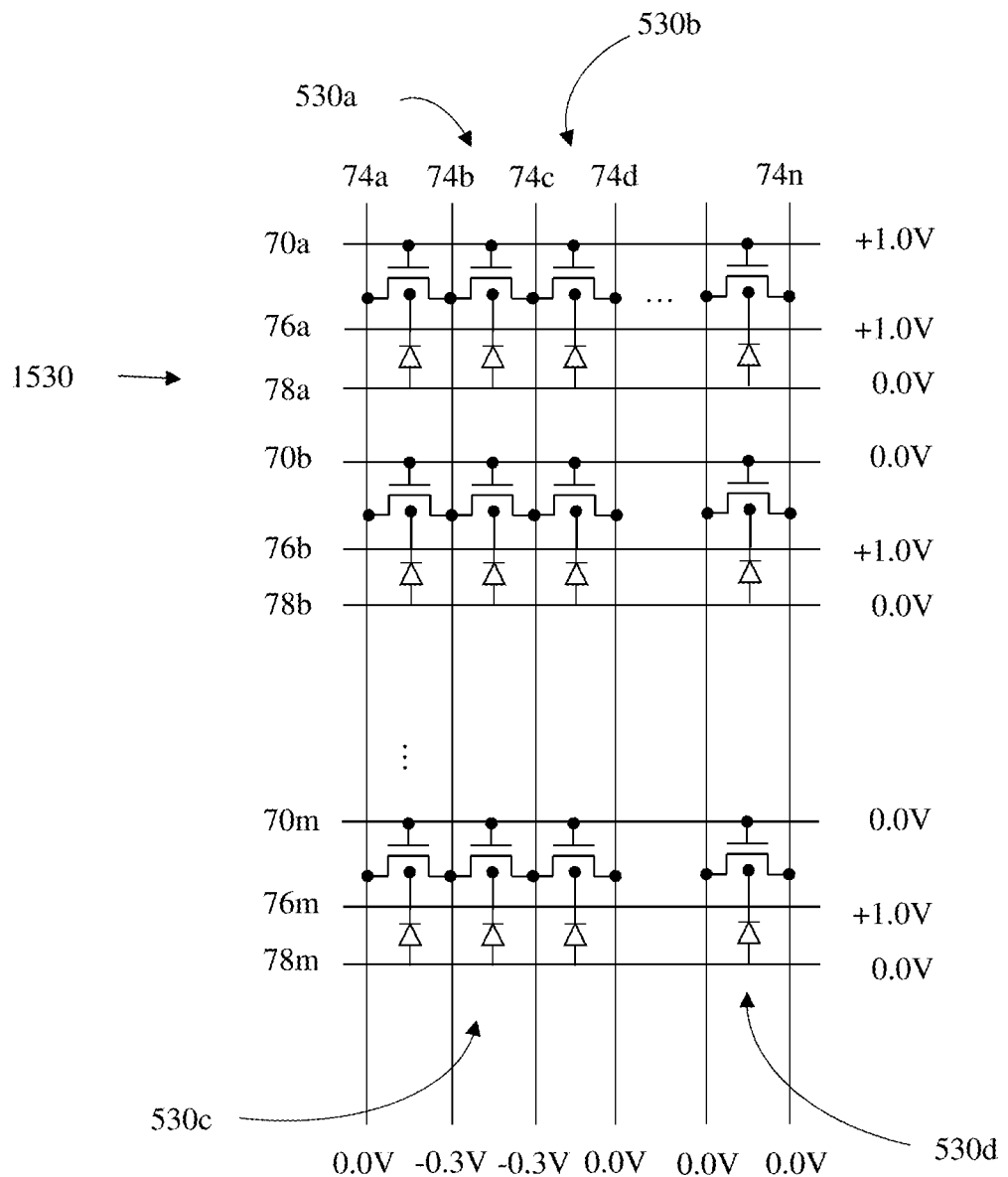
FIGS. 32 and 33 schematically illustrate write logic-0 operations performed on a memory array according to an embodiment of the present invention.

FIG. 32 illustrates an example of a write logic-0 operation performed on memory array 1530. The write logic-0 operation can be performed through forward biasing the p-n junction between floating body region 24 and source line region 16 and bit line region 18 and assisted by capacitive coupling from the gate 60 to the floating body region 24. The operating region for the write logic-0 operation has been described for example in U.S. application Ser. No. 14/825,268, "Memory Device Comprising of an Electrically Floating Body Transistor" ("Han"), which is hereby incorporated herein, in its entirety, by reference thereto.

In the shared BL architecture of memory 1530 shown in FIG. 29, applying a negative voltage specified in Han to the selected BL terminal 74 will result in writing two adjacent memory cells. Therefore, as shown in FIG. 32, a lower positive voltage (for example −Vdd/4, where Vdd is the operating voltage) is applied to both selected BL terminals 74 (BL terminals 74b and 74c in FIG. 32) connected to the selected memory cell 530a.

In one embodiment the bias conditions for the write logic-0 operation on memory cell 530 are: +1.0 volts is applied to selected WL terminal 70, 0 V is applied to unselected WL terminal 70, −0.3 volts is applied to the selected BL terminals 74 (BL terminals 74b and 74c connected to the selected cell 530a in FIG. 32), 0 volts is applied to unselected BL terminal 74, a positive voltage, for example, +1.0 volts is applied to BW terminal 76, and 0 volts is applied to the substrate terminal 78. In other embodiments, different voltages may be applied to the various terminals of memory cell 530 and the exemplary voltages described are not limiting.

Applying −0.3 volts to the selected BL terminals 74 will avoid writing logic-0 to the adjacent memory cells 530 sharing the same BL terminal 74 (for example compared to applying −0.5 volts to both BL terminals 74). The charge stored in selected memory cell 530 will be evacuated through forward-biasing both source line region 16 and bit line region 18 connected to the selected BL terminals 74 (e.g. BL terminals 74b and 74c in FIG. 32).

Figure 33:
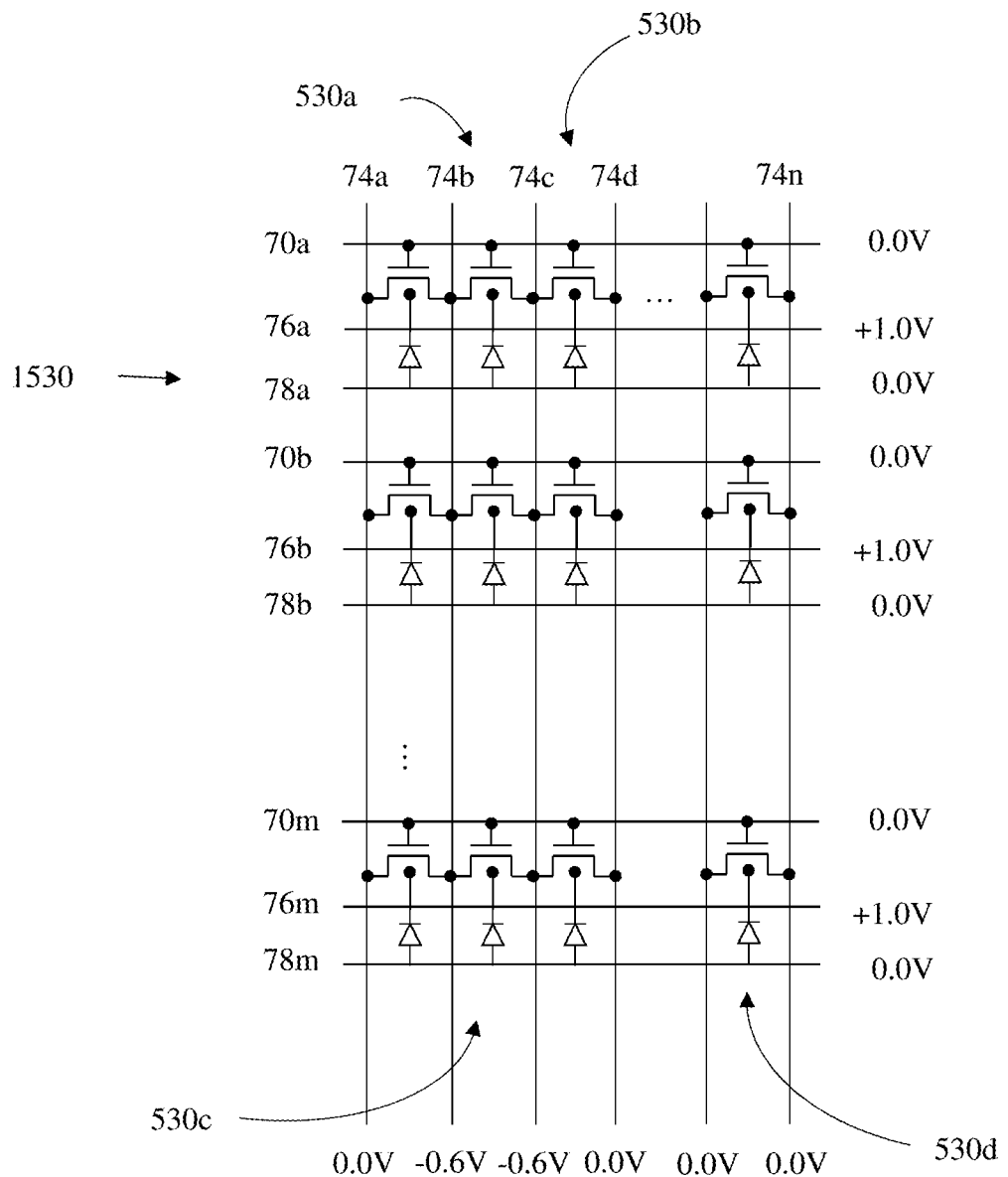
Figure 34:
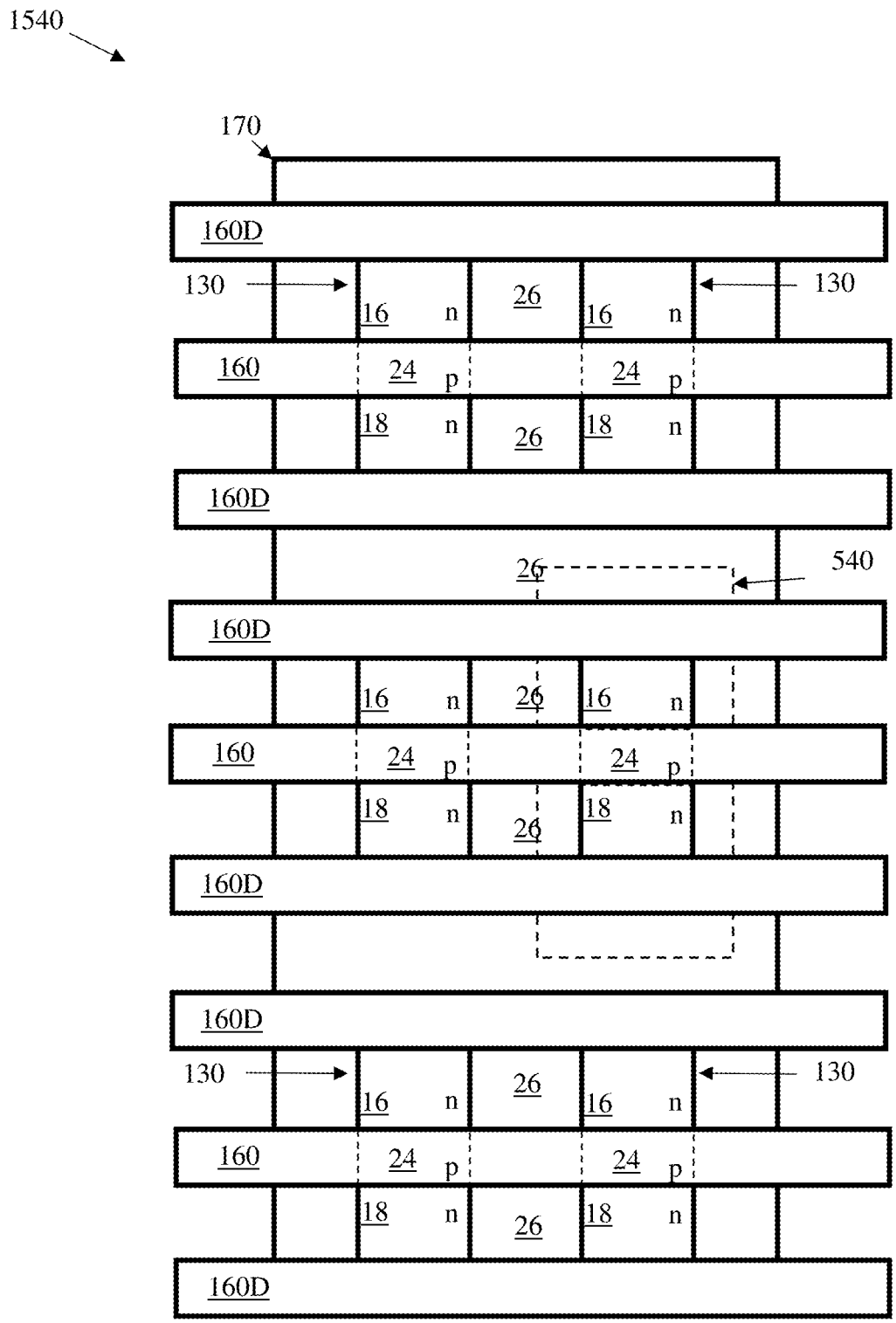
FIGS. 34-37 schematically illustrate layout views of a memory array according to another embodiment of the present invention.

FIG. 33 illustrates an example of a write logic-0 performed on memory array 1530 according to another embodiment of the present invention. The write logic-0 is performed by forward biasing the p-n junction between floating body region 24 and source line region 16 and bit line region 18, and will write logic-0 to all the memory cells in one column connected to both selected BL terminals 74 (the columns located between BL terminals 74b and 74c in FIG. 33).

In one embodiment the bias conditions for the write logic-0 operation on memory cell 530 are: 0 volts is applied to WL terminal 70, −0.6 volts is applied to the selected BL terminals 74, 0 volts is applied to unselected BL terminals 74, a positive voltage, for example, +1.0 volts is applied to BW terminal 76, and 0 volts is applied to the substrate terminal 78. In other embodiments, different voltages may be applied to the various terminals of memory cell 530 and the exemplary voltages described are not limiting.

If desired, write logic-0 can be performed on three columns simultaneously. For example, by applying −1.0 volts to BL terminals 74b and 74c, three columns of memory cells (the first 3 left columns in FIG. 33) will be simultaneously written to logic-0 state.

Figure 35:
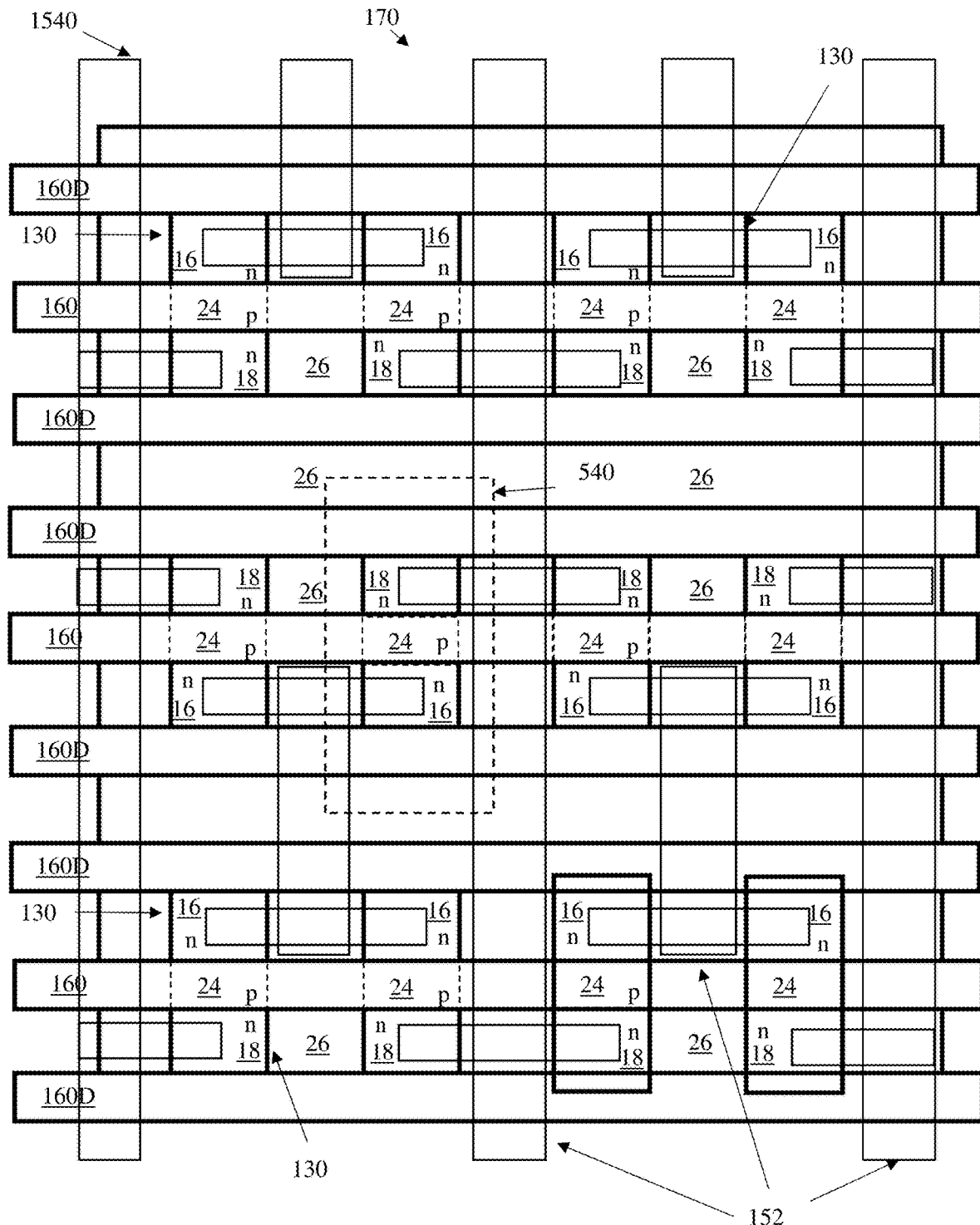
Figure 36:
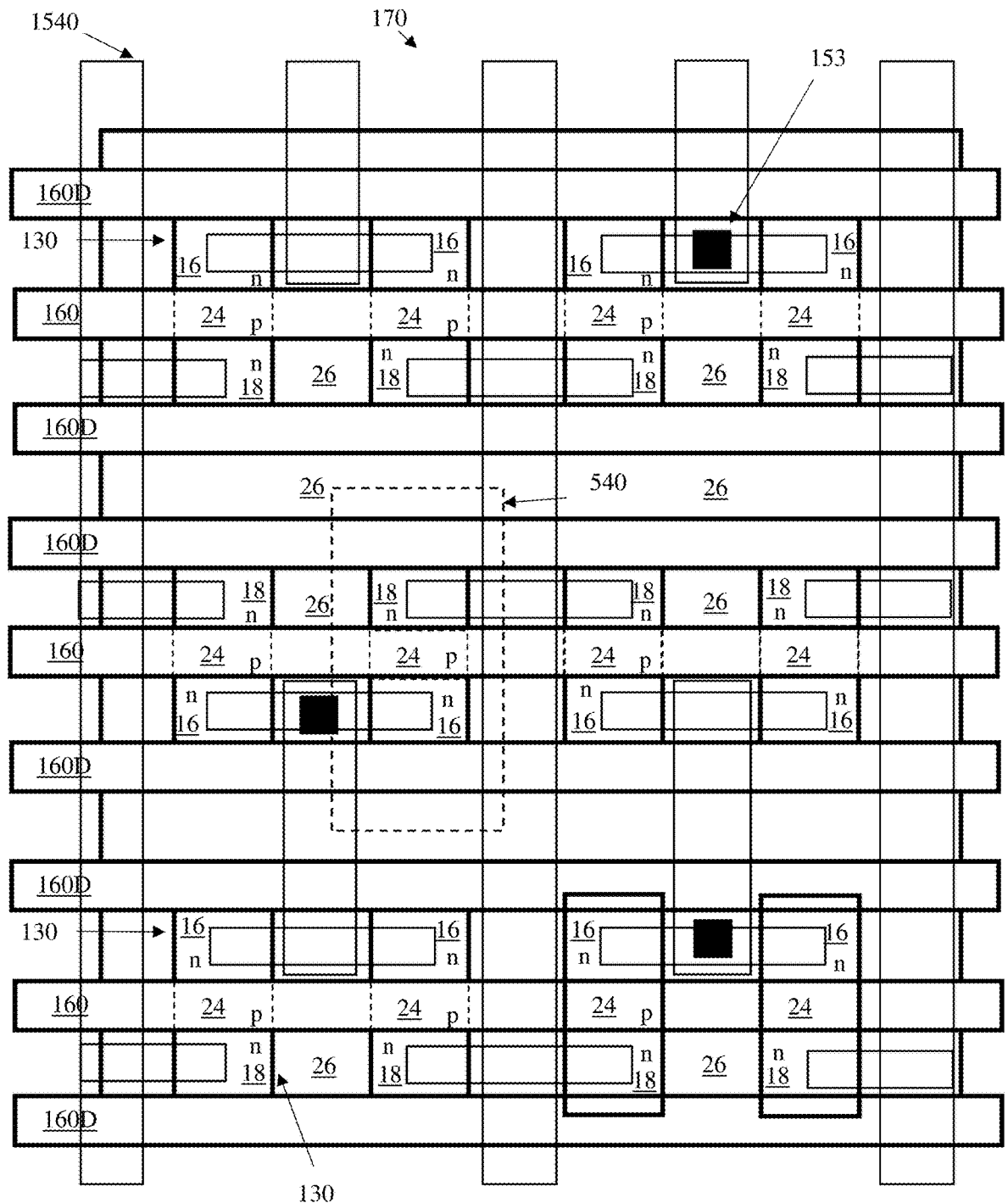
Figure 37:

FIGS. 34-37 illustrate a memory array 1540 of memory cells 540 according to another embodiment of the present invention. As shown in FIG. 35, the CONT layers connect two source line regions 16 and two bit line regions 18 of adjacent memory cells 540 in an alternating pattern. The source line regions 16 of two memory cells in adjacent rows are connected through conducting METAL layers 152, but all bit line regions 18 of an adjacent row are connected through conducting METAL layer 152. The source line regions are then connected to other conducting METAL layers 154 through a VIA layer 153 alternatingly as shown in FIGS. 36-37, resulting in a memory array architecture illustrated in FIG. 38. The memory array architecture 1540 results in a single memory cell 540 being selected through a combination of WL terminal 70 (connected to the gate region defined by POLY layer 160), BL terminal 74, and SL terminal 72.

Figure 39:
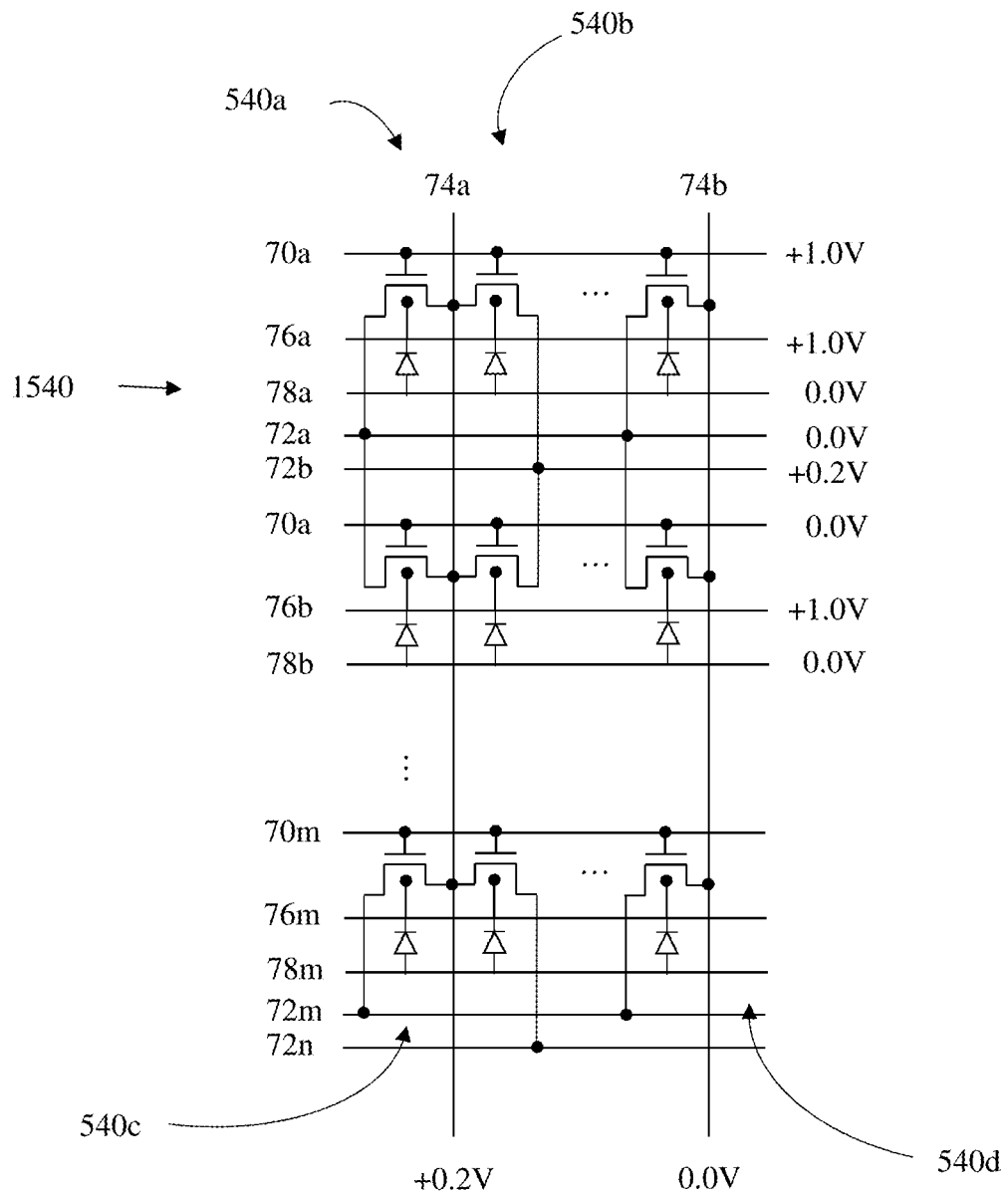
FIG. 39 schematically illustrates a read operation performed on a memory array illustrated in FIG. 38 according to an embodiment of the present invention.

FIG. 39 illustrates an example of a read operation performed on memory array 1540. A read operation is performed by applying a positive bias on the selected WL terminal 70, applying a positive bias to the selected BL terminal 74 (less positive than the positive bias applied to the selected WL terminal 70), zero voltage to the selected SL terminal 72, a positive bias applied to the BW terminal 76, and zero bias applied to the substrate terminal 78.

Figure 38:
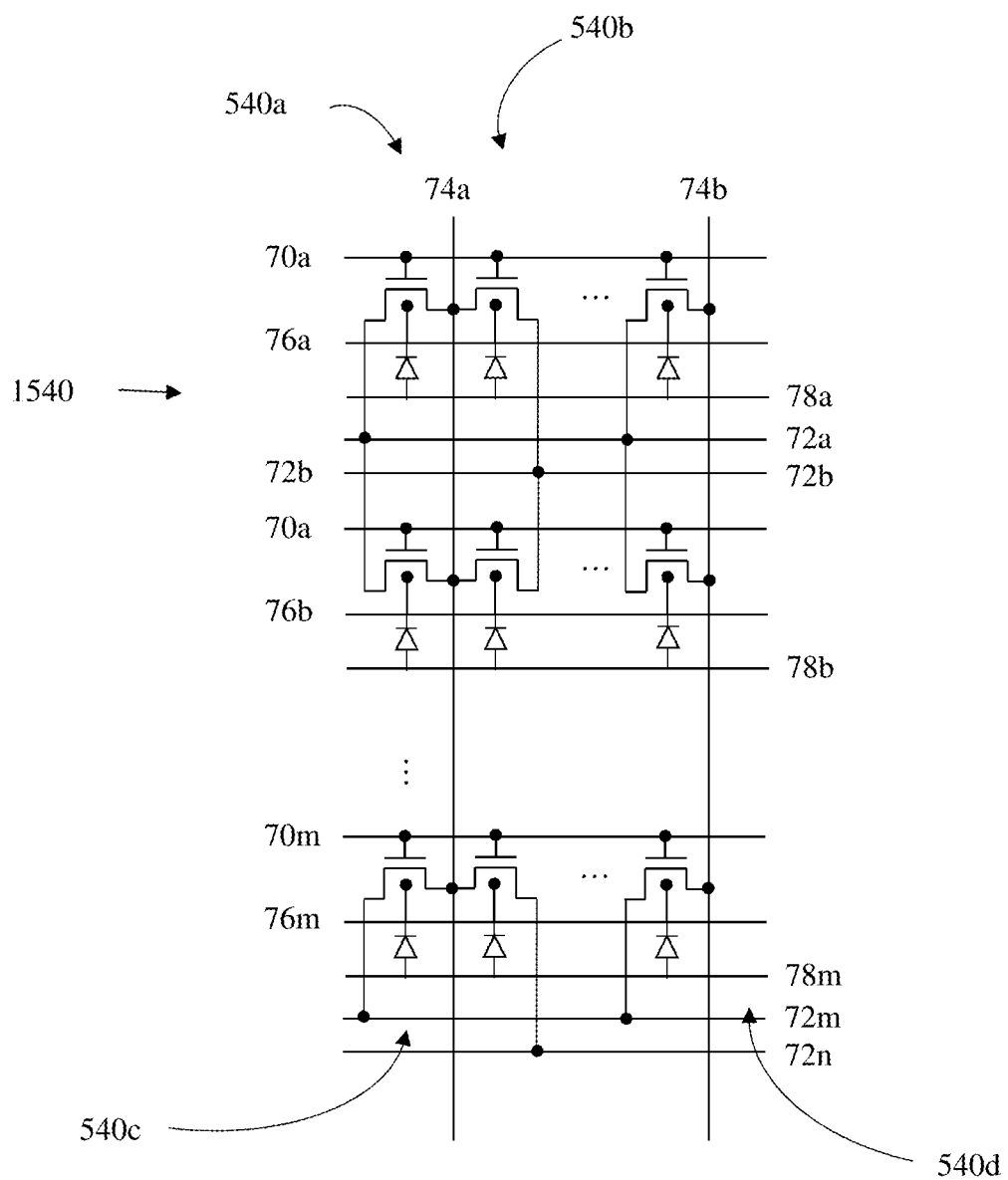
FIG. 38 schematically illustrates a memory array of memory cells according to another embodiment of the present invention.

In the shared BL architecture of memory 1540 shown in FIG. 38, applying a positive voltage to the selected BL terminal 74 will result in current flow through two adjacent memory cells 540 if both of the SL terminals 72 are grounded (or at a lower bias than the selected BL terminal 74). In order to ensure that the current only flows through the selected memory cell 540, the same positive bias as applied to the selected BL terminal could be applied to the unselected SL terminal 72 adjacent to the selected memory cell 540. In the exemplary read operation shown in FIG. 39, a positive bias is applied to the unselected SL terminal 72b. As a result, electrical current will only flow through the memory cell 540a.

Figure 40:
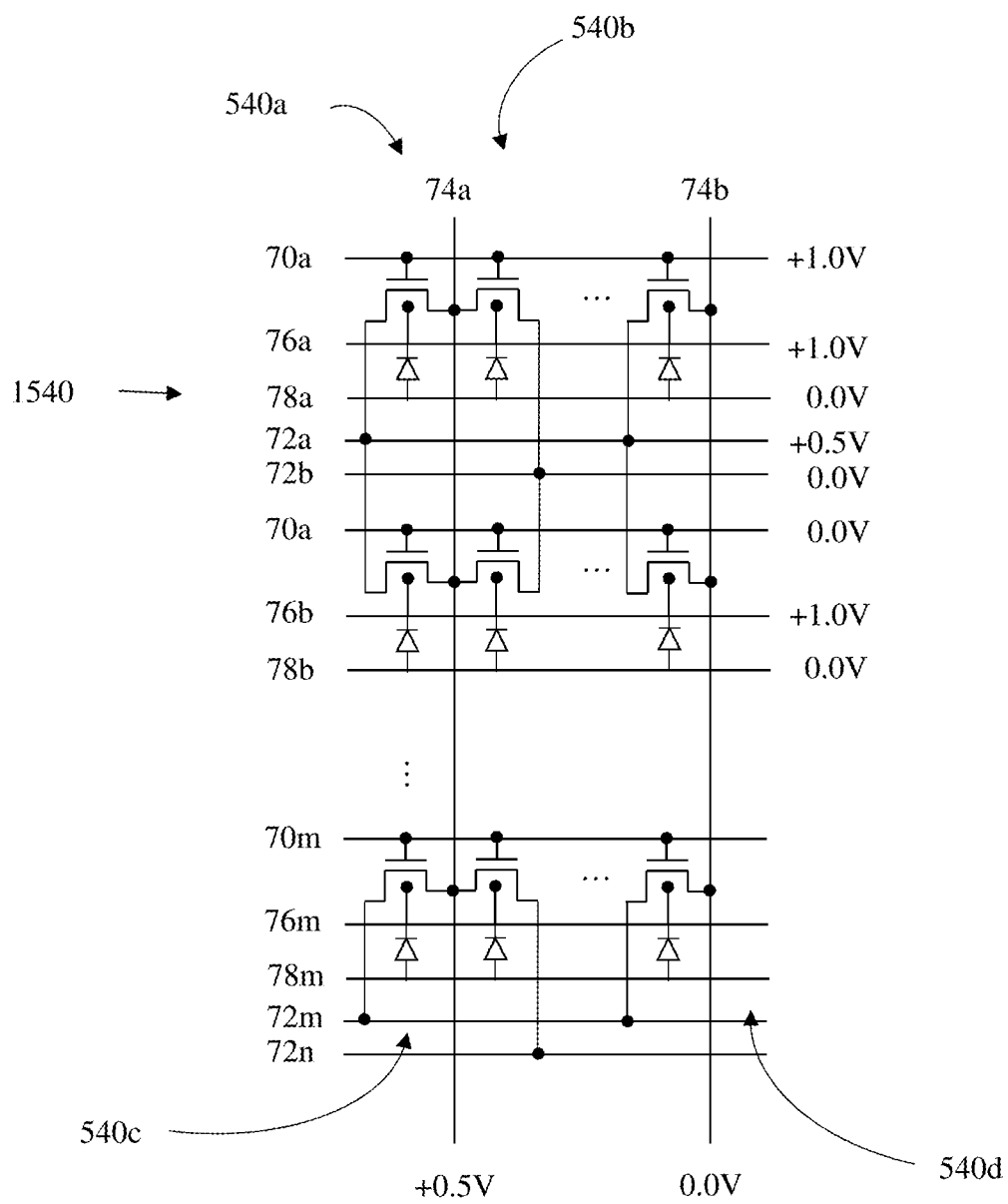
FIG. 40 schematically illustrates a write logic-1 operation performed on a memory array illustrated in FIG. 38 according to an embodiment of the present invention.

FIG. 40 illustrates an example of a write logic-1 operation performed on memory array 1540. The write logic-1 operation can be performed through capacitive coupling from the gate 60, source line region 16, and bit line region 18 to the floating body region 24. In the shared BL architecture of memory 1540 shown in FIG. 38, applying a positive voltage pulse specified in Han to the selected BL terminal 74 will result in writing two adjacent memory cells. Therefore, as shown in FIG. 40, a lower positive voltage (for example Vdd/2, where Vdd is the operating voltage) is applied to both selected BL terminal 74 and selected SL terminal 72 connected to the selected memory cell.

In one embodiment the bias conditions for the write logic-1 operation on memory cell 540 are: +1.0 volts is applied to selected WL terminal 70, 0 volt is applied to unselected WL terminal 70, +0.5 volts is applied to the selected BL terminal 74, +0.5 volts is applied to the selected SL terminal 72, a positive voltage, for example, +1.0 volts is applied to BW terminal 76, and 0 volts is applied to the substrate terminal 78. In other embodiments, different voltages may be applied to the various terminals of memory cell 540 and the exemplary voltages described are not limiting.

Applying +0.5 volts to the selected BL terminals 74 will avoid writing to the adjacent memory cells 540 sharing the same BL terminal 74 (for example compared to applying +1.0 volts to both WL terminal 70 and BL terminals 74). The selected memory cell 540 will receive capacitive coupling from both source line region 16 and bit line region 18 connected to the selected BL terminals 74 (e.g. BL terminal 74a and SL terminal 72a in FIG. 40).

Figure 41:
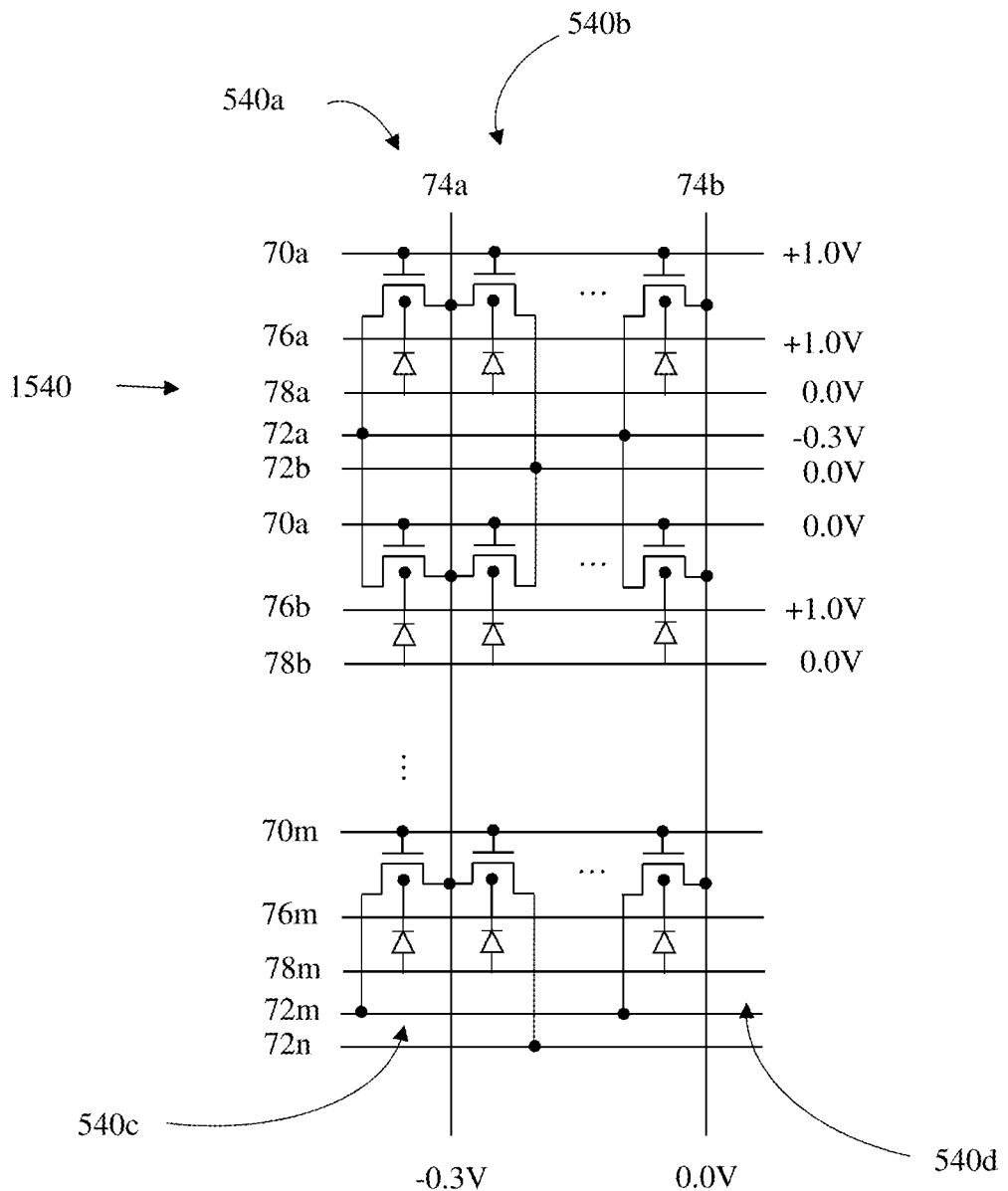
FIGS. 41-42 schematically illustrate write logic-0 operations performed on a memory array illustrated in FIG. 38 according to an embodiment of the present invention.

FIG. 41 illustrates an example of a write logic-0 operation performed on memory array 1540. The write logic-0 operation can be performed through forward biasing the p-n junction between floating body region 24 and source line region 16 and bit line region 18 and assisted by capacitive coupling from the gate 60 to the floating body region 24. In the shared BL architecture of memory 1540 shown in FIG. 38, applying a negative voltage specified in Han to the selected BL terminal 74 will result in writing two adjacent memory cells. Therefore, as shown in FIG. 41, a lower negative voltage (for example −Vdd/4, where Vdd is the operating voltage) is applied to both selected BL terminal 74 and SL terminal 72 connected to the selected memory cell.

In one embodiment the bias conditions for the write logic-0 operation on memory cell 540 are: +1.0 volts is applied to selected WL terminal 70, 0 volts is applied to unselected WL terminal 70, −0.3 volts is applied to the selected BL terminal 74, −0.3 volts is applied to selected SL terminal 74, a positive voltage, for example, +1.0 volts is applied to BW terminal 76, and 0 volts is applied to the substrate terminal 78. In other embodiments, different voltages may be applied to the various terminals of memory cell 540 and the exemplary voltages described are not limiting.

Applying −0.3 volts to the selected BL terminal 74 and selected SL terminal 72 will avoid writing to the adjacent memory cells 540 sharing the same BL terminal 74 (for example compared to applying −0.5 volts to the selected BL terminal 74). The charge stored in selected memory cell 540 will be evacuated through forward-biasing both source line region 16 and bit line region 18 connected to the selected BL terminal 74 and SL terminal 72 (e.g. BL terminal 74a and SL terminal 72a in FIG. 41).

Figure 42:
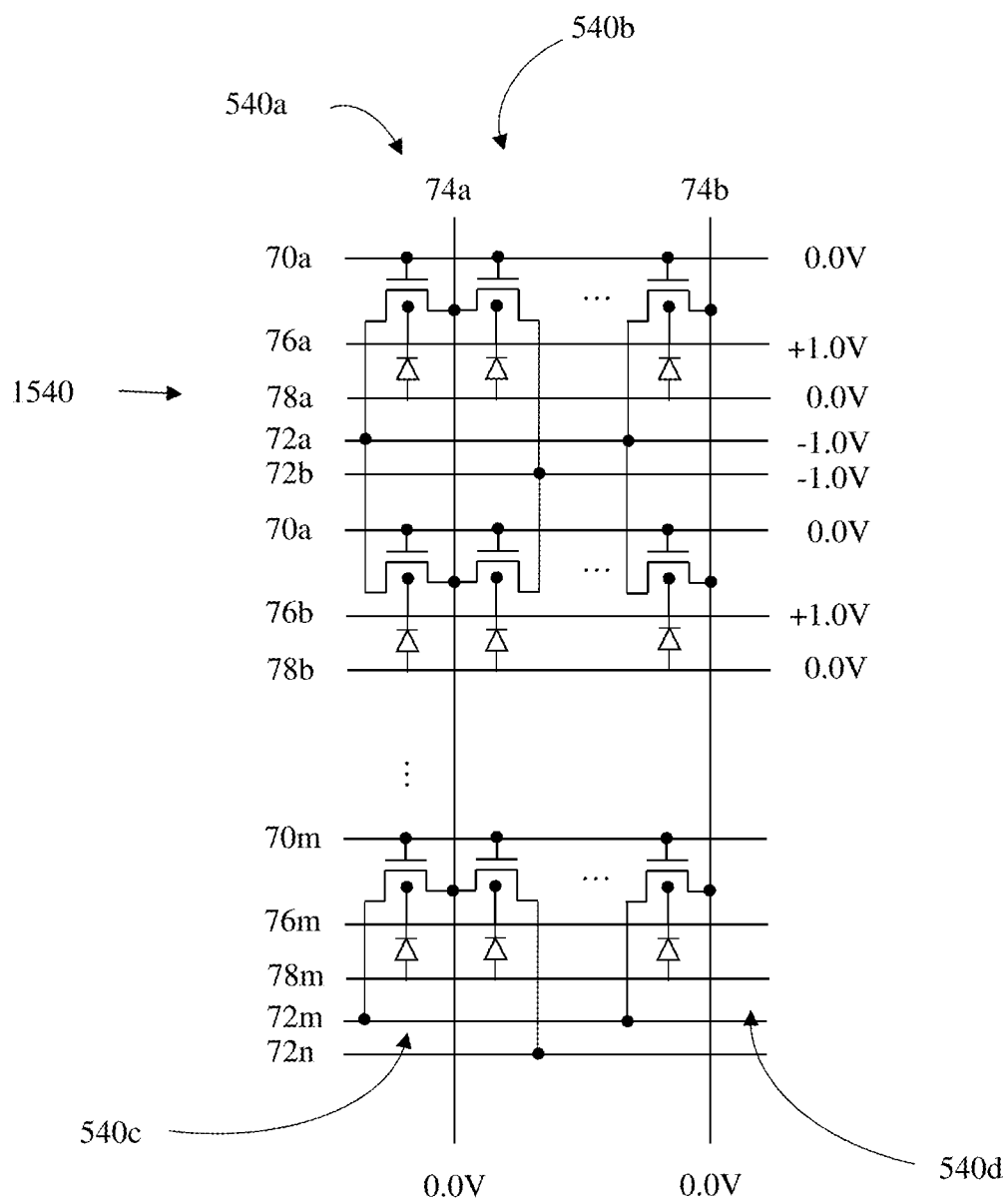

FIG. 42 illustrates an example of a write logic-0 operation performed on memory array 1540 according to another embodiment of the present invention. The write logic-0 is performed by forward biasing the p-n junction between floating body region 24 and source line region 16, and will write logic-0 to all the memory cells connected to the selected SL terminal 72.

In one embodiment the bias conditions for the write logic-0 operation on memory cell 540 are: 0 volts is applied to WL terminal 70, −1.0 volts is applied to the selected SL terminal 72, 0 volts is applied to all BL terminals 74, a positive voltage, for example, +1.0 volts is applied to BW terminal 76, and 0 volts is applied to the substrate terminal 78. In other embodiments, different voltages may be applied to the various terminals of memory cell 540 and the exemplary voltages described are not limiting.

If desired, write logic-0 can be performed on two rows simultaneously. For example, by applying −1.0 volts to SL terminals 72a and 72b as shown in FIG. 42, resulting in two rows of memory cells being simultaneously written to logic-0 state.

FIGS. 43A-46 illustrate a memory array 1550, comprising memory cells 550 according to an embodiment of the present invention. Memory cell 550 comprises memory device 550M and access device 550A, which are connected in series, and has been described for example in U.S. application Ser. No. 14/380,779, "Memory Cell Comprising First and Second Transistors and Methods of Operating" ("Widjaja-4"), which is hereby incorporated herein, in its entirety, by reference thereto. The memory devices 550M are transistors found inside the buried layer 170 while the access devices 550A are transistors located outside of the buried layer 170.

Figure 43A:
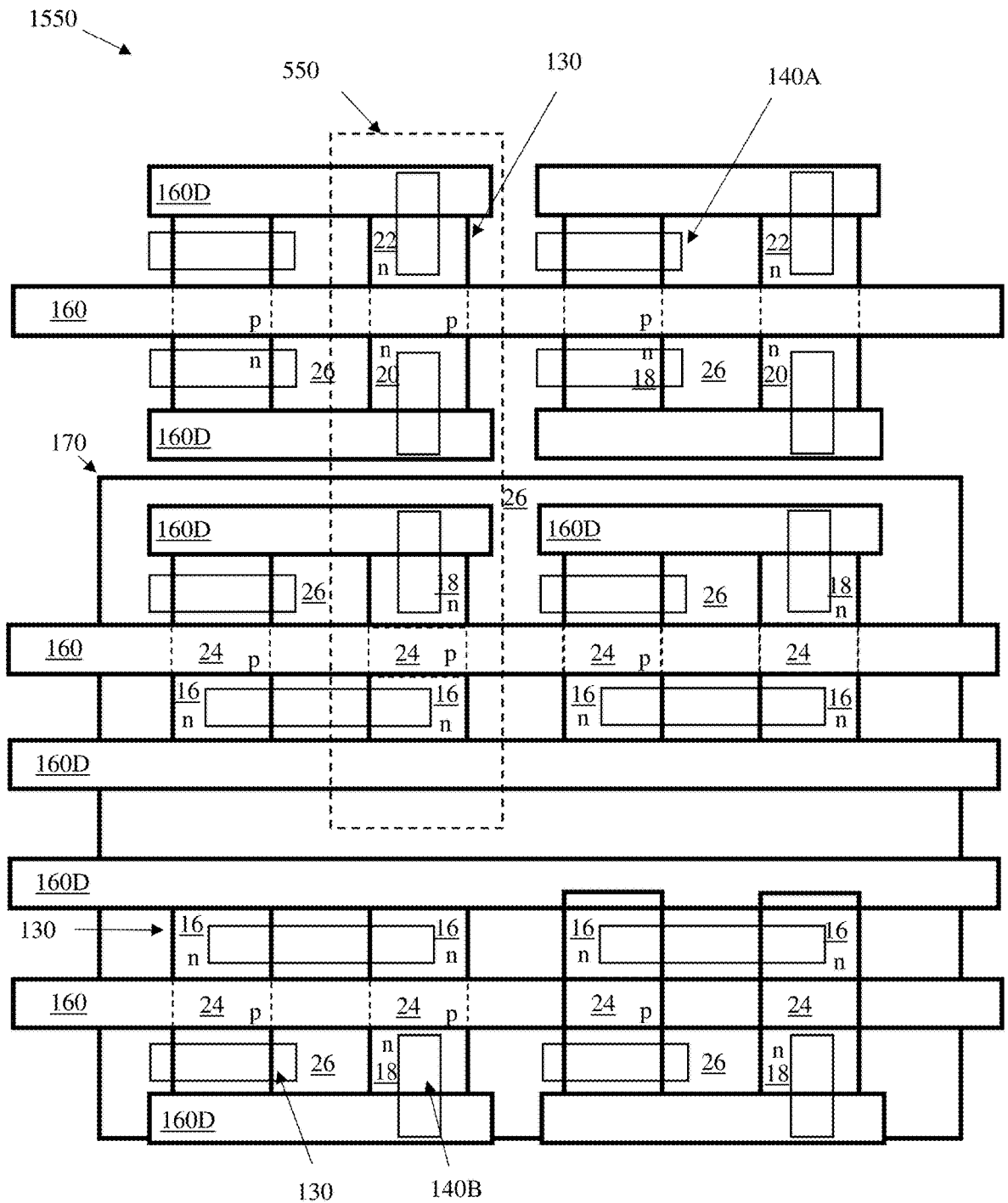
FIGS. 43A-48 schematically illustrate a memory array of memory cells having a memory transistor and an access transistor according to another embodiment of the present invention.
Figure 43B:
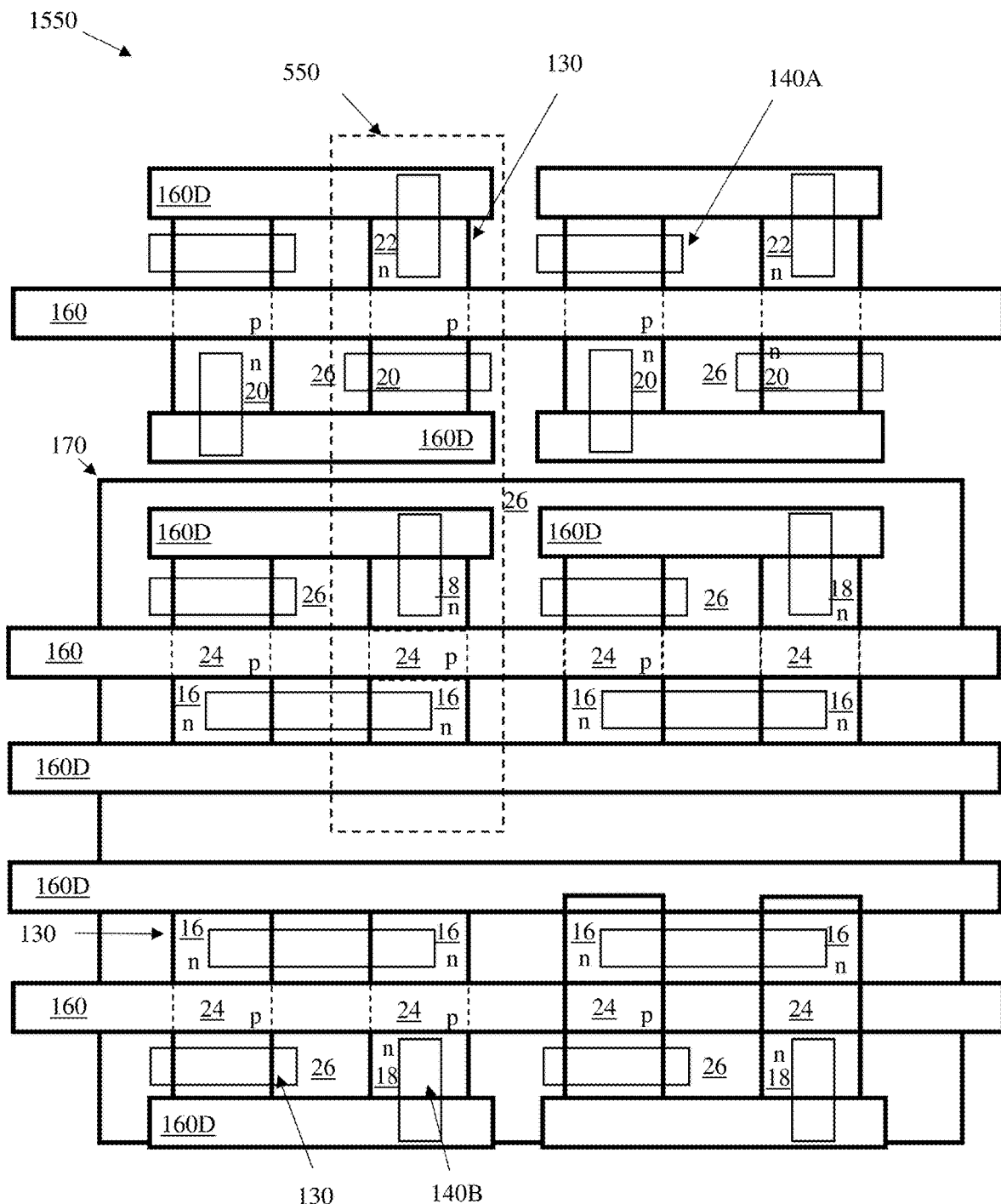
Figure 44:
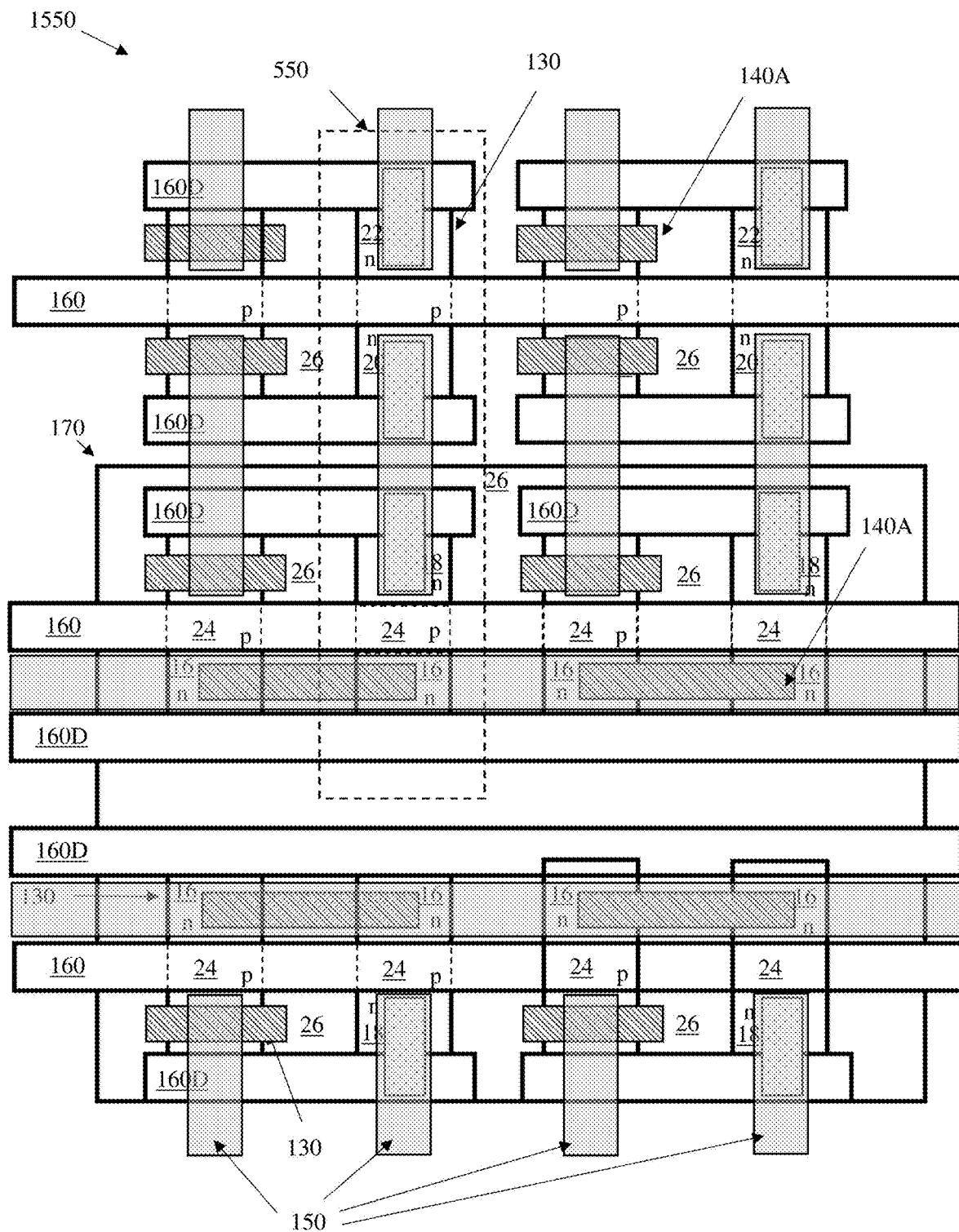

As illustrated in FIG. 43A, CONT-A 140A layer can be used to form a connection to the DIFF region 130 to the conductive element, for example METAL1 layers 150 shown in FIG. 44, and CONT-B 140B can be used to form a connection between DIFF region 130 and the dummy POLY layer 160D. The dummy POLY layers 160D are cut into shorter lines (for example, compared to the dummy POLY layers 160D shown in FIG. 34) to prevent electrical shorts between adjacent memory cells 550 connected through CONT-B 140B layers. The dummy POLY 160D layers could be cut using a POLYCUT layer, for example, to etch a continuous dummy POLY 160D layer. The CONT-A 140A and CONT-B 140B layers may also be placed alternatingly such as illustrated for example in FIG. 43B.

Figure 45:
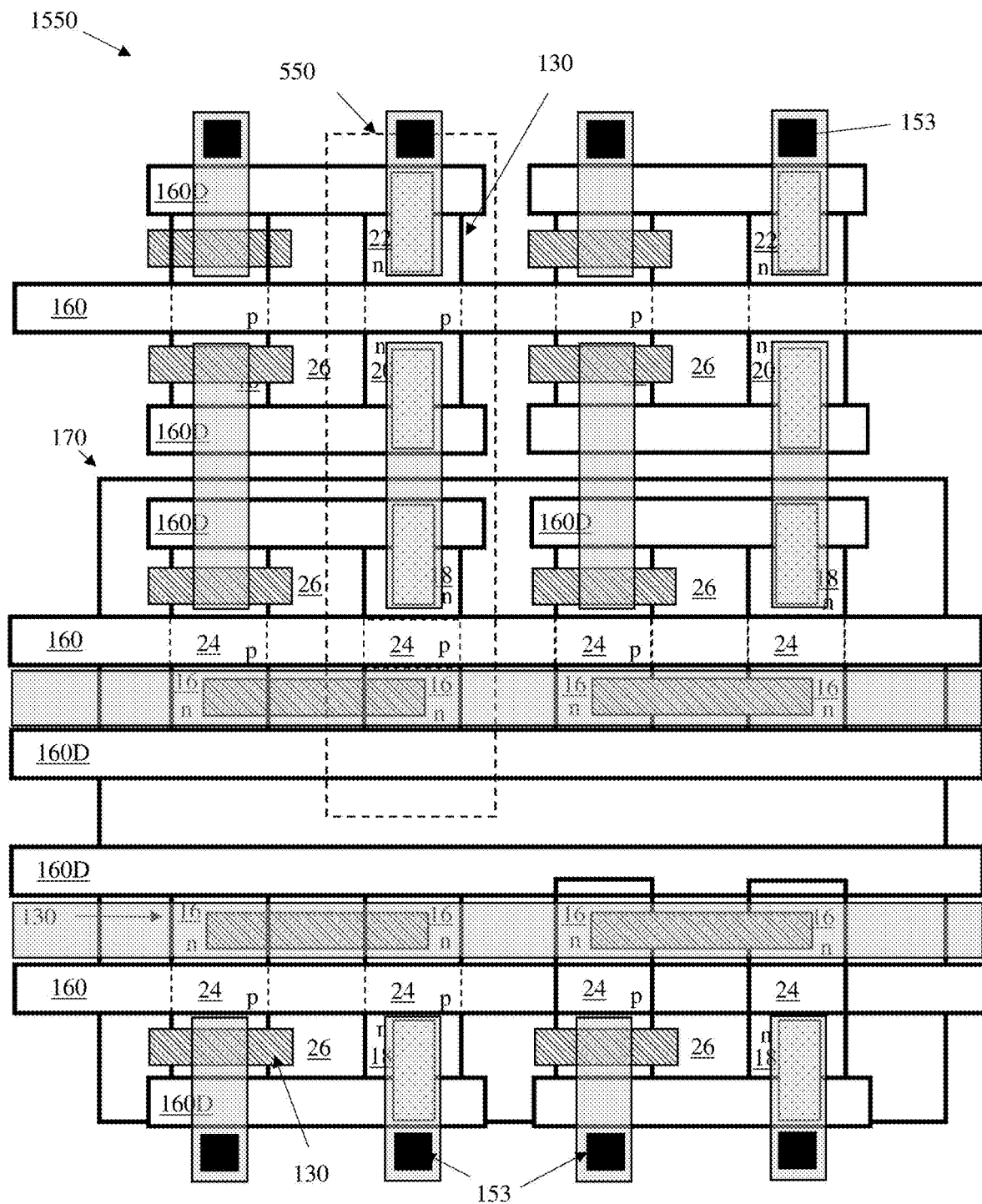
Figure 46:
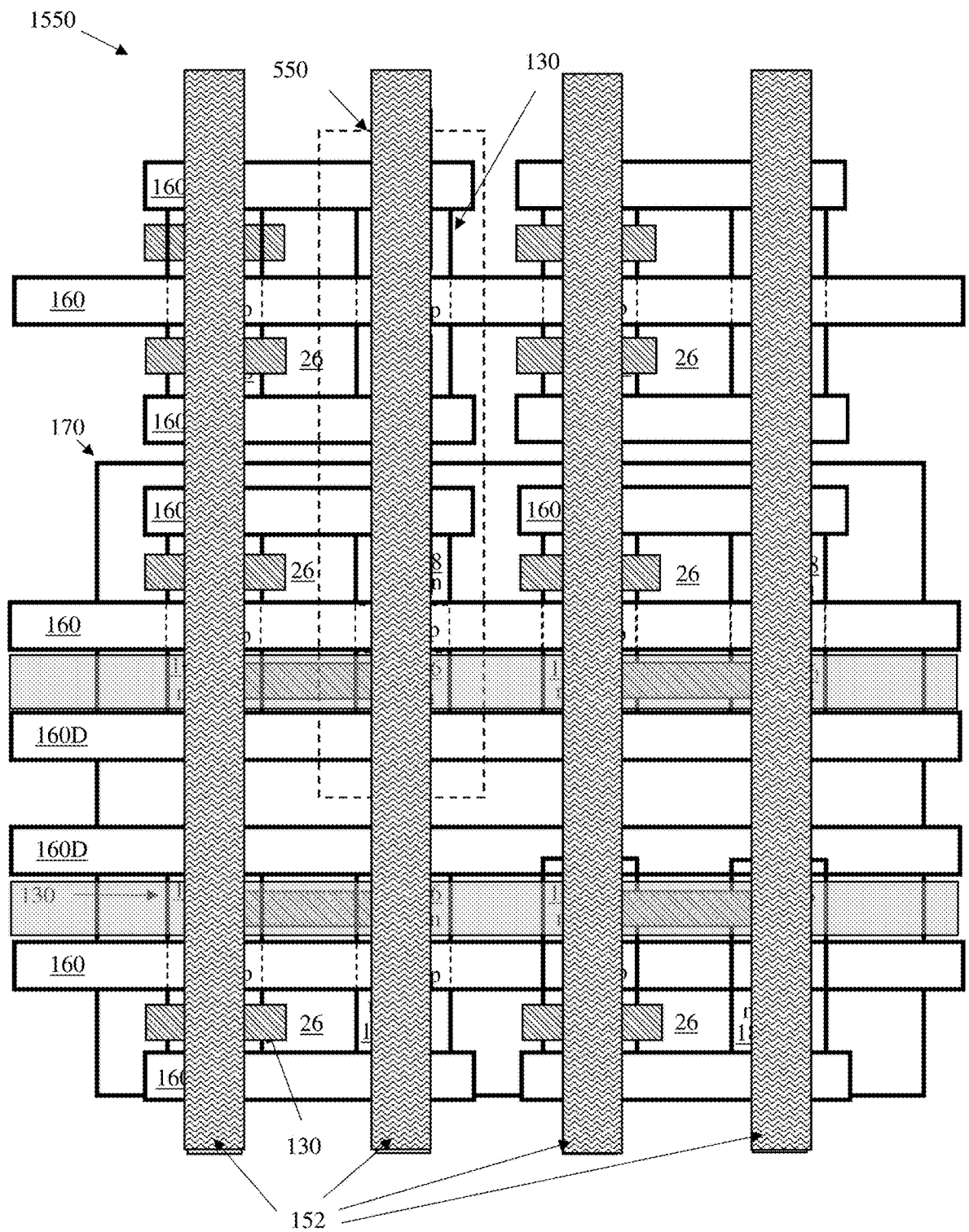

FIG. 44 illustrates the conductive METAL1 layers, for example metal layers, 150 which connect the different regions of the memory cells 50 through the CONT layers. In the example illustrated in FIG. 44, a METAL1 layer 150 connects source line regions 16 of adjacent memory cells 550 through CONT-A layers 140A (which may then be connected to a SL terminal 72). The METAL1 layer 150 also connects the drain region 18 of the memory cell 550M to the source region 20 of the access device 550A. The bit line region 22 of the access device 550A can then be connected to another conductive layer (for example METAL2 layer 152) through a VIA layer 153 as shown in FIGS. 45-46.

The exemplary memory cell 550 illustrated in FIGS. 43A-46 comprises two transistors (550M and 550A) having the same conductivity type, for example two n-channel transistors connected in series, where the memory transistor 550M is located within a buried well region 170 layer.

Figure 47A:
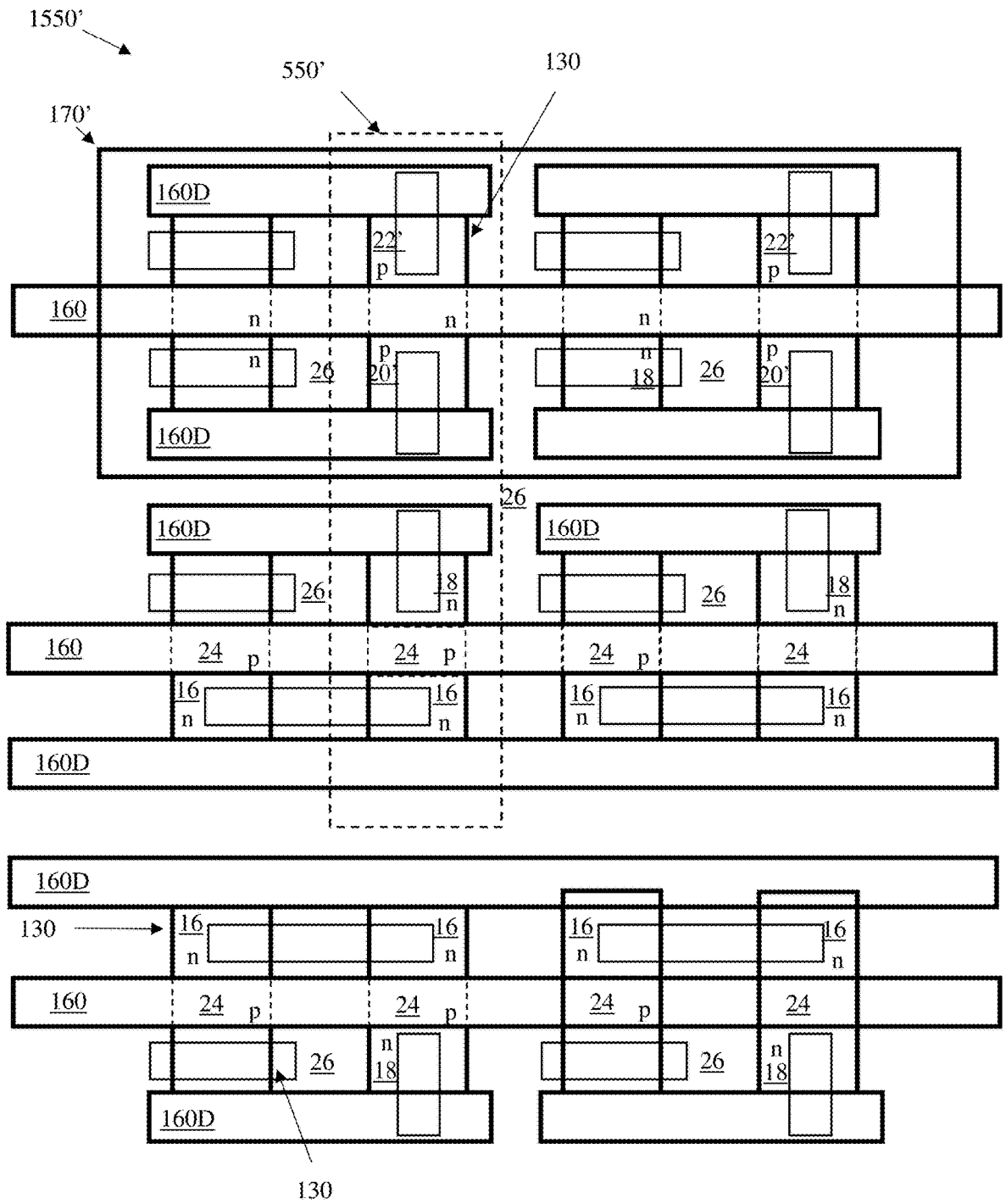
Figure 47B:
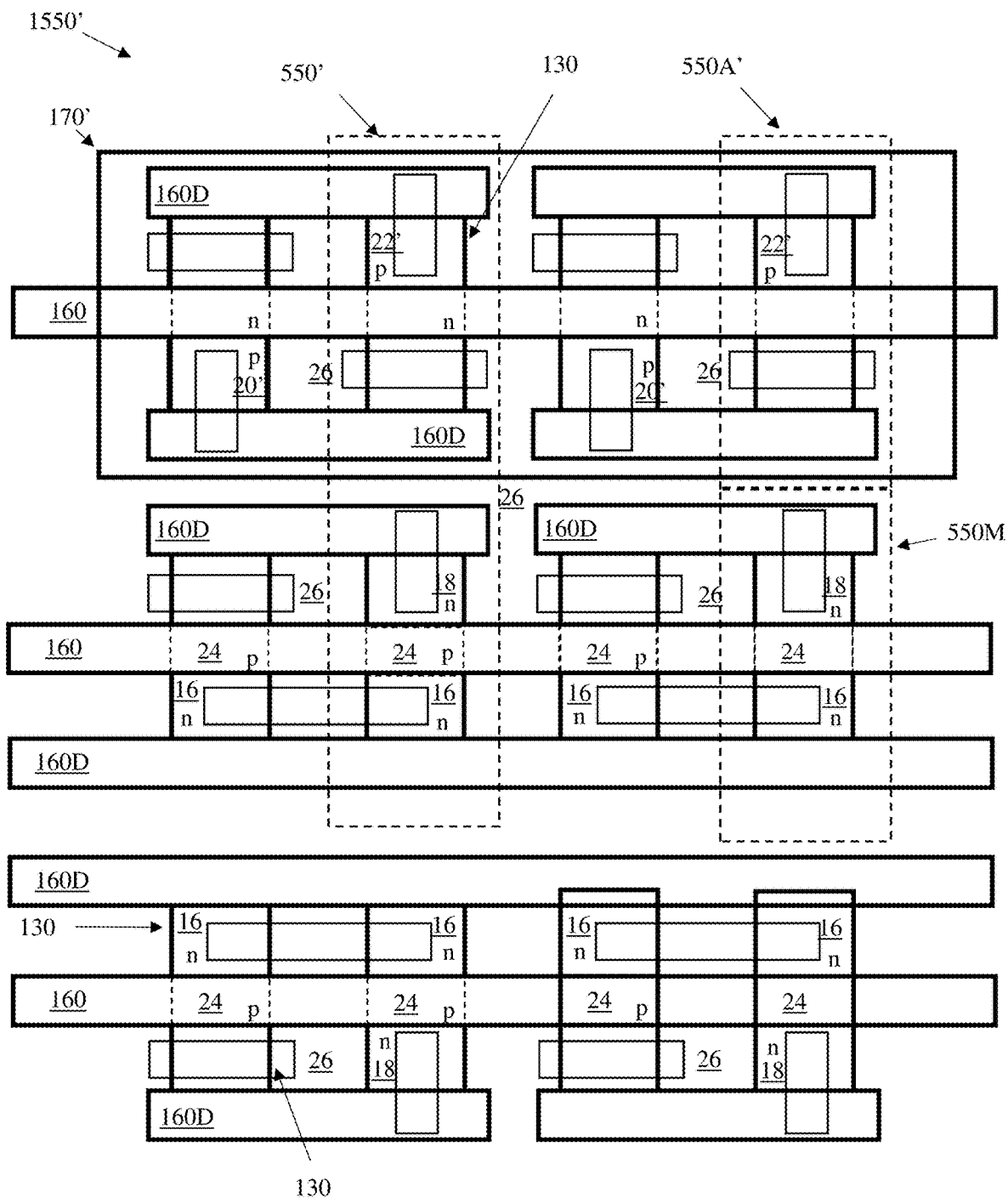

FIG. 47A illustrates a memory array 1550' according to another embodiment of the present invention, where the memory transistor 550M and the access transistor 550A' of memory cell 550' are comprised of transistors having different conductivity type. The access transistor 550A' may be p-channel transistor whereas the memory transistor 550M may be n-channel transistor. The access transistor 550A' is located within a well region 170' having a different type of the well region than that of the memory transistor 550M. The bit line metal and source line metal are subsequently formed according to the same manner explained in FIGS. 44-46. The CONT-A 140A and CONT-B 140B layers may also be drawn alternatingly such as illustrated for example in FIG. 47B.

Figure 48:
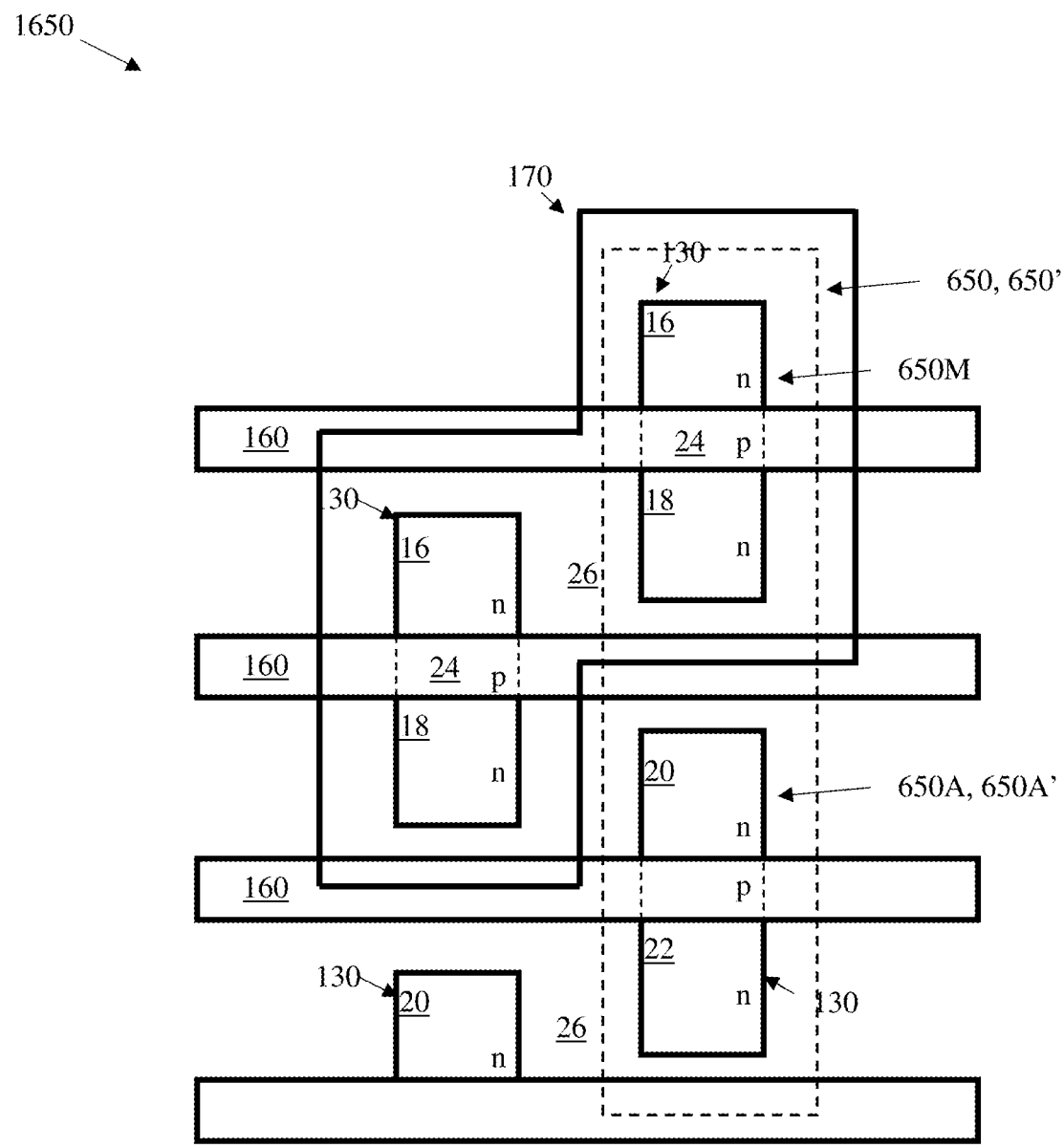

FIG. 48 illustrates a memory array 1650 according to another embodiment of the present invention, where memory cell 650 comprises a memory transistor 650M and an access transistor 650A. As illustrated in FIG. 48, the DIFF layers 130 are arranged in a staggered or zig-zag pattern. The memory transistor 650M is located within a buried well region, which is defined by the buried well layer 170. The buried well region may also be formed through a self-aligned process, during the formation step of the active region and insulator region 26. The memory array 1650 may also be formed by memory cell 650' having transistors of different conductivity type.

Figure 49:
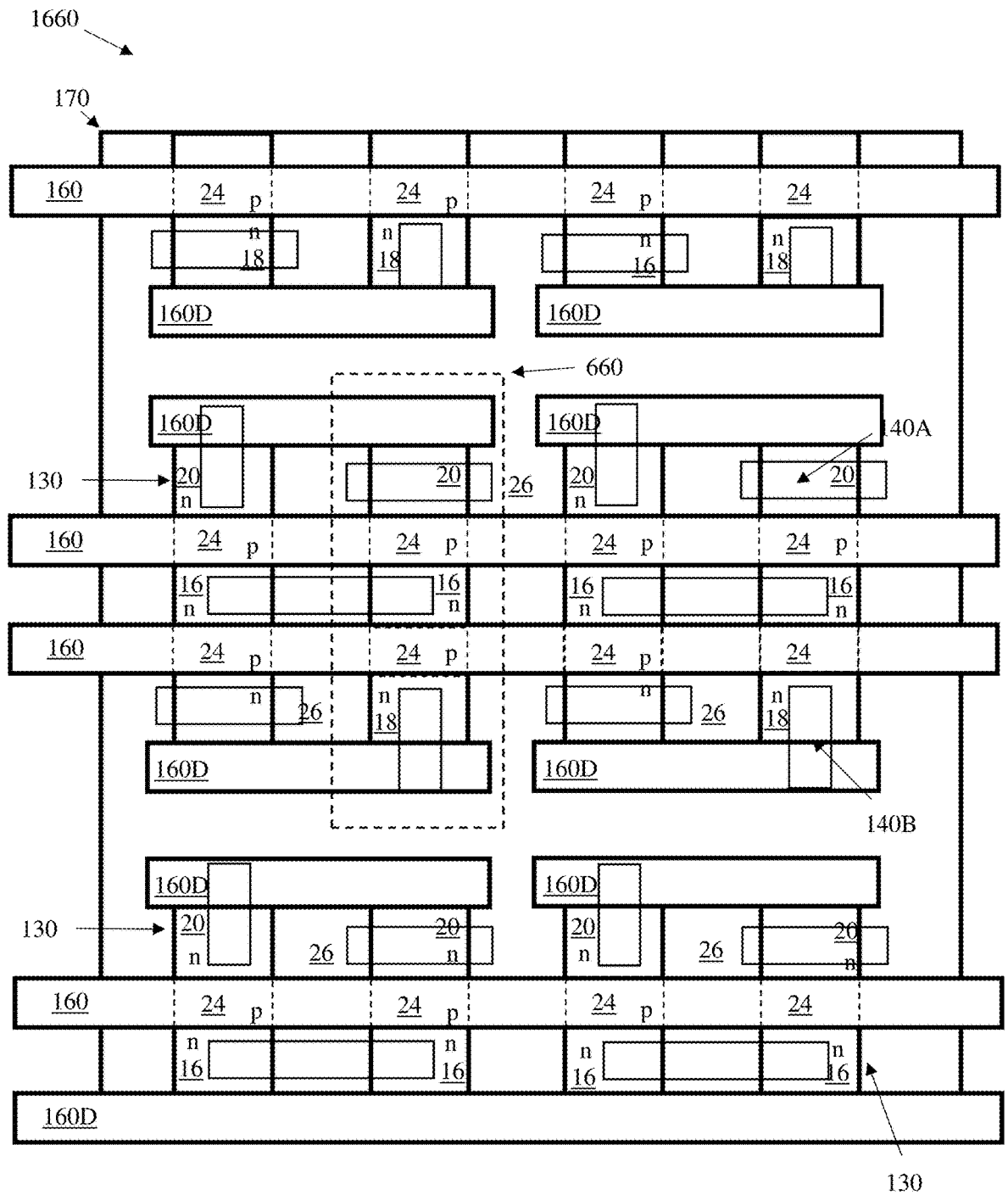
FIG. 49 schematically illustrates a memory array of dual-port memory cells according to another embodiment of the present invention.

FIG. 49 illustrates a memory array 1660 according another embodiment of the present invention, comprising multi-port memory cells 660, which have been described for example in U.S. Pat. No. 8,582,359, "Dual-Port Semiconductor Memory and FIFO Memory Having Electrically Floating Body Transistor" ("Widjaja-5"), which is hereby incorporated herein, in its entirety, by reference thereto. CONT-A 140A layer can be used to form connection to the DIFF region 130 to a conductive element, for example METAL layers, and CONT-B 140B can be used to form a connection between DIFF region 130 and the dummy POLY layer 160D. The dummy POLY layers 160D are cut into shorter lines (for example, compared to the dummy POLY layers 160D shown in FIG. 34) to prevent electrical shorts between adjacent memory cells 660 connected through CONT-B 140B layers. The dummy POLY 160D layers could be cut using a POLYCUT layer, for example, to etch a continuous dummy POLY 160D layer.

The memory cell 660 illustrated in FIG. 49 is a dual-port memory cell where region 20, source line region 16 and the gate region in between (formed by the POLY 160 layer) form the first port, where region 18, source line region 16 and the gate region in between (formed by the POLY 160 layer) form the second port. The dual-port memory cell 660 can be extended into multi-port memory cells as described in Widjaja-5.

Figure 50A:
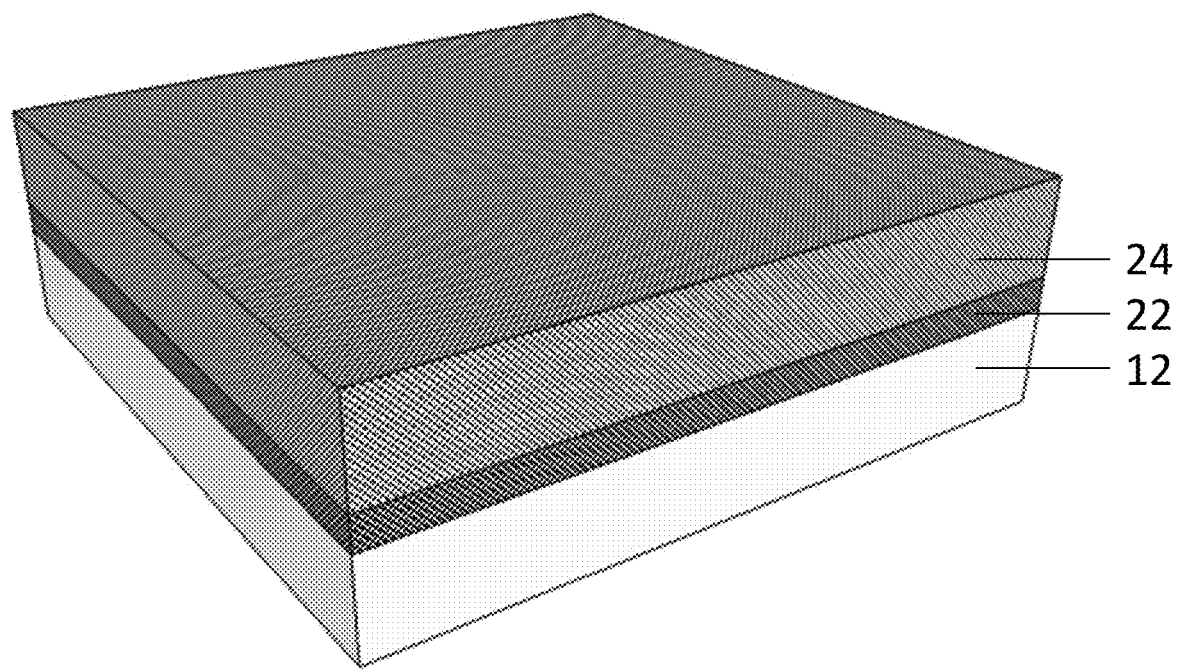
FIGS. 50A-50B schematically illustrate a memory array after formation of a buried well and subsequent normal well, respectively, according to an embodiment of the present invention.
Figure 50B:
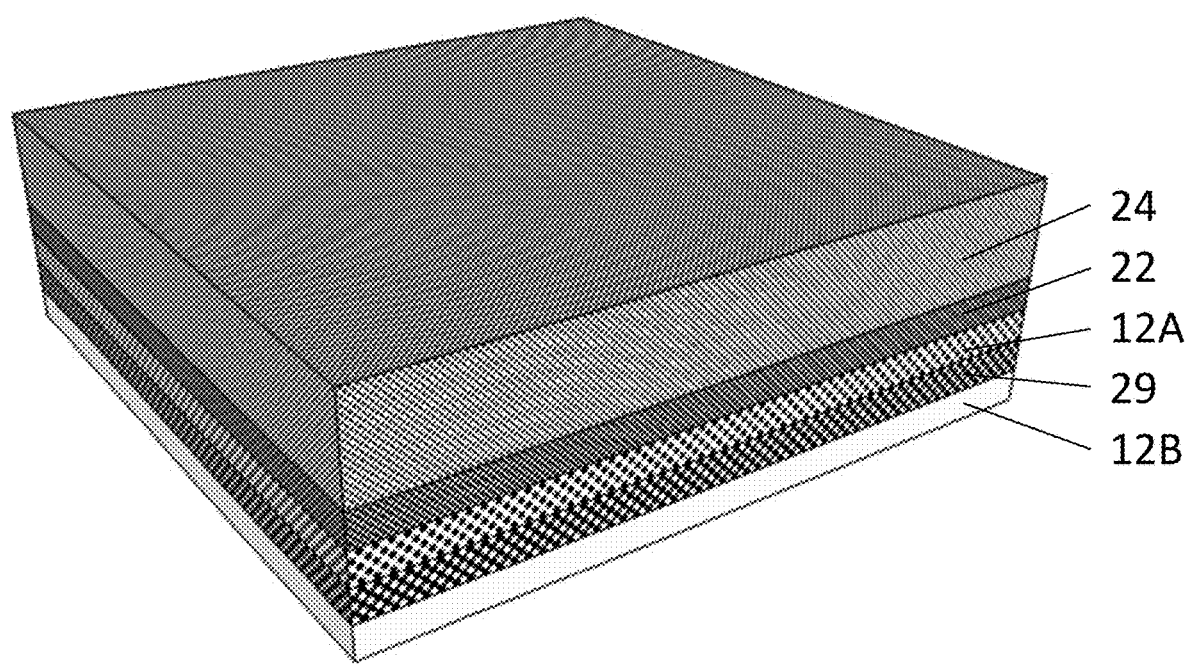

Referring to FIG. 50A, a process step for the buried well and subsequent well formation according to an embodiment of the present invention is shown. The process includes providing a substrate 12 of a first conductivity type such as p-type, for example. Alternatively, the first conductivity type can be n-type. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 50B, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type), where region 29 represents bulk semiconductor substrate having second conductivity type. To simplify the description, the substrate 12 will usually be drawn as the semiconductor bulk material as it is in FIG. 50A.

After this process step, device also includes a buried layer region 22 of a second conductivity type, such as n-type, for example (or p-type, when the first conductivity type is n-type); a well region 24 of the first conductivity type, such as p-type, for example. Some portion of the well region 24 will be floating body region of memory device when the process is completed.

Buried layer region 22 may be formed by an ion implantation process on the material of substrate 12. Alternatively, buried layer region 22 and the well region 24 can be grown epitaxially on top of substrate 12 or formed through a solid state diffusion process.

Figure 51:
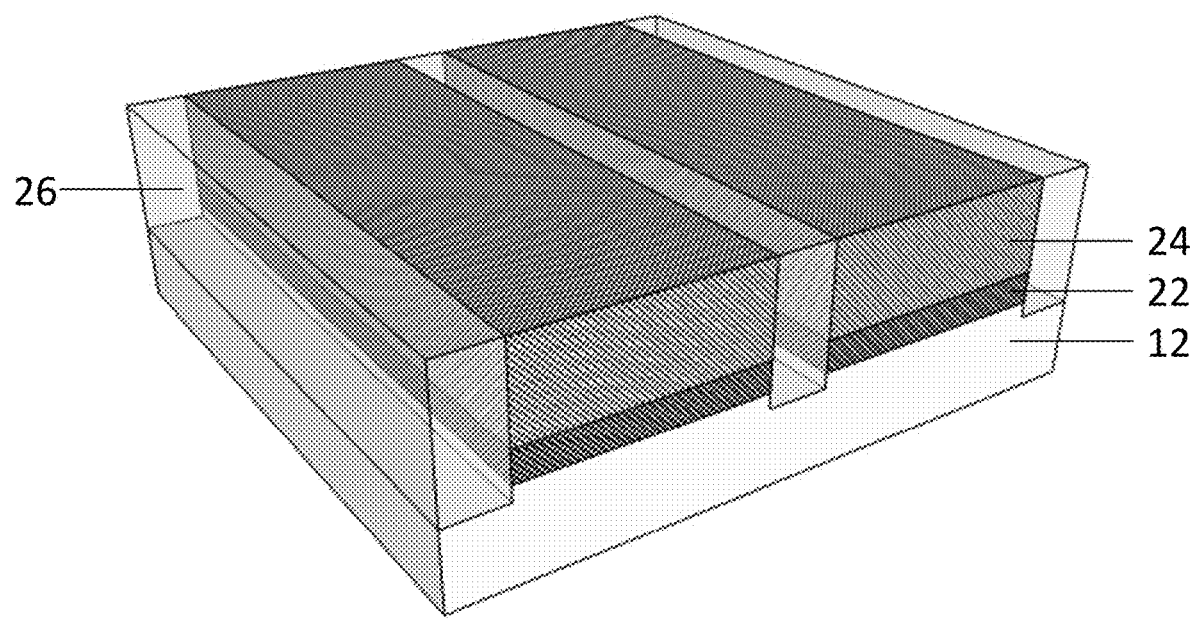
FIG. 51 schematically illustrates a memory array after formation of deep trench isolation along the word line direction according to an embodiment of the present invention.

FIG. 51 is a schematic illustration after completing the deep trench isolation 26 process. Using a well-known etch mask (not shown) process such as pad oxide and silicon nitride mask, the well region 24 and the buried layer 22 are etched. The deep trench etching extends down through the upper surface of the substrate 12. Then, the deep trenches are filled with insulating material such as silicon dioxide, followed by chemical mechanical polishing to planarize the surface. The deep trench oxides 26 are parallel to each other along the word line direction to be formed.

Figure 52:
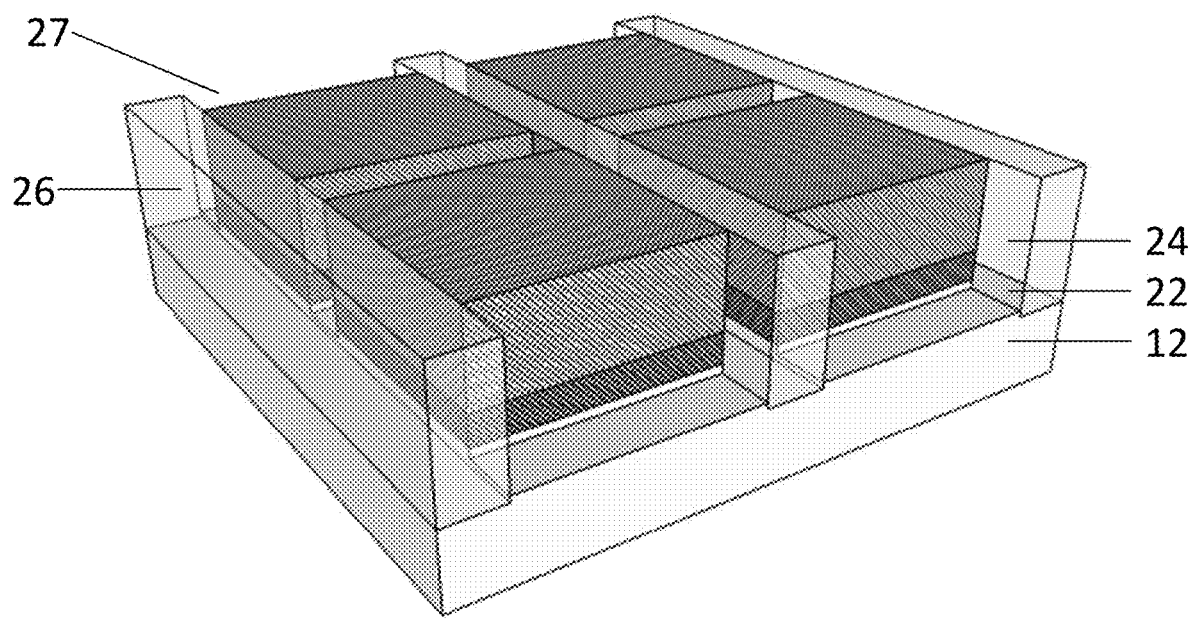
FIG. 52 schematically illustrates a memory array after formation of shallow trench along the bit line direction according to an embodiment of the present invention.

FIG. 52 is a schematic illustration after completing the shallow trench 27 etch process. Using a well-known etch mask (not shown) process such as pad oxide and silicon nitride mask, the well region 24 and the buried layer 22 are etched perpendicular to the deep trench isolation 26. These shallow trench 27 etchings may be completed when the bottom surfaces reside inside the buried layer 22 or, alternatively, the etchings can be extended down through the buried layer 22 but not substantially below the upper surface of the substrate 12. To simplify the description, the shallow trench 27 will be drawn as the bottom surface residing slightly below the upper surface of the substrate 12. The shallow trenches 27 are parallel to each other along the bit line direction to be formed.

Figure 53:
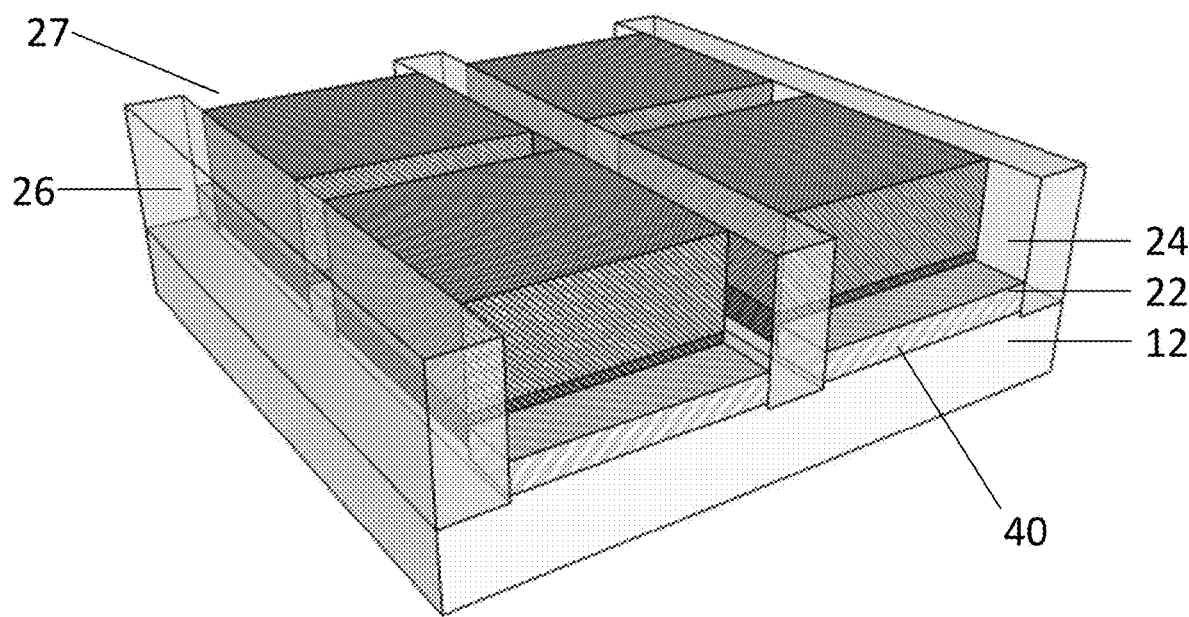
FIG. 53 schematically illustrates a memory array after formation of recessed metal in the bottom region of the shallow trench according to an embodiment of the present invention.

FIG. 53 is a schematic illustration after completing the recessed metal 40 formation process. Using a well-known etch mask (not shown) process such as pad oxide and silicon nitride mask, the shallow trench 27 is filled with a metal and etched back. The upper surface of the recessed metal 40 is made to reside below the upper surface of the buried layer 22, so that the recessed metal connects the adjacent buried layers 22 but not the well 24 regions. Therefore, the buried layer 22 can be electrically continuous through chain connection through the recessed metals 40 along the word line direction.

Figure 54:
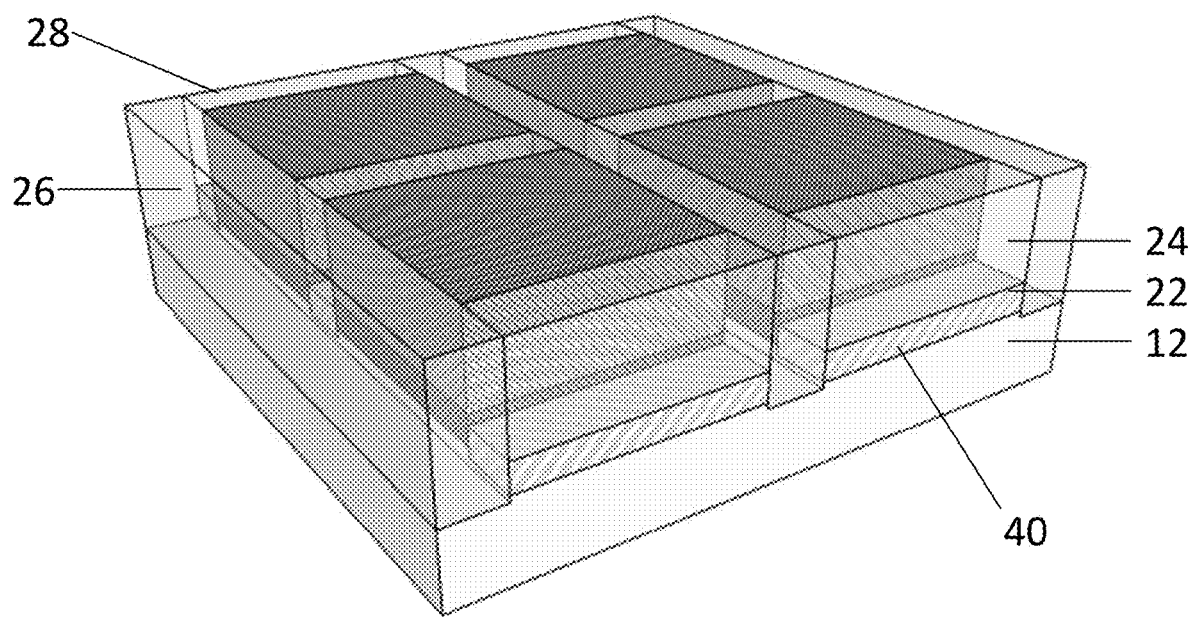
FIG. 54 schematically illustrates a memory array after gap filling in the shallow trench according to an embodiment of the present invention.

FIG. 54 is a schematic illustration after completing the shallow trench isolation 28 process. The shallow trenches 27 are filled with insulating material such as silicon dioxide, followed by chemical mechanical polishing to planarize the surface.

Figure 55:
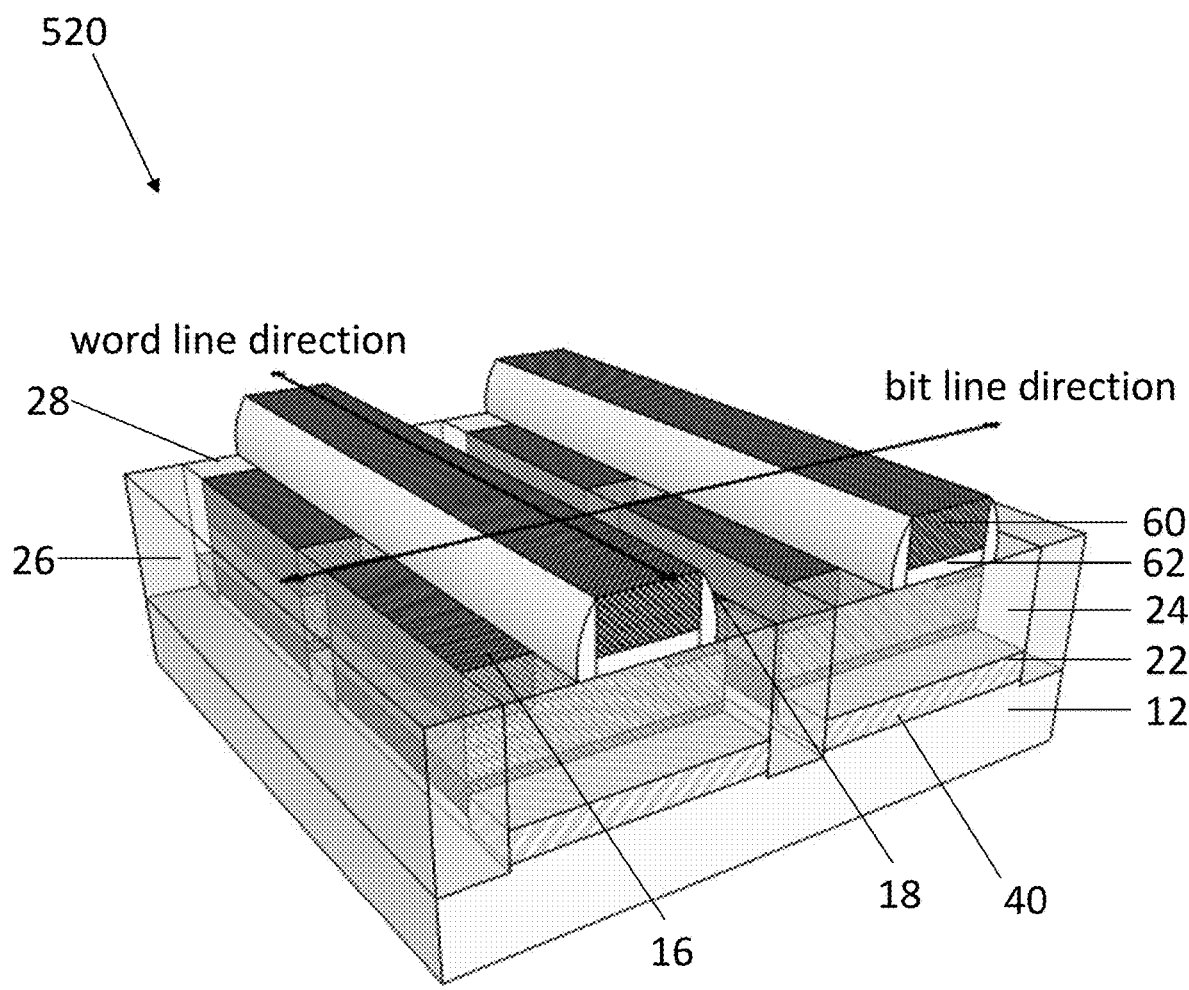
FIG. 55 schematically illustrates a memory array after formation of gate stack and source and drain according to an embodiment of the present invention.

FIG. 55 is a schematic illustration after completing the gate stack 60, 62, source region 16, and drain region 18 formations. The lines shown indicate the word line and bit line directions.

Figure 56:
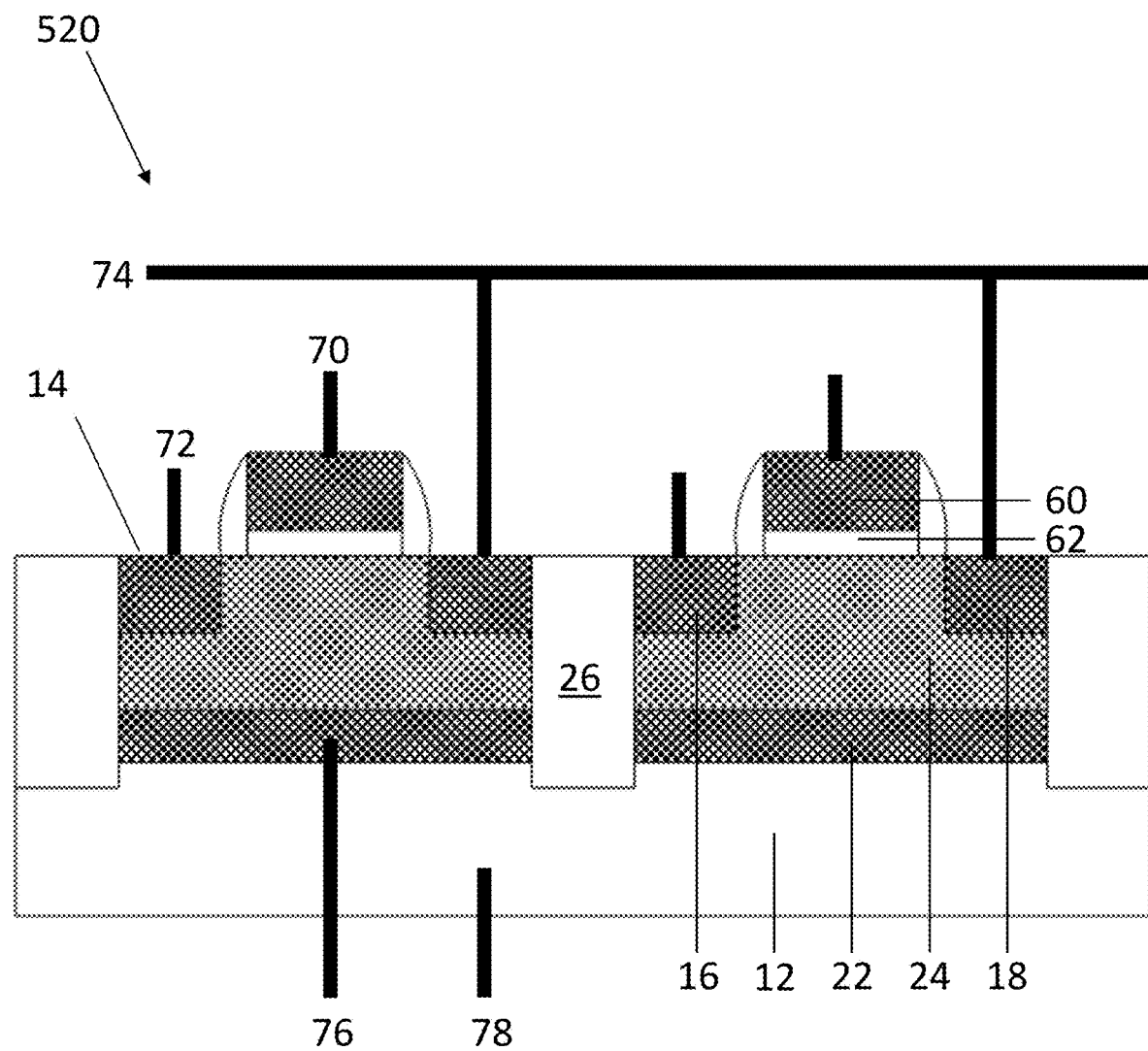
FIG. 56 is a cross-sectional illustration cut along the bit line direction of FIG. 55.

FIG. 56 illustrates a cross-sectional illustration cut along the bit line direction of FIG. 55. Referring to the memory cell 520, the floating body region 24 of the first conductivity type is bounded on top by source line region 16, drain region 18, and insulating layer 62 (or by surface 14 in general), on the sides perpendicular to the bit line direction by deep trench isolation 26, on the other sides perpendicular to the word line direction by shallow trench isolation 28 (see FIG. 57), and on the bottom by buried layer 22. The bottom of the deep trench isolation 26 resides below the interface between the buried layer 22 and the substrate 12, which insulates the floating body region 24 as well as the buried layer 22 along the bit line direction.

Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16, also referred to as source region 16, having a second conductivity type, such as n-type, for example (or p-type, when the first conductivity type is n-type), is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example (or p-type, when the first conductivity type is n-type), is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Cell 520 includes several terminals: word line (WL) terminal 70 electrically connected to gate 60, bit line (BL) terminal 74 electrically connected to bit line region 18, source line (SL) terminal 72 electrically connected to source line region 16, buried well (BW) or deep n-well (DNWL) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 57A:
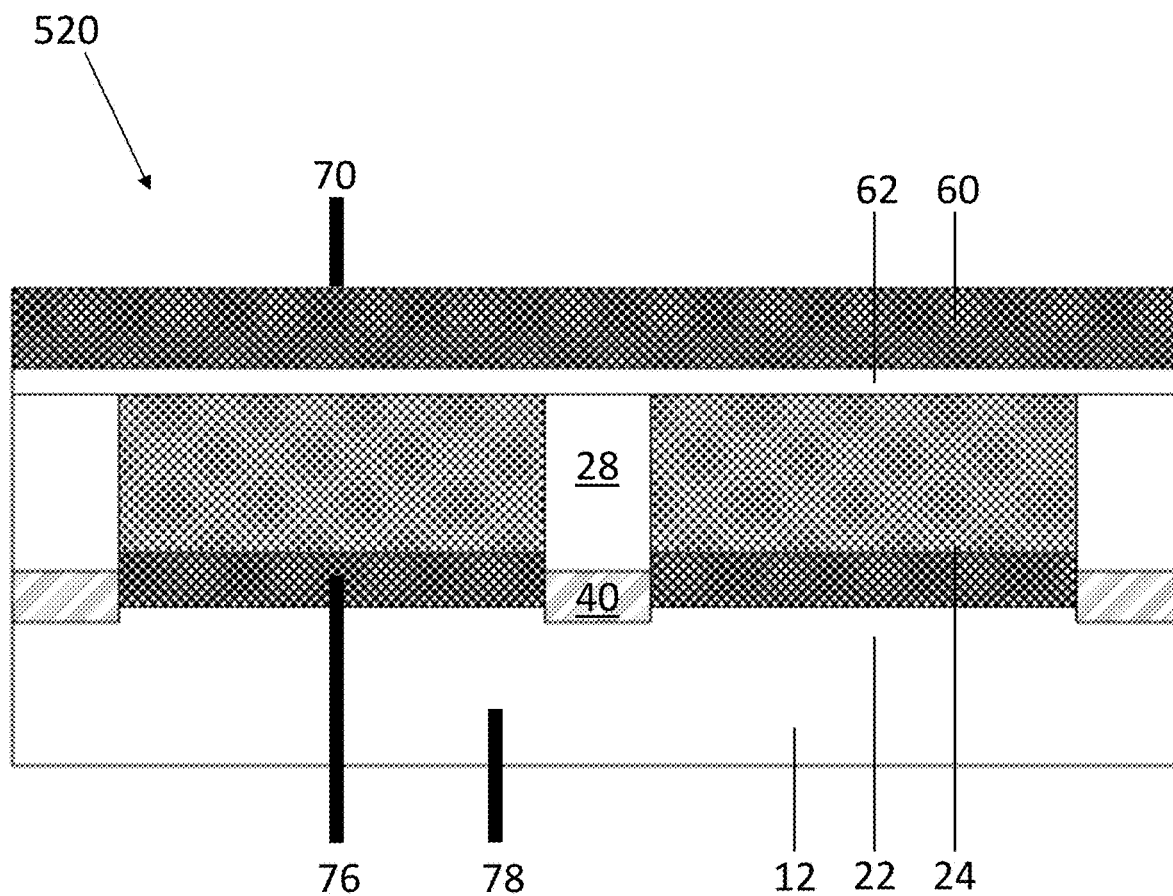
FIGS. 57A-57C are cross-sectional illustrations cut along the word line direction of FIG. 55.
Figure 57B:
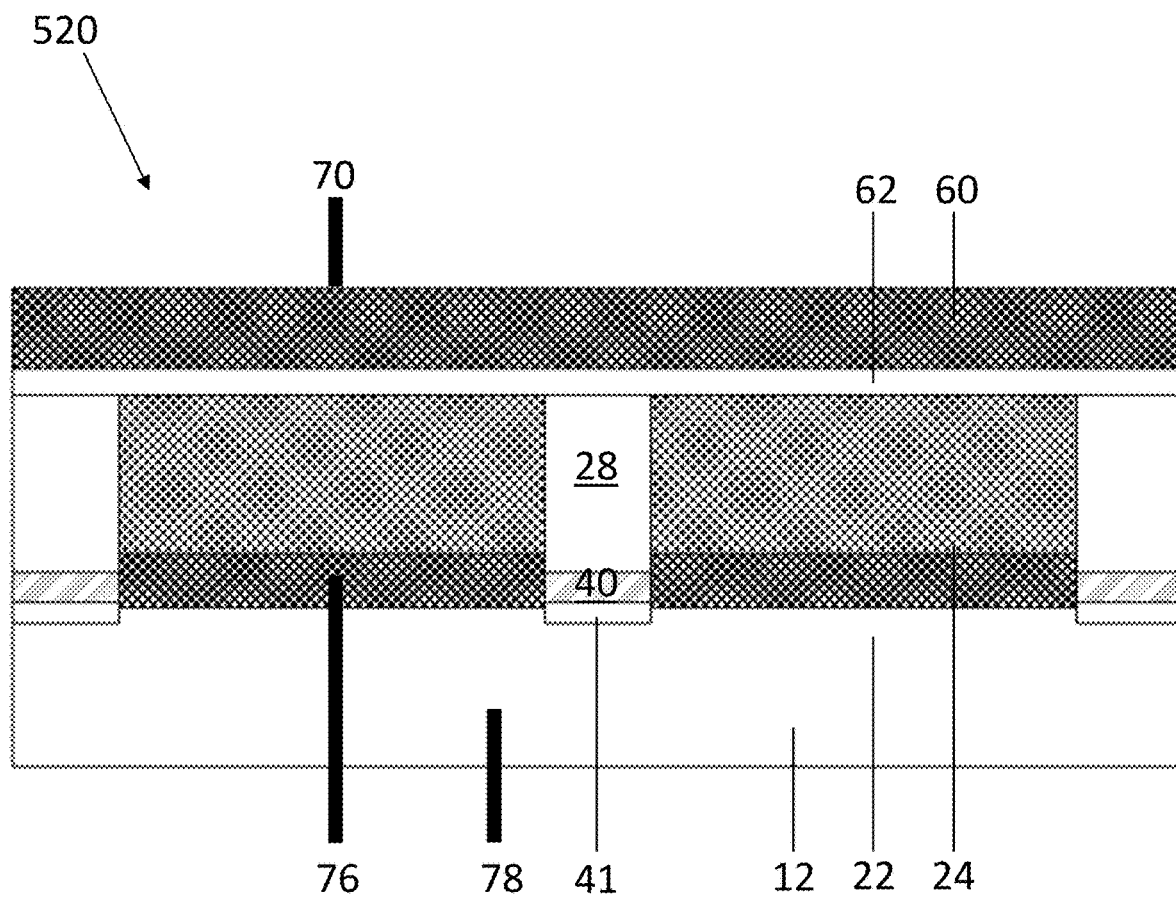
Figure 57C:
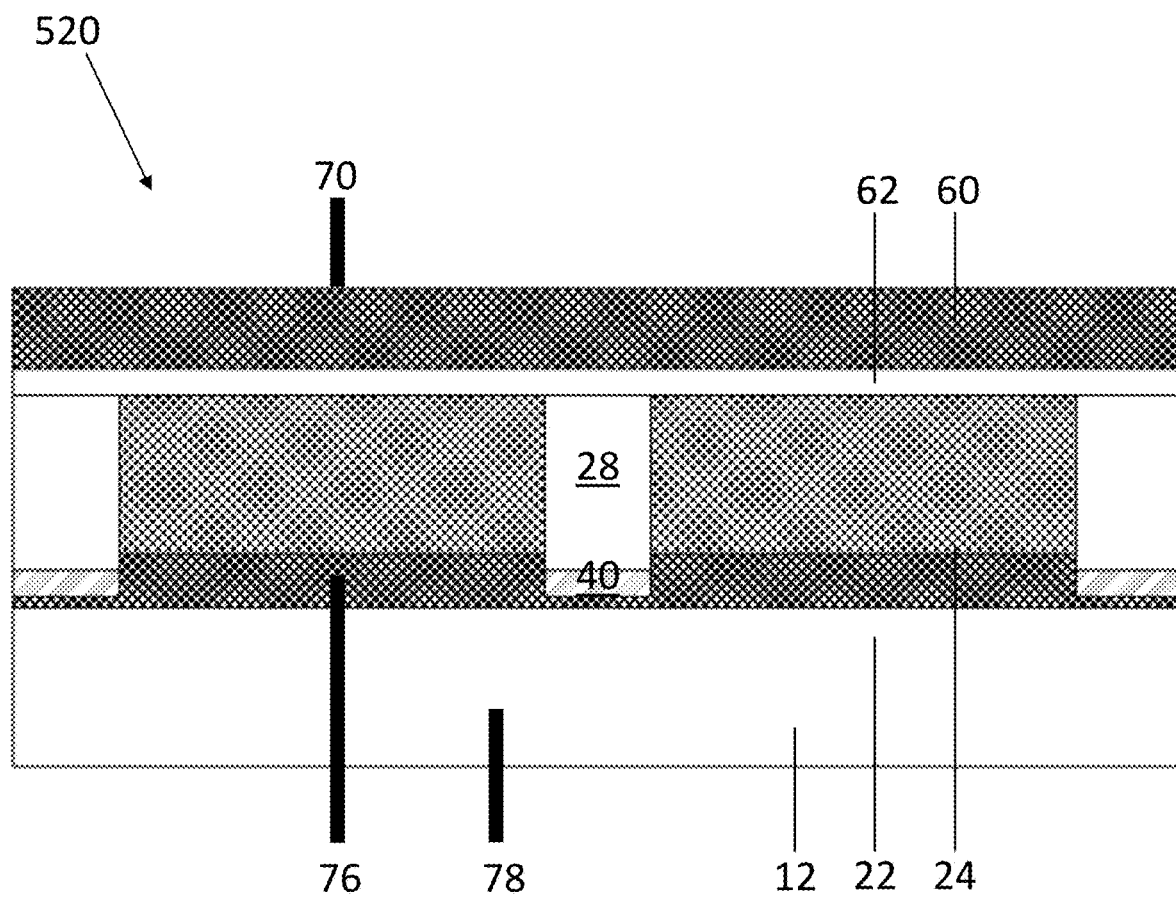

FIGS. 57A-57C illustrate cross-sectional illustrations cut along the word line direction of FIG. 55. FIG. 57A illustrates a cross-sectional illustration of an embodiment of the present invention. The recessed metal 40 connects the neighboring buried layers 22 along the word line direction, but not along the bit line direction due to deep trench isolation 26. FIG. 57B illustrates a cross-sectional illustration of another embodiment of the present invention. The buffer oxide 41 may be present at the bottom of the shallow trench so that the bottom of the recessed metal 40 may not directly touch the substrate 12 while connecting the neighboring buried layers 22. FIG. 57C illustrates a cross-sectional illustration of another embodiment of the present invention. The bottom of the shallow trench isolation 28 resides inside the buried layer 22. Therefore, the recessed metal 40 is made in parallel to the buried layer 22. The buried layer 22 becomes continuous along the word line direction while its resistivity may be enhanced by the periodically placed, recessed metals. Note that the recessed metals 40 are not made to contact to the floating body 24 or the substrate 12.

Figure 58:
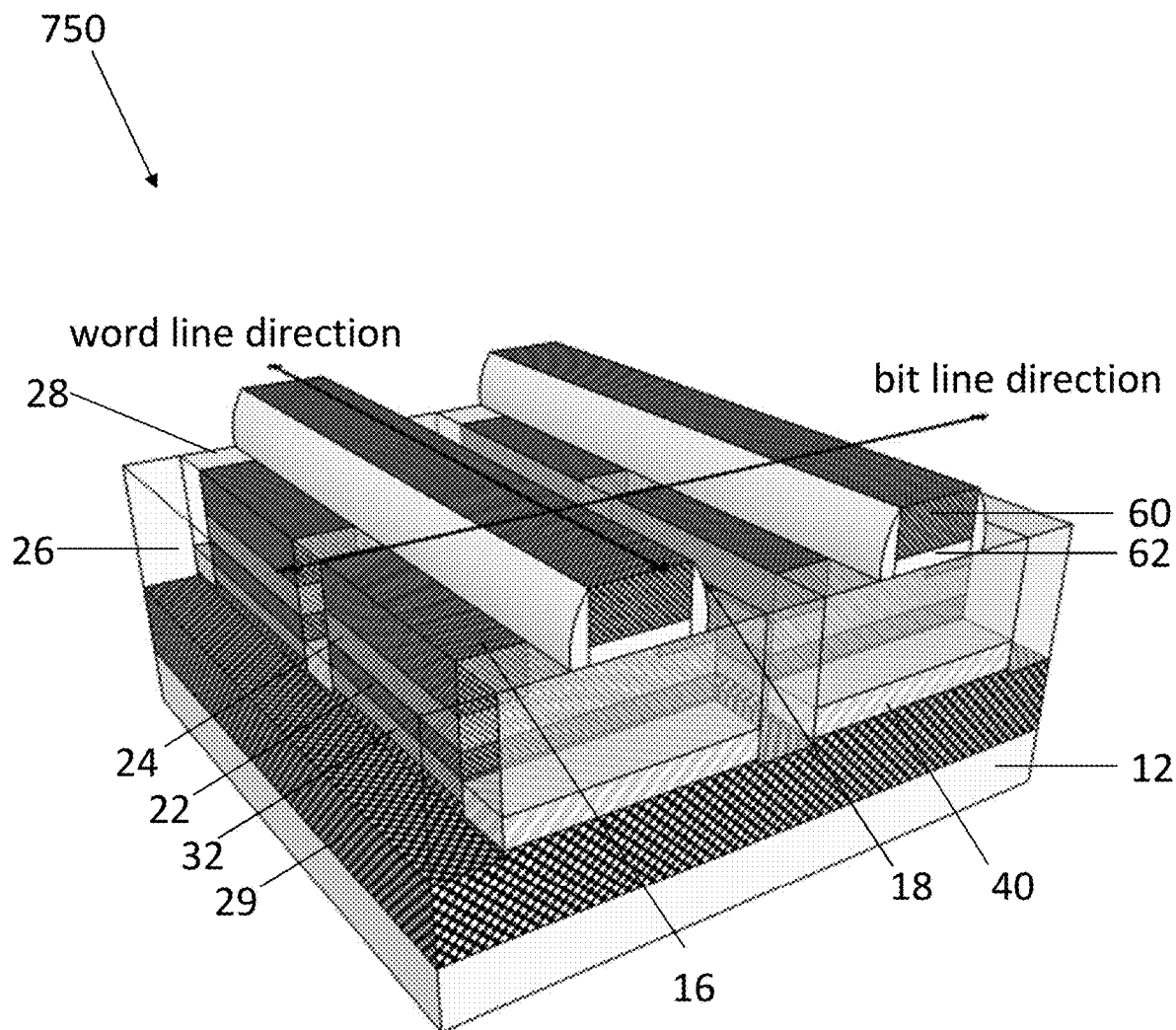
FIG. 58 schematically illustrates a memory array according to another embodiment of the present invention.
Figure 59:
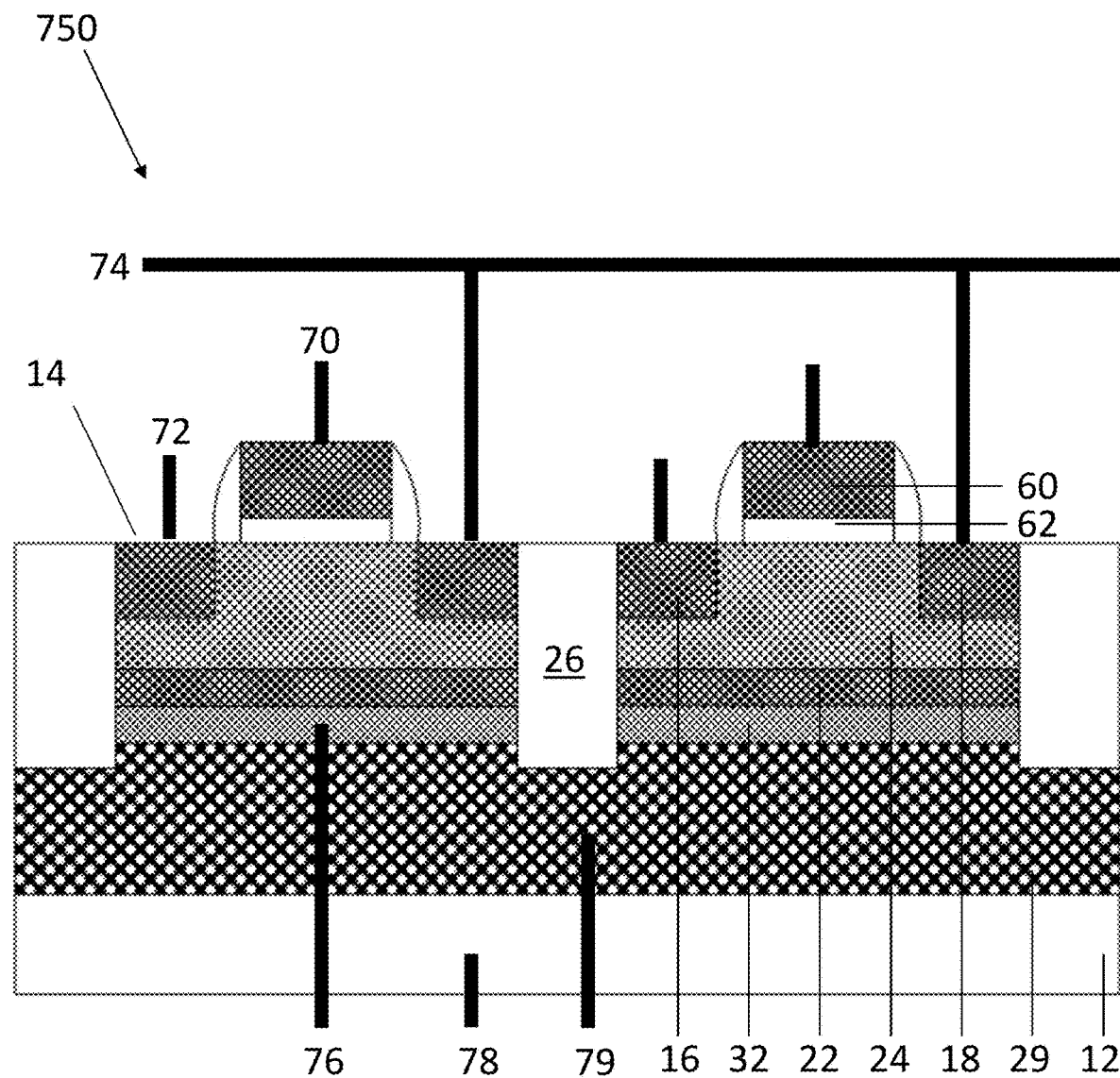
FIG. 59 is a cross-sectional illustration cut along the bit line direction of FIG. 58.
Figure 60:
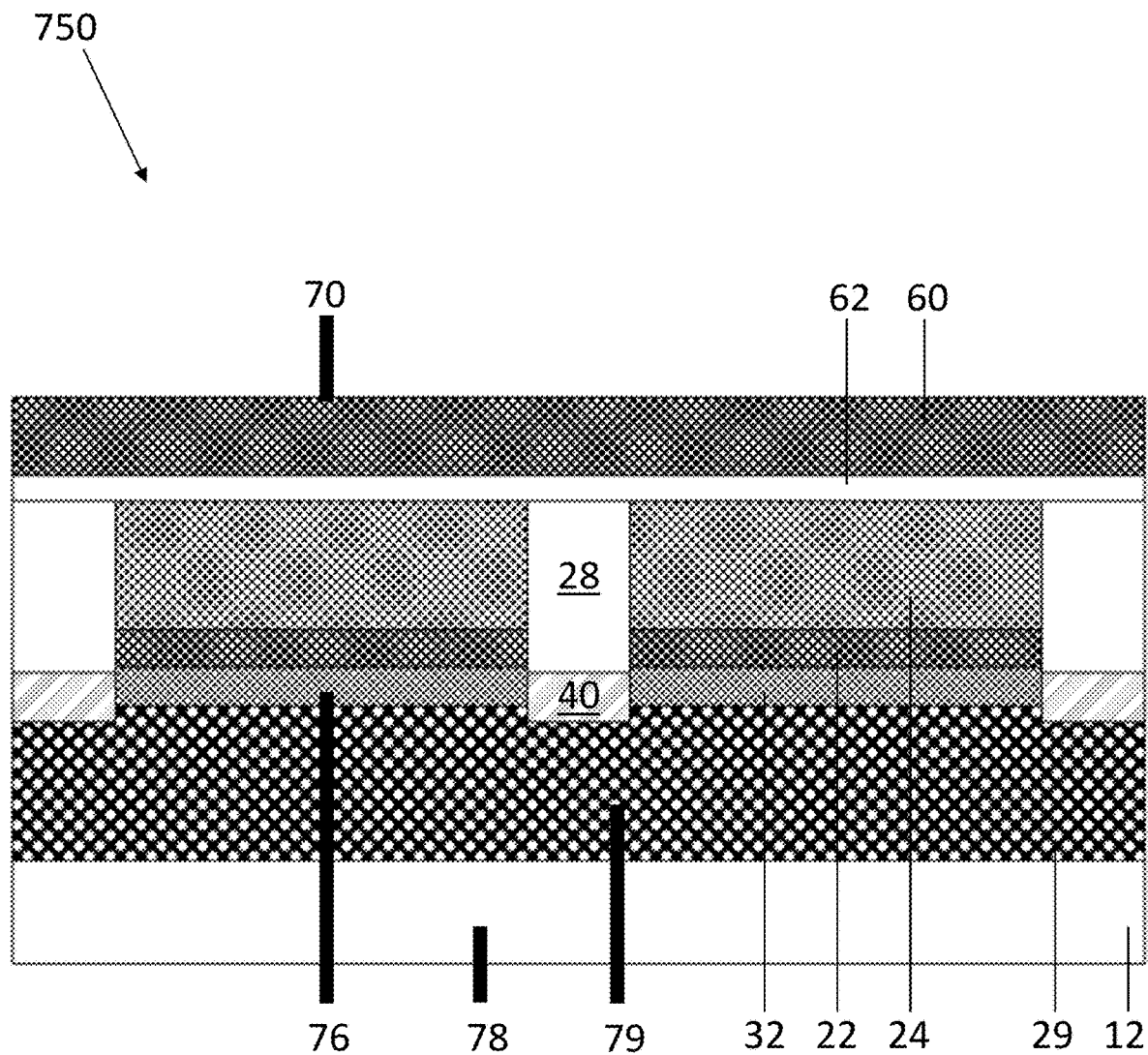
FIG. 60 is a cross-sectional illustration cut along the word line direction of FIG. 58.

Referring to FIG. 58, a memory device 750 according to another embodiment of the present invention is shown. FIG. 59 and FIG. 60 illustrate cross-sectional illustrations cut along the bit line and word line directions of FIG. 58, respectively. Memory device 750 includes a substrate 12 of a first conductivity type such as p-type, for example. The memory device 750 includes a deep well 29 of the second conductivity type, such as n-type. Memory device 750 also includes a first buried layer 32 of a first conductivity type, such as p-type, for example; a second buried layer 22 of a second conductivity type, such as n-type, for example; a floating body 24 of the first conductivity type, such as p-type, for example; and source/drain 16 and 18 of the second conductivity type, such as n-type, for example. Buried layers 22 and 32 may be formed by an ion implantation process on the material of substrate 12. Alternatively, buried layer 22 and 32 and the floating body region 24 can be grown epitaxially on top of substrate 12 or formed through a solid state diffusion process. The floating body 24 of the first conductivity type is bounded on top by source 16, drain 18, and insulating layer 62 and by surface 14, on the sides perpendicular to the bit line direction by deep trench isolation 26, on the other sides perpendicular to the word line direction by shallow trench isolation 28, and on the bottom by second buried layer 22. The bottom of the deep trench isolation 26 resides below interface between the first buried layer 32 and the substrate 12, which insulates the floating body region 24, the first buried layer 32 and second buried layer 22 along the bit line direction. The bottom of the shallow trench isolation 28 is extended below the second buried layer 22 which insulates the second buried layer 22. The first buried layer 32 may be connected via recessed metal 40 as the same manner explained in FIGS. 57A-57C. While the body 24 and the second buried layer 22 are not directly connected to any terminals, the first buried layer 32 is connected to the buried layer terminal 76 according to the present invention. Deep well 29 may be continuous along both bit line and word line direction and connected to external terminal 79.

Figure 61:
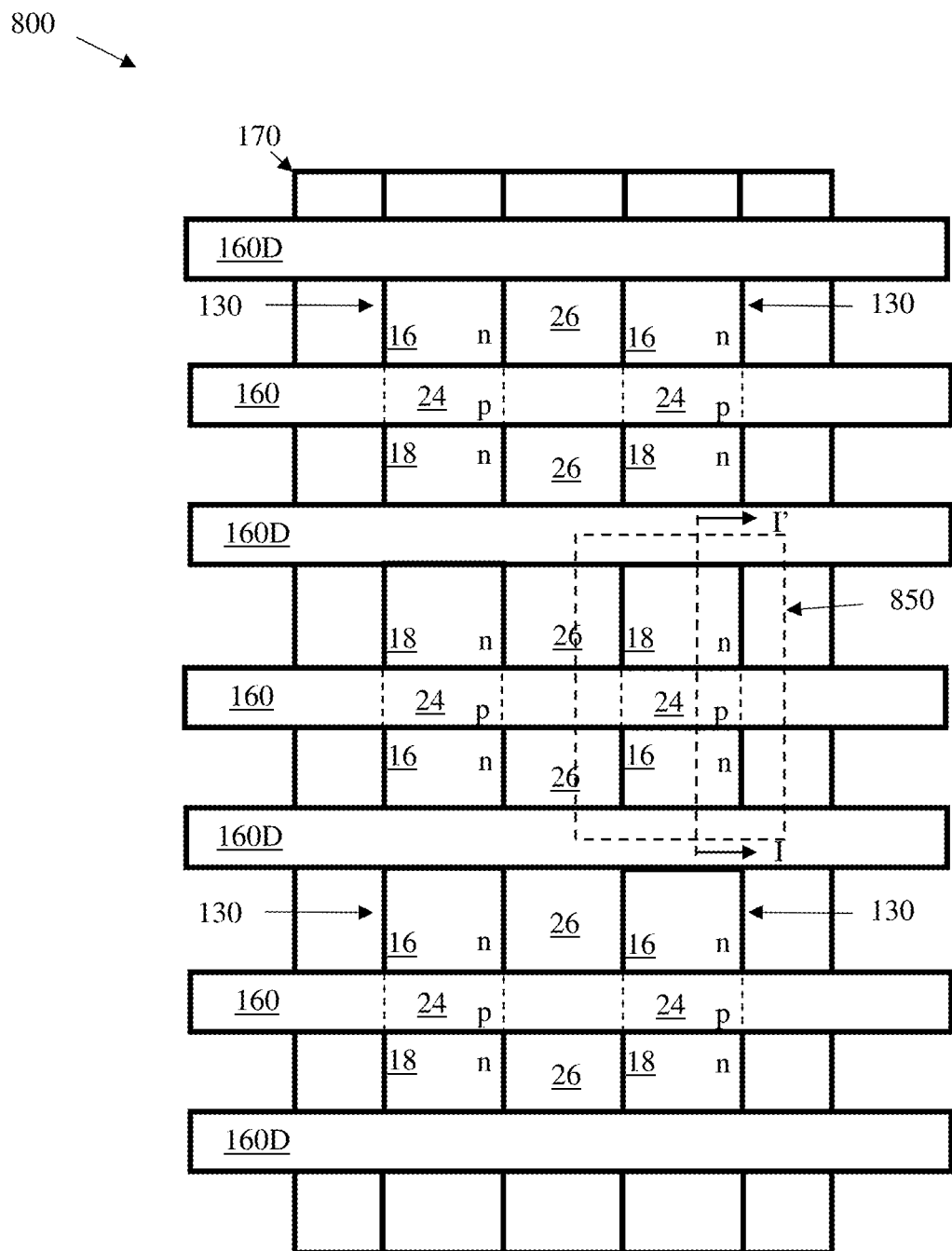
FIG. 61 schematically illustrates a layout view of a memory array according to another embodiment of the present invention.
Figure 62:
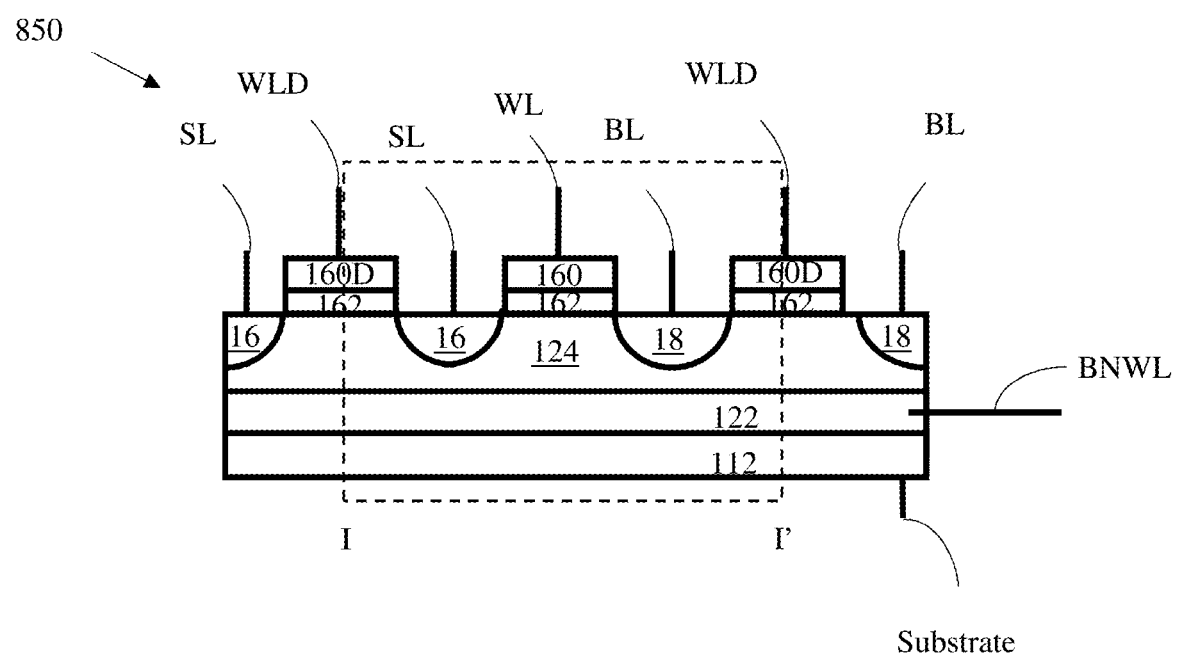
FIG. 62 schematically illustrates a cross-sectional view of a memory cell according to another embodiment of the present invention.

FIG. 61 illustrates a layout view of memory array 800 according to another embodiment of the present invention. The memory array 800 is located within a buried well region 170 layer. The DIFF region 130 is continuous along plurality of transistors along the I-I' direction illustrated in FIG. 61 and thus there is no insulating layer 26 in the I-I' direction. The memory array 800 includes additional dummy POLY layers 160D which overlays a DIFF region 130 (hence being referred to as dummy layer) and is used to electrically isolate one memory cell 850 from neighboring memory cells 850 by forming a depletion region or weak accumulation region in the DIFF region 130 under the dummy POLY layers 160D. In this case, the depletion boundary due to the dummy POLY 160D is desired to be substantially close to the depletion boundary formed by the buried layer region 22. The dummy layer 160D for example may be a result of restrictive design rules (which guides the layout drawing of the layers) for better lithography patterning process. The DIFF layers 130 define the active regions of the memory cell (regions between the insulating layers), where the layers in between the DIFF layers 130 define the insulating layers 26. The POLY layers 160 and dummy POLY layers 160D define the gate region of the memory cell 850 as shown in the cross-sectional view of FIG. 62. The POLY 160 and dummy POLY 160D may comprise the same materials, but may alternatively be formed by different materials. For example, materials with higher work function (which is defined as the minimum energy to remove an electron from a solid to a point in the vacuum immediately outside the solid surface) may be used for dummy POLY 160D. The materials for dummy POLY 160D may be the same material for the gate material being used for the p-type transistor for the logic circuit. Alternatively, the material for the dummy POLY 160D may be the specially made with its work function designed to be substantially identical to valence band edge of the silicon or other materials forming the substrate region 112.

As shown in FIG. 61, the unit cell of the memory cell 850 comprises three POLY 160 regions: two 160D to define the dummy transistor region and another 160 to define the transistor region. The overlap between POLY 160 and DIFF 130 layers form the channel region of the memory cell 850, for example the region beneath gate region 160 and dielectric layer 162, between the source line region 16 and bit line region 18 shown in FIG. 62.

Each memory cell 850 in memory array 800 is insulated from neighboring memory cells 850 by the insulating layer 26 in one direction along the word line direction, orthogonal to the I-I' direction, and by turning off the dummy transistor in the other direction along the bit line direction. In the operations of the memory cell 850, the dummy transistor is turned off by applying about 0.0V or a negative voltage, for example about −0.2V (where the dummy transistor is n-channel transistor).

Figure 63:
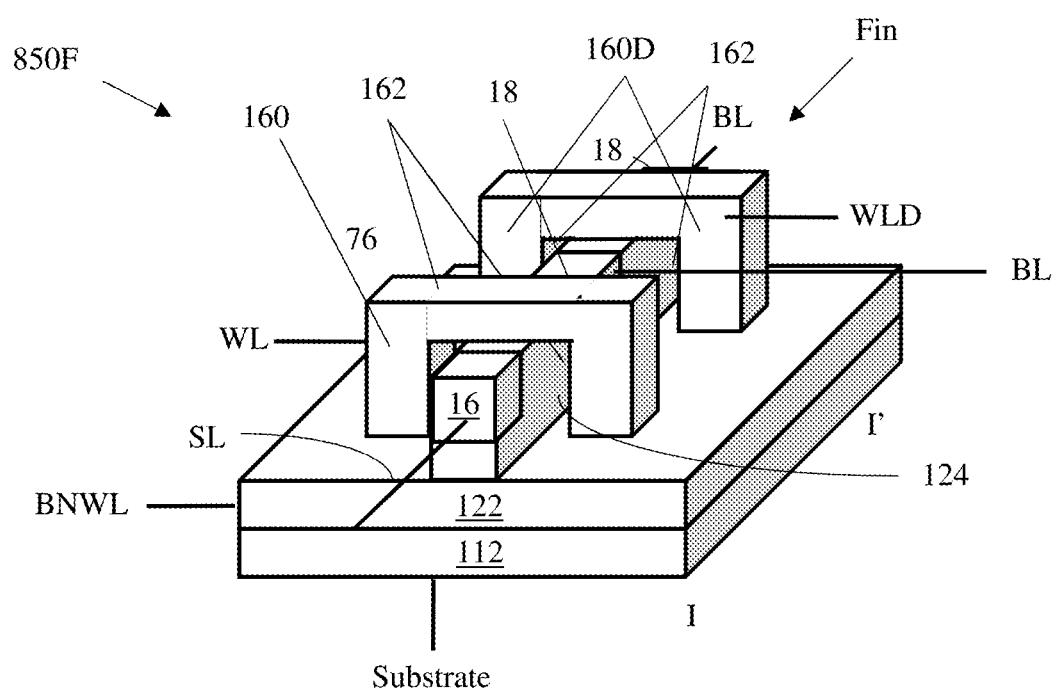
FIG. 63 schematically illustrates a cross-sectional view of a memory cell comprising a fin structure according to another embodiment of the present invention.

FIG. 63 schematically illustrates memory cell 850F having a fin structure according to another embodiment of the present invention. Each memory cell 850F in a memory array of memory cells 850F is insulated from neighboring memory cells 850F by the insulating layer 26 in one direction, and by turning off the dummy transistor in the other direction. In the operations of the memory cell 850F, the dummy transistor is turned off by applying about 0.0V or a negative voltage, for example about −0.2V (where the dummy transistor is n-channel transistor).

Several operations can be performed by memory cells 850 and 850F such as holding, read, write logic-1 and write logic-0 operations, and have been described in U.S. Pat. No. 9,230,651 to Widjaja et al., titled "Memory Device Having Floating Body Transistor" ("Widjaja-3") and U.S. Pat. No. 8,077,536, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 64:
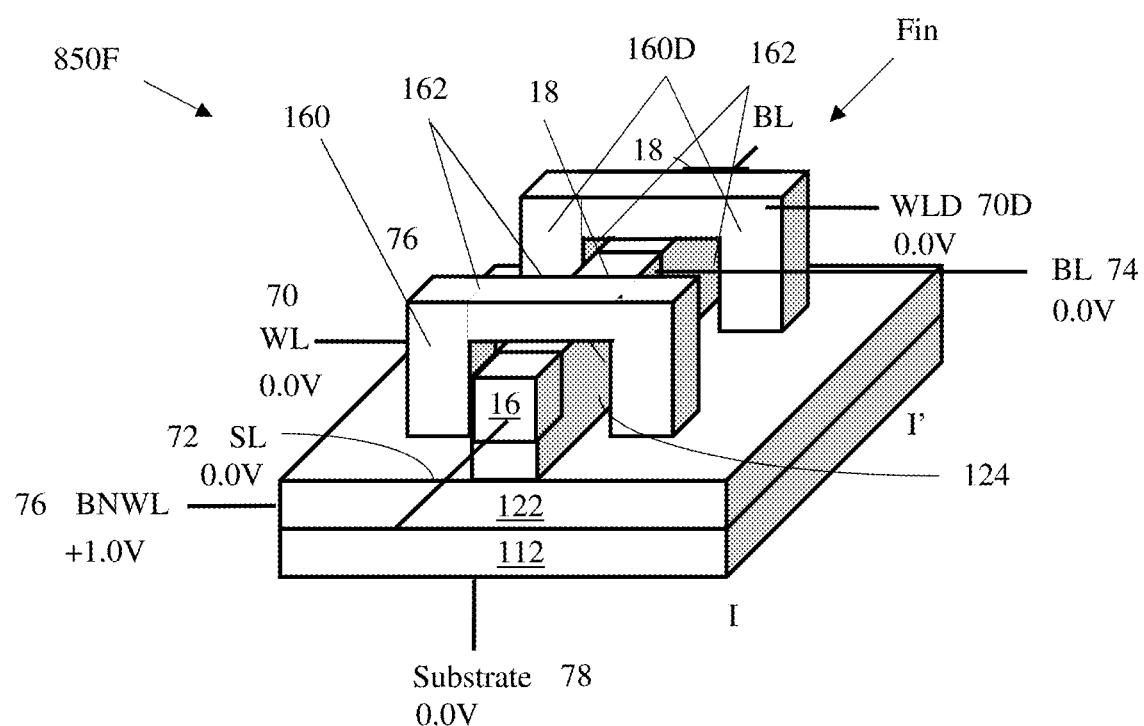
FIG. 64 schematically illustrates a holding operation performed on a memory cell illustrated in FIG. 63 according to an embodiment of the present invention.

FIG. 64 illustrates an example of a standby operation performed on memory cell 850F (and similarly on memory cell 850). A standby operation can be performed by applying zero bias on the selected WL terminal 70, applying zero bias to the selected BL terminal 74, a positive bias applied to the BW terminal 76, zero bias applied to the substrate terminal 78, and zero or negative bias to the dummy WLD terminal 70D.

In one embodiment the bias conditions for the standby operation on memory cell 850F in an array of memory cells are: 0 volts is applied to selected WL terminal 70, 0 V is applied to unselected WL terminal 70, 0 volts is applied to the selected BL terminals 74, 0 volts is applied to unselected BL terminal 74, a positive voltage, for example, +1.0 volts is applied to BW terminal 76, 0 volts is applied to the substrate terminal 78, and 0 volts is applied to the dummy WLD terminal 70D. In other embodiments, different voltages may be applied to the various terminals of memory cell 850F and the exemplary voltages described are not limiting.

Figure 65:
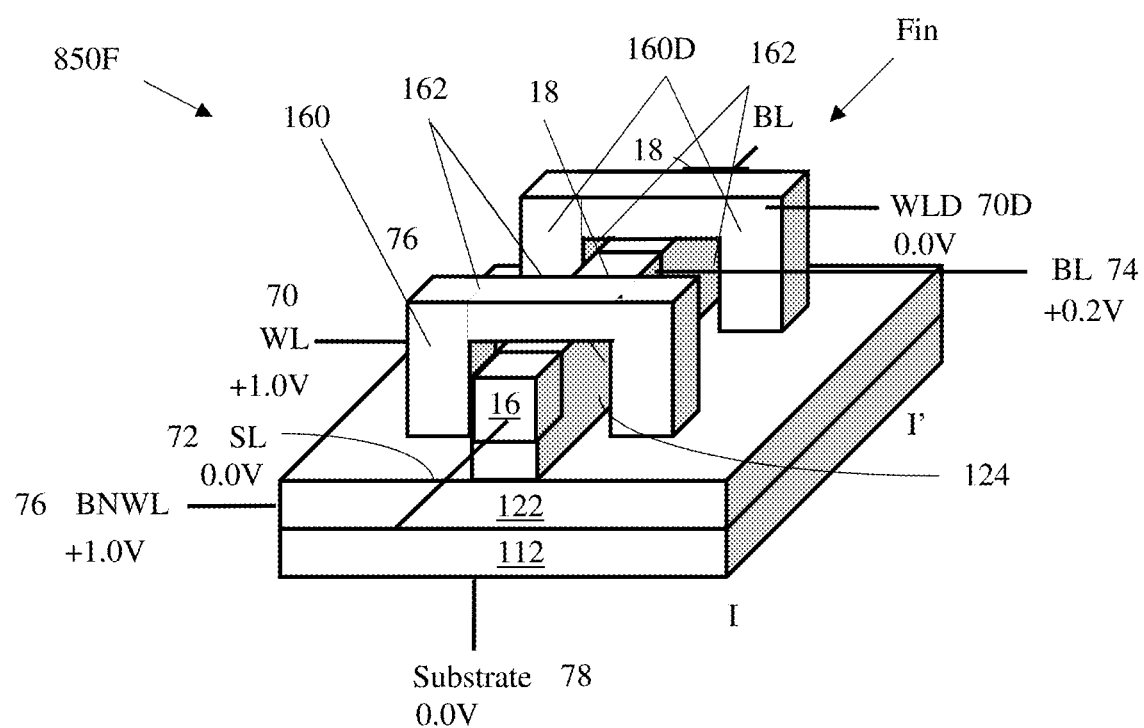
FIG. 65 schematically illustrates a read operation performed on a memory cell illustrated in FIG. 63 according to an embodiment of the present invention.

FIG. 65 illustrates an example of a read operation performed on memory cell 850F (and similarly on memory cell 850). A read operation can be performed by applying a positive bias on the selected WL terminal 70, applying a positive bias to the selected BL terminal 74 (less positive than the positive bias applied to the selected WL terminal 70), a positive bias applied to the BW terminal 76, zero bias applied to the substrate terminal 78, and zero or negative bias to the dummy WLD terminal 70D.

In one embodiment the bias conditions for the read operation on a selected memory cell 850F in an array of memory cells 850F are: +1.0 volts is applied to selected WL terminal 70, 0 V is applied to unselected WL terminals 70, +0.2 volts is applied to the selected BL terminals 74, 0 volts is applied to unselected BL terminals 74, 0 volts is applied to the selected SL terminal 72, 0 volts is applied to unselected SL terminals 72, a positive voltage, for example, +1.0 volts is applied to BW terminal 76, 0 volts is applied to the substrate terminal 78, and 0 volts is applied to the dummy WLD terminal 70D. In other embodiments, different voltages may be applied to the various terminals of memory cell 850F and the exemplary voltages described are not limiting.

Figure 66:
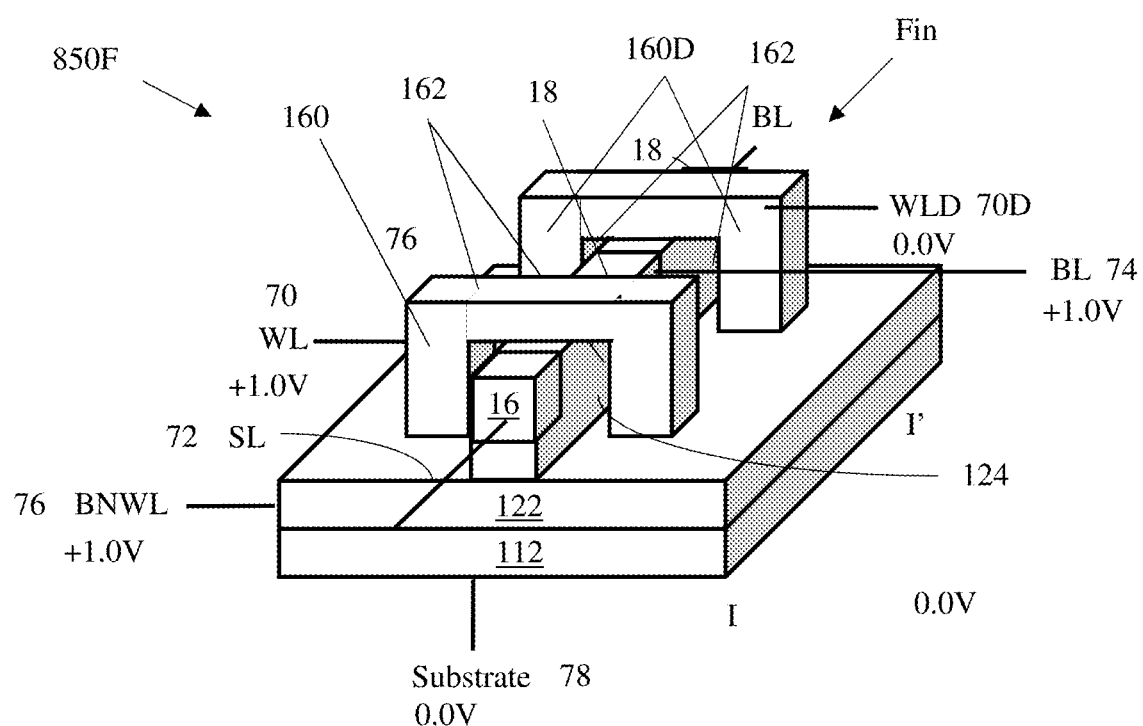
FIG. 66 schematically illustrates a write logic-1 operation performed on a memory cell illustrated in FIG. 63 according to an embodiment of the present invention.

FIG. 66 illustrates an example of a write logic-1 operation performed on memory cell 850F (and similarly on memory cell 850). The write logic-1 operation can be performed through capacitive coupling from the gate 160, source line region 16, and bit line region 18 to the floating body region 24. The operating region for the write logic-1 operation has been described for example in U.S. application Ser. No. 14/825,268, "Memory Device Comprising of an Electrically Floating Body Transistor" ("Han"), which is hereby incorporated herein, in its entireties, by reference thereto.

In one embodiment the bias conditions for a write logic-1 operation on memory cell 850F in an array of memory cells 850F are: +1.0 volts is applied to selected WL terminal 70, 0 V is applied to unselected WL terminals 70, +1.0 volts is applied to the selected BL terminals 74, 0 volts is applied to unselected BL terminals 74, 0 volts is applied to the selected SL terminal 72, 0 volts is applied to unselected SL terminals 72, a positive voltage, for example, +1.0 volts is applied to BW terminal 76, 0 volts is applied to the substrate terminal 78, and 0 volts is applied to the dummy WLD terminal 70D. In other embodiments, different voltages may be applied to the various terminals of memory cell 850F and the exemplary voltages described are not limiting.

Figure 67:
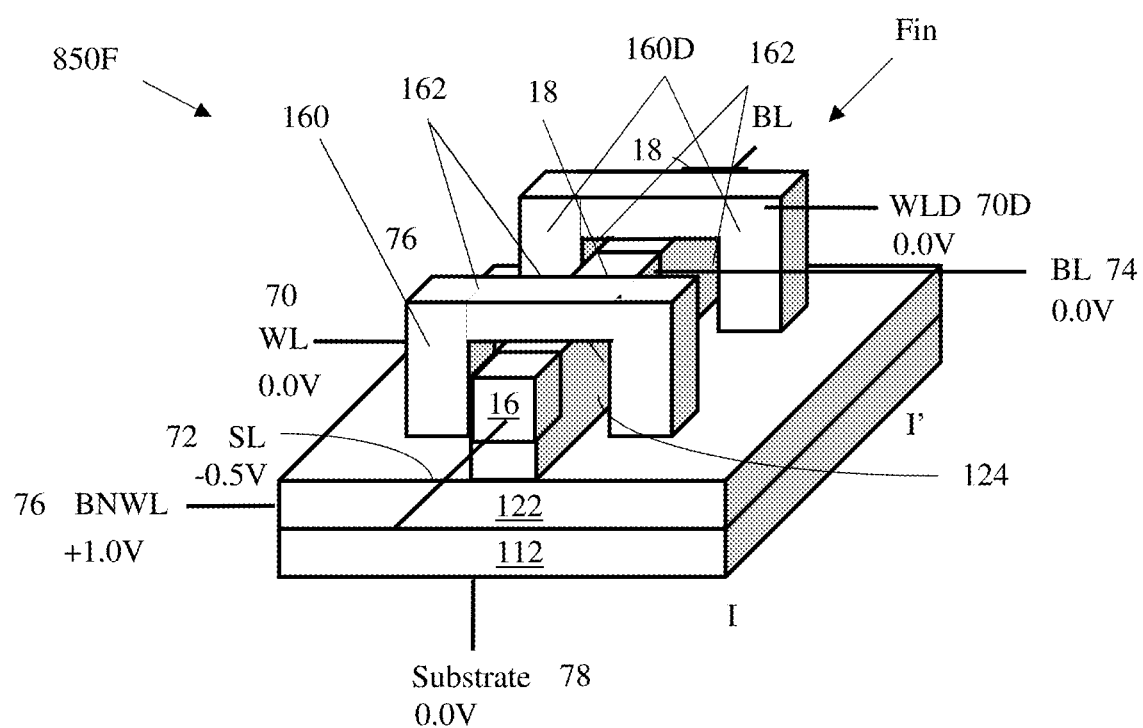
FIG. 67 schematically illustrates a write logic-0 operation performed on a memory cell illustrated in FIG. 63 according to an embodiment of the present invention.

FIG. 67 illustrates an example of a write logic-0 operation performed on memory cell 850F (and similarly on memory cell 850). The write logic-0 operation can be performed through forward biasing the p-n junction between floating body region 24 and source line region 16 and bit line region 18 and assisted by capacitive coupling from the gate 160 to the floating body region 24. The operating region for the write logic-0 operation has been described for example in U.S. application Ser. No. 14/825,268, "Memory Device Comprising of an Electrically Floating Body Transistor" ("Han"), which is hereby incorporated herein, in its entireties, by reference thereto.

In one embodiment the bias conditions for a write logic-0 operation on memory cell 850F in an array of memory cells 850F are: 0 volts is applied to selected WL terminal 70, 0 V is applied to unselected WL terminals 70, 0 volts is applied to the selected BL terminals 74, 0 volts is applied to unselected BL terminals 74, −0.5 volts is applied to the selected SL terminal 72, 0 volts is applied to the unselected SL terminals 72, a positive voltage, for example, +1.0 volts is applied to BW terminal 76, 0 volts is applied to the substrate terminal 78, and 0 volts is applied to the dummy WLD terminal 70D. In other embodiments, different voltages may be applied to the various terminals of memory cell 850F and the exemplary voltages described are not limiting.

Figure 68:
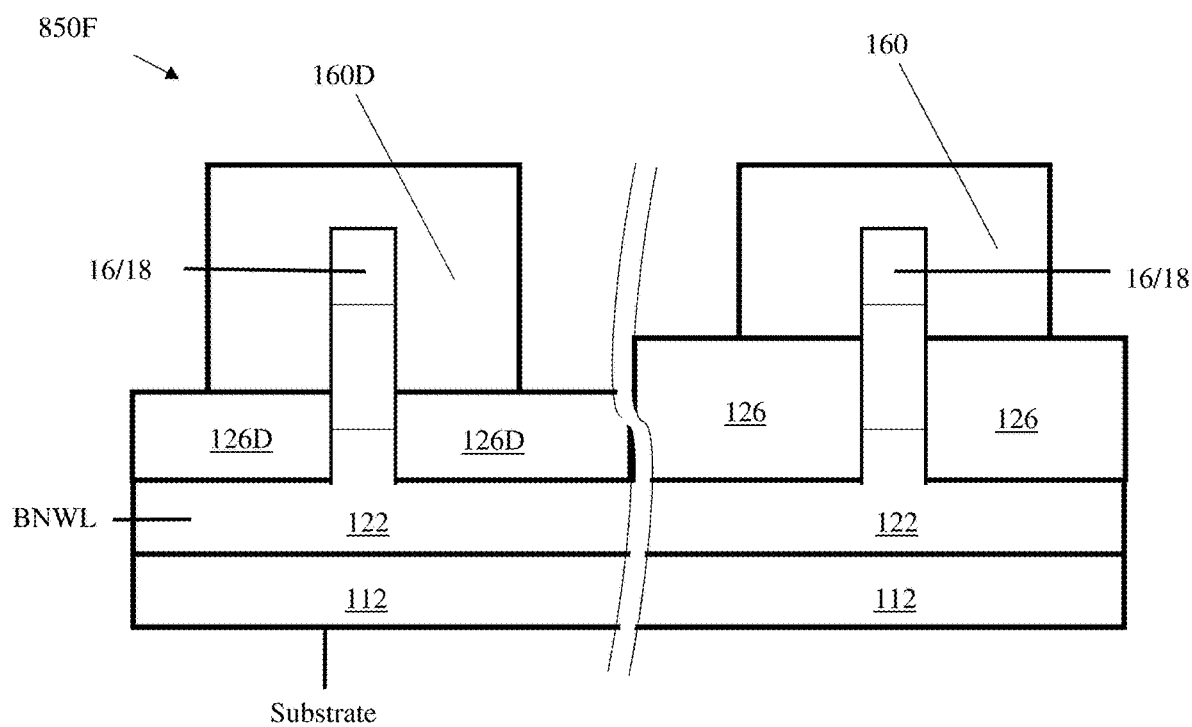
FIG. 68 schematically illustrates a cross-sectional view of a memory cell according to another embodiment of the present invention.

FIG. 68 illustrates an alternative embodiment of this invention showing cross-sectional views of memory cell 850F cut along the dummy POLY layer 160D and the POLY layer 160. In this embodiment, the isolation layer 126D under dummy POLY layer 160D is shorter than the isolation layer 126 under POLY layer 160. So, the dummy POLY layer 160D covers substantial area of the fin body, particularly close to the junction boundary of the buried layer 122.

Figure 69:
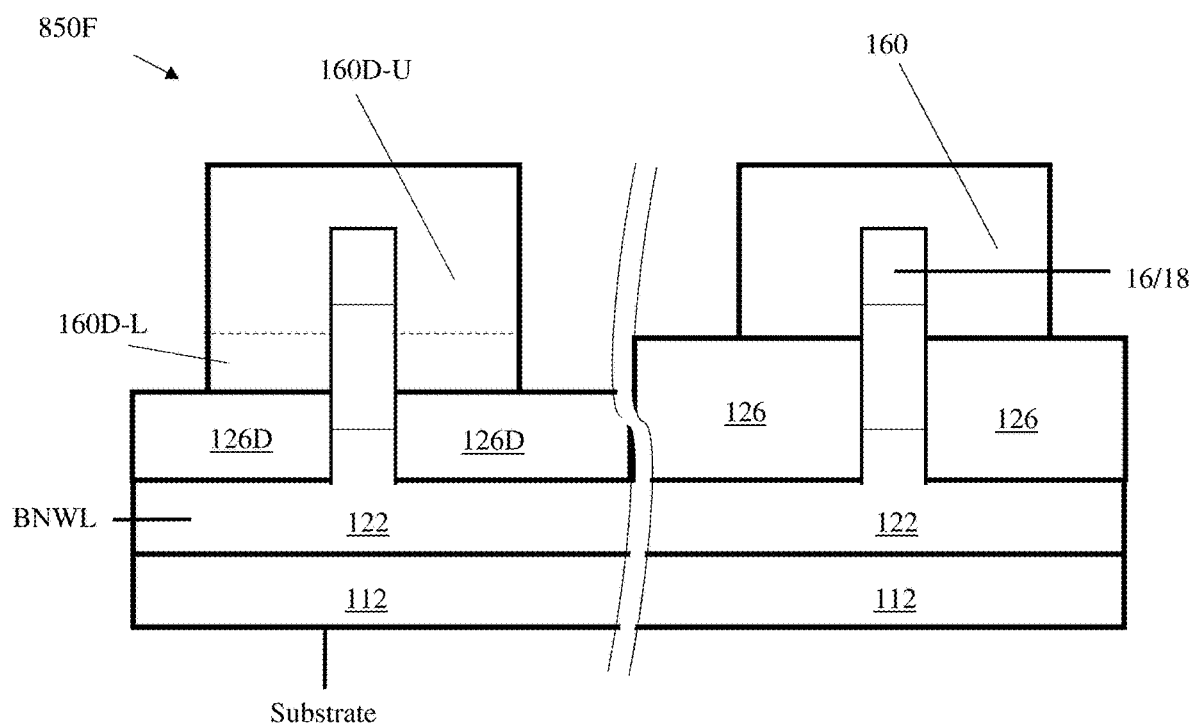
FIG. 69 schematically illustrates a cross-sectional view of a memory cell according to another embodiment of the present invention.

FIG. 69 illustrates another embodiment of this invention showing cross-sectional views of memory cell 850F cut along the dummy POLY layer 160D and the POLY layer 160. In this embodiment, the dummy POLY layer 160D is made with two different work function materials, with the upper region of dummy POLY layer 160D being made of a first material 160D-U and the lower region of dummy POLY layer 160D being made of a second material POLY 160D-L. The work function of the POLY 160D-U material may be the same or close to the gate material for p-type logic transistor or the conduction band edge of the silicon (or other materials forming the substrate region 112) while the work function of the lower region of POLY 160D-L material may be the same or close to the gate material for n-type logic transistor or the valence band edge of the silicon. Therefore, at zero volts at the dummy POLY layer 160D, the upper portion of the gate 160D-U can suppress the flow of electron current across the adjacent source to drain region while the lower portion of the gate 160D-L can suppress the penetration of excess holes from body of the neighboring logic-1 states.

Figure 70A:
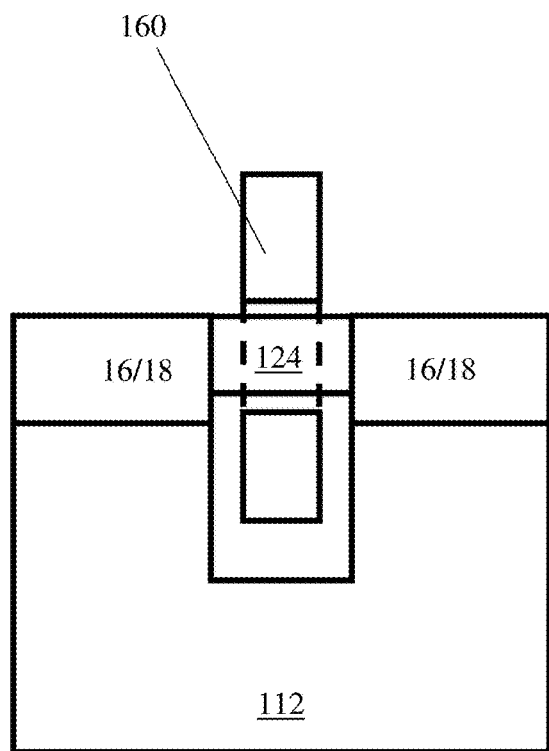
FIGS. 70A and 70B schematically illustrate cross-sectional views of a memory cell according to another embodiment of the present invention.
Figure 70B:
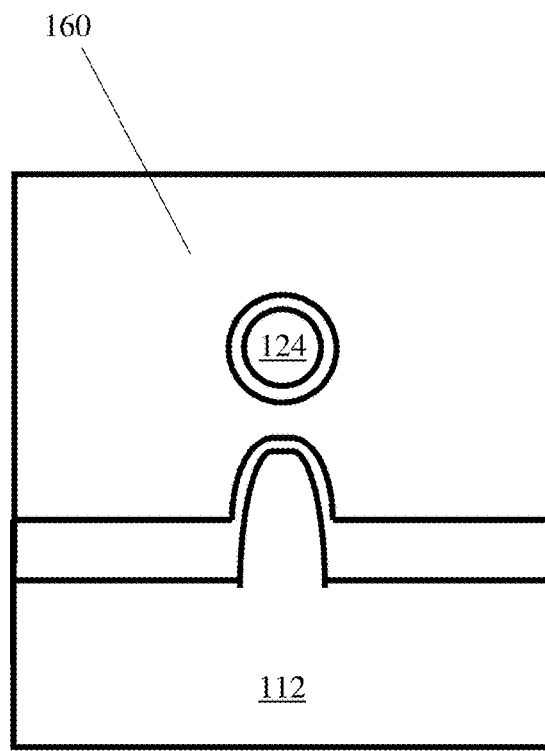

FIGS. 70A-70B schematically illustrate a conventional gate-all-around nanowire transistor structure fabricated on bulk wafer. The source and drain regions 16/18 are anchored on the bulk substrate while the body region 124 is suspended and fully wrapped around by the gate 160.

Figure 71A:
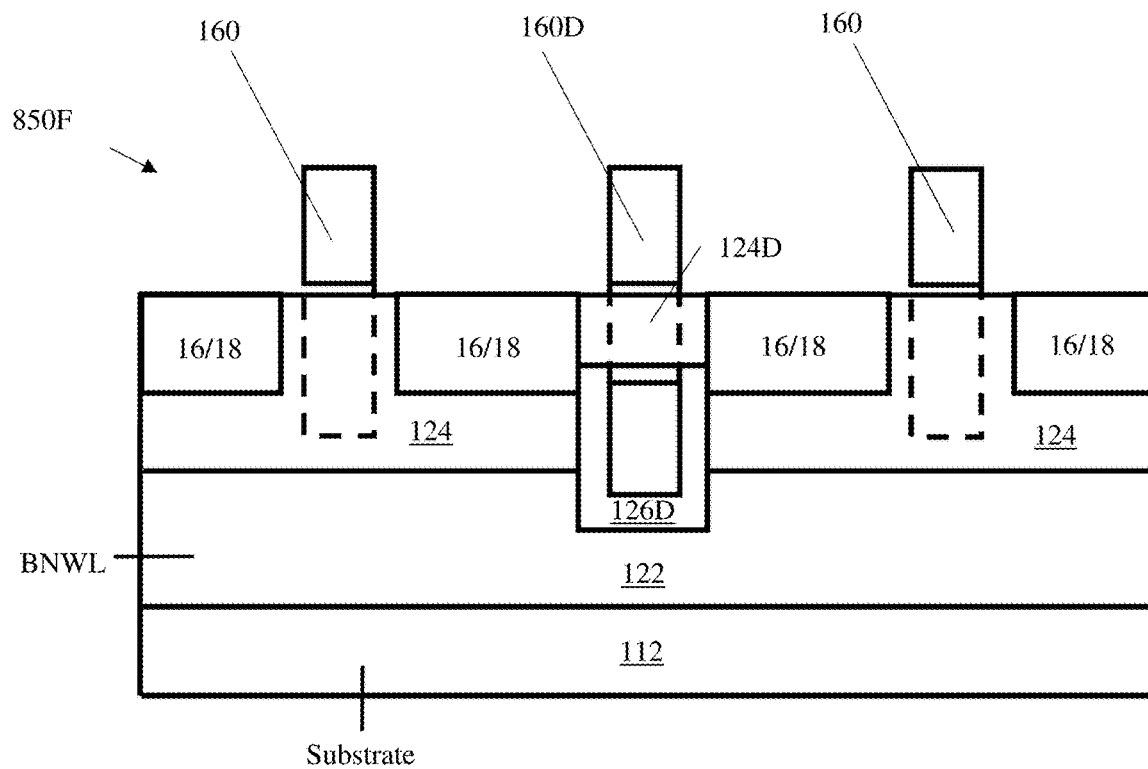
FIGS. 71A and 71B schematically illustrate cross-sectional views of a memory cell according to another embodiment of the present invention.
Figure 71B:
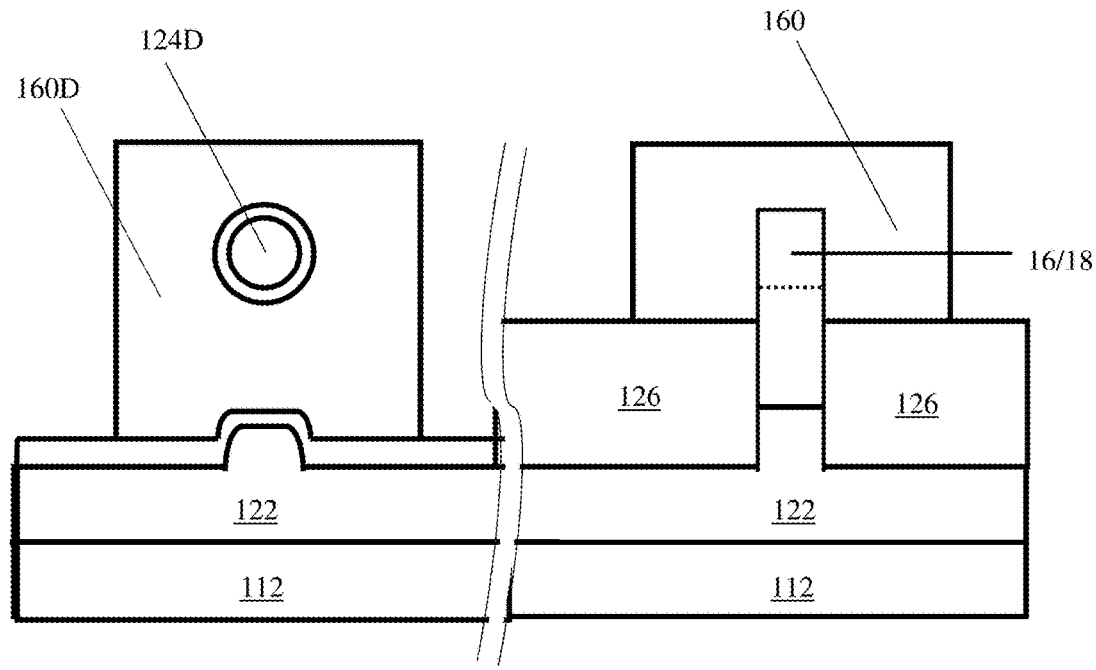

FIGS. 71A-71B schematically illustrate cross-sectional views of memory cell 850F according to another embodiment of this invention. This embodiment may be modified from the gate-all-around fabrication process or from conventional FinFET process. Alternatively, this embodiment may be implemented by monolithically hybridizing the FinFET and gate-all-around process as the U.S. Pat. No. 8,809,957 B2 "Nanowire FET and FinFET hybrid technology", which is hereby incorporated herein, in its entirety, by reference thereto. This embodiment features that the DIFF region is continuous along the bit line direction and thus no insulating layer such as shallow trench isolation is formed. The memory array comprising these cells 850F includes additional dummy POLY layer 160D which fully surrounds the suspended nanowire-type dummy body 124D. The suspended dummy body 124D may be fabricated by the part of the logic gate-all-around nanowire transistor fabrication. The memory array 850F also includes POLY layer 160 that covers the fin-type body of the memory cell. The fin body may be fabricated by the part of the logic FinFET transistor fabrication. The FinFET portion works as memory cell while the gate-all-around portion works for isolating the bodies of neighboring FinFET. In order to electrically isolate the bodies of neighboring FinFET cell, the junction between the buried n-well 122 and the fin body 124 are formed above the top surface of the residual silicon fin under the dummy POLY 160D.

Figure 72:
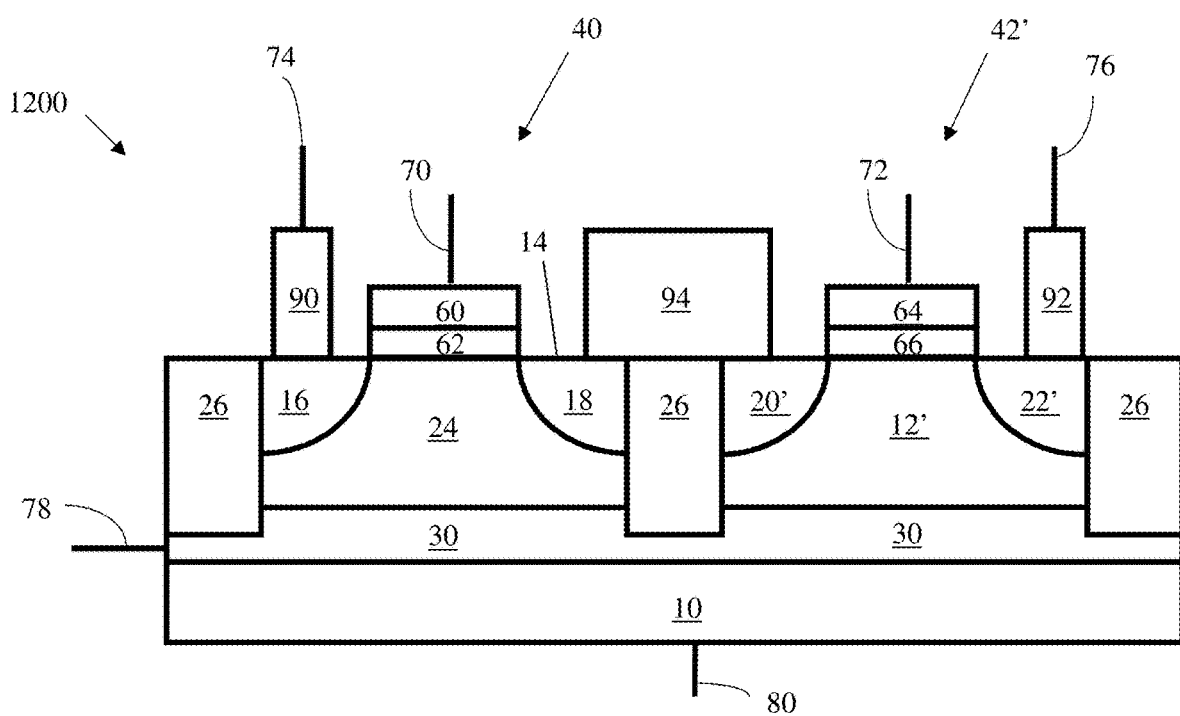
FIG. 72 schematically illustrates a cross-sectional view of a memory cell comprising an access transistor and a memory transistor having different conductivity type according to another embodiment of the present invention.

FIG. 72 schematically illustrates a memory cell 1200 comprising an access transistor 42' and a memory transistor 40 having different conductivity type, for example as described in U.S. application Ser. No. 14/380,770, "Memory Cell Comprising First and Second Transistors and Methods of Operating", which is hereby incorporated herein, in its entirety, by reference thereto.

Figure 73:
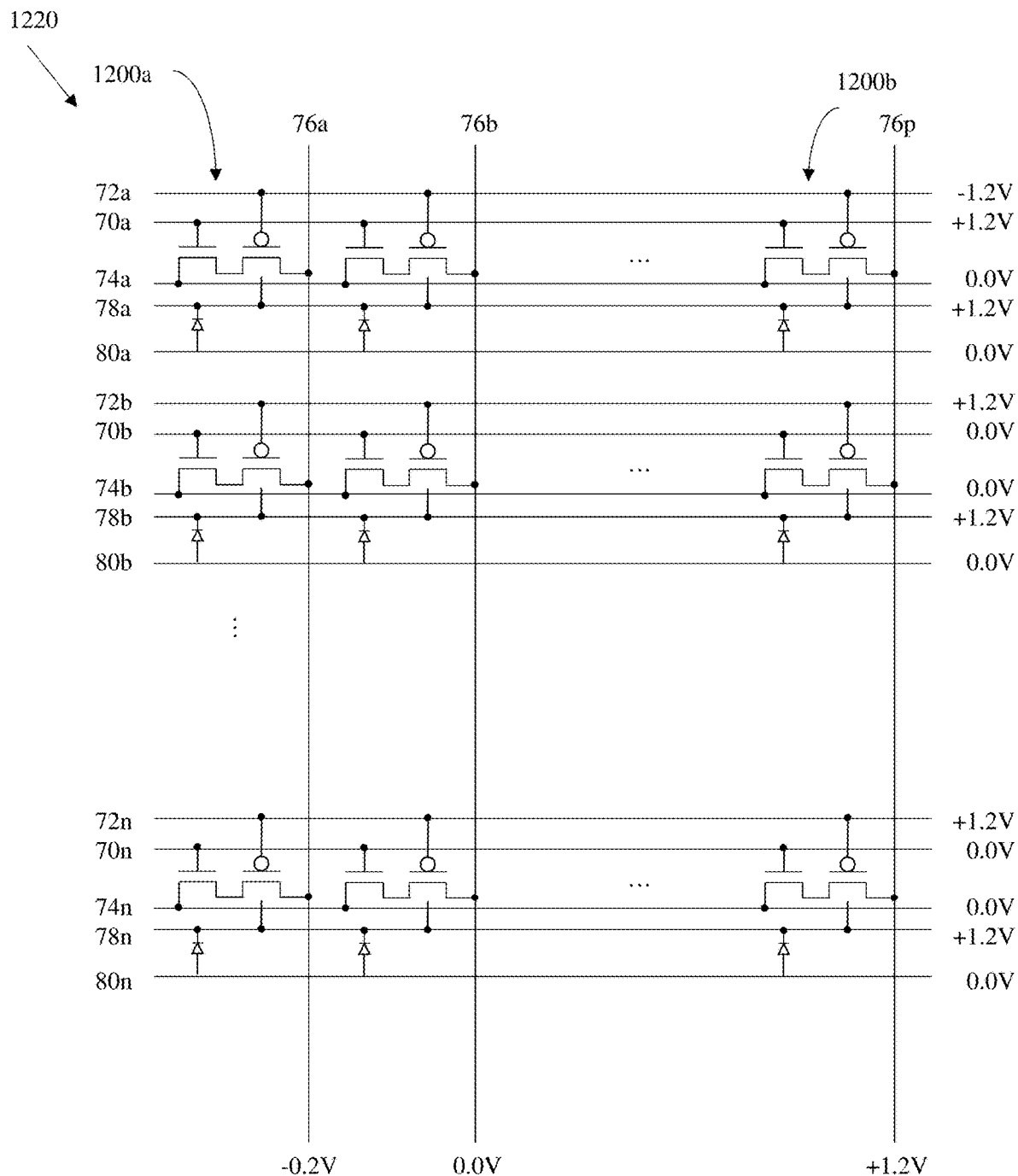
FIG. 73 schematically illustrates a write operation performed on a memory array comprising memory cells illustrated in FIG. 72 according to an embodiment of the present invention.
Figure 74A:
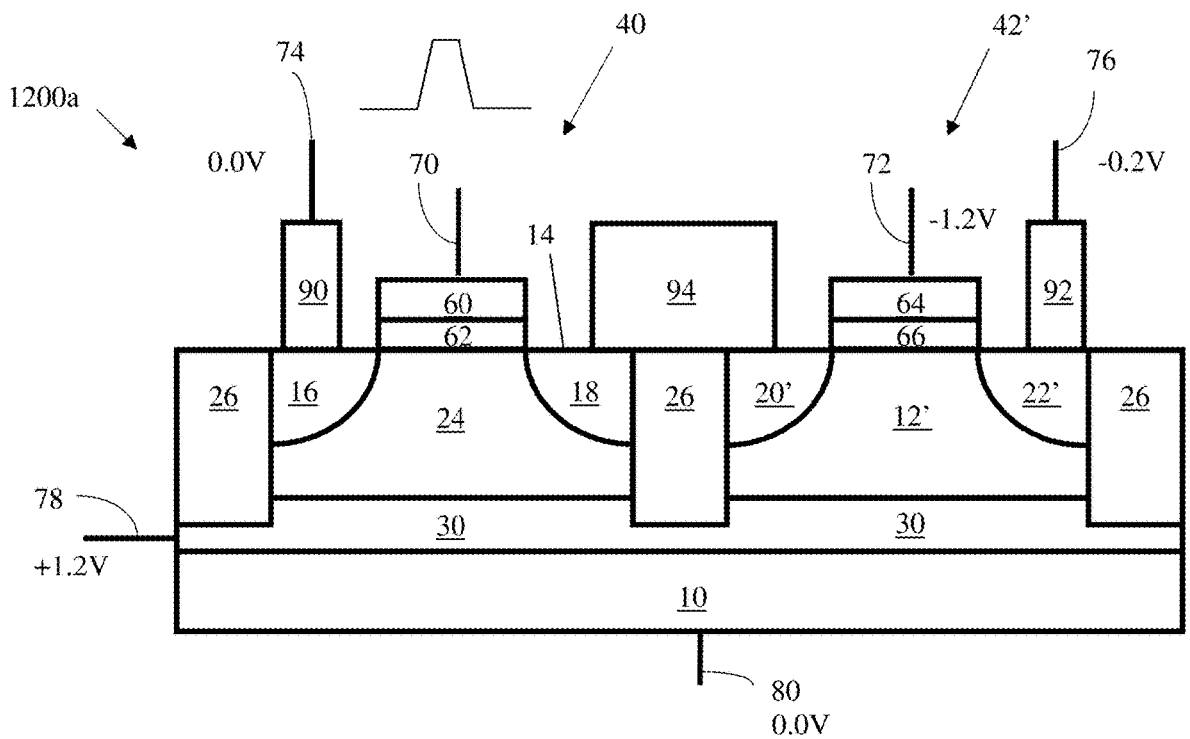
FIGS. 74A and 74B schematically illustrate write operations performed on a memory cell illustrated in FIG. 72, according to an embodiment of the present invention.
Figure 74B:
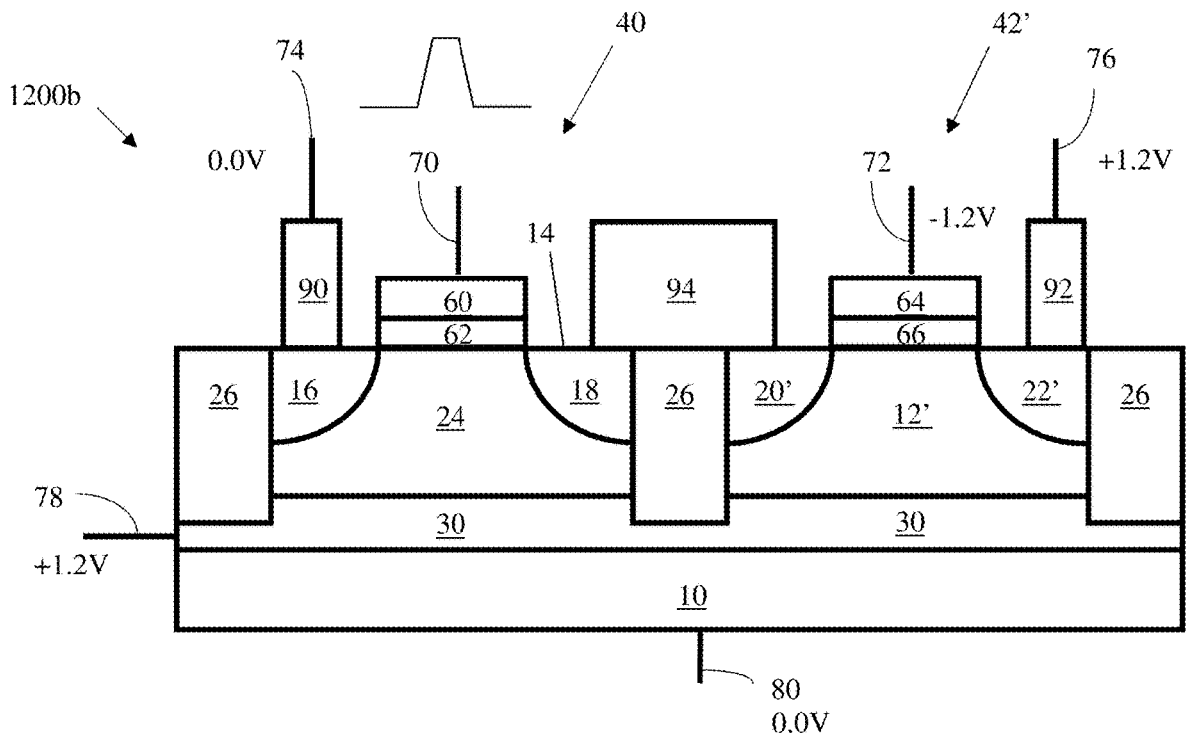

FIG. 73 schematically illustrates an example of a write operation performed on memory array 1220 of memory cells 1200 (including two exemplary instances of memory cell 1200 being labeled as 1200a and 1200b as shown) arranged in rows and columns. The write operation may be performed by applying the following bias conditions: a negative voltage is applied to the selected WL2 terminal 72, a positive voltage is applied to the selected WL1 terminal 70, zero voltage is applied to the selected SL terminal 74, zero or positive voltage is applied to the BW terminal 78, and zero voltage is applied to the SUB terminal 80. A positive voltage is applied to the selected BL terminal 76 for a write logic-1 operation and a negative voltage is applied to the selected BL terminal 76 for a write logic-0 operation. In FIG. 73, write logic-0 and write logic-1 operations are performed on memory cells 1200a and 1200b, respectively. The bias conditions applied to the memory cells 1200a and 1200b are illustrated in FIGS. 74A and 74B, respectively. The positive voltage applied to the selected WL1 terminal 70 may be configured to optimize write logic-0 and write logic-1 operations.

FIG. 73 also illustrates the bias condition applied to the unselected memory cells: a positive voltage is applied to the unselected WL2 terminal 72 (to turn off the access transistor 42'), zero voltage is applied to the unselected WL1 terminal 70 (to turn off the memory transistor 40), zero voltage is applied to the unselected SL terminal 74, zero voltage is applied to the unselected BL terminal 76, zero or positive voltage is applied to the BW terminal 78, and zero voltage is applied to the SUB terminal 80.

Figure 75:
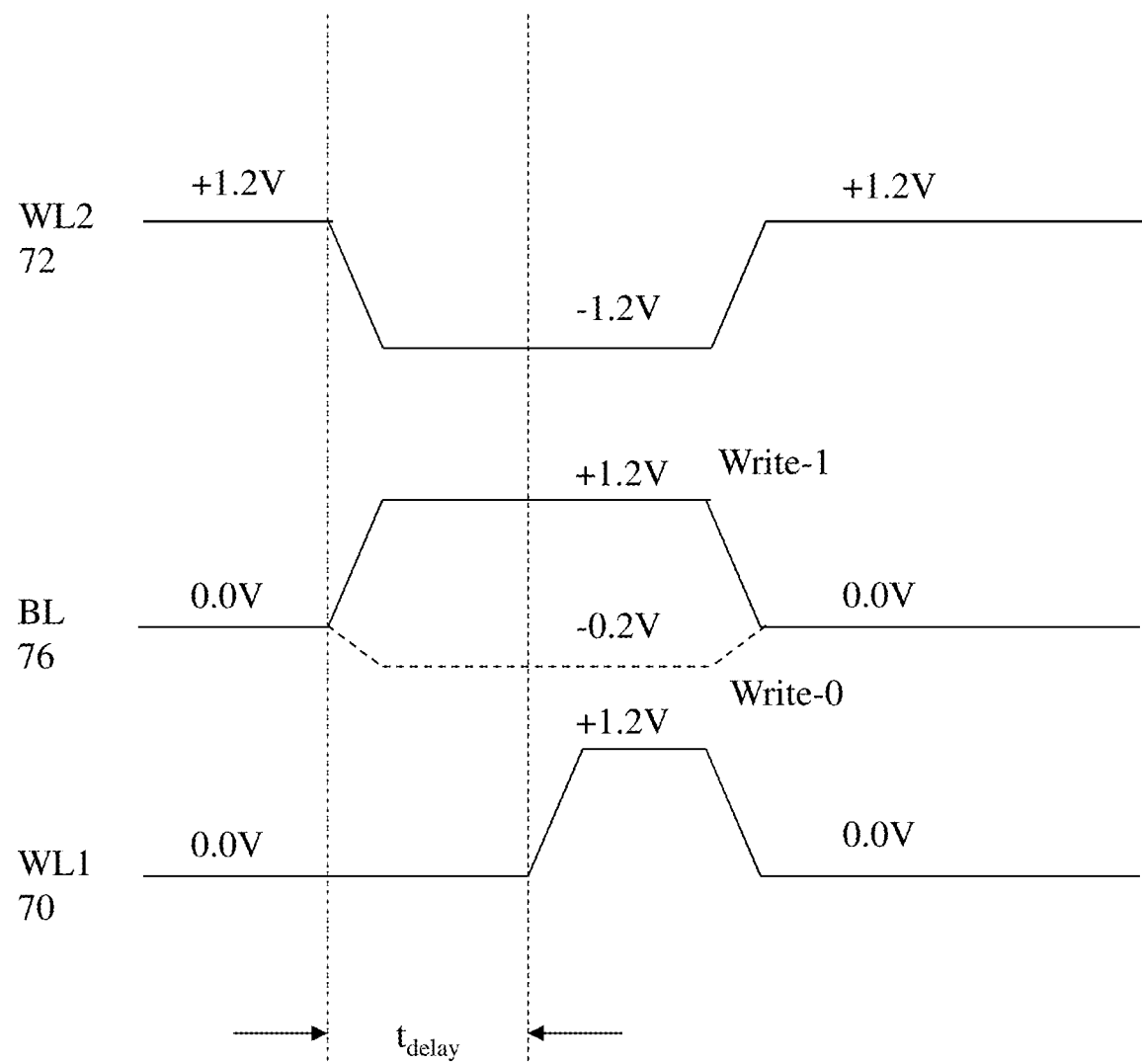
FIG. 75 schematically illustrates an exemplary waveform for a write operation performed on a memory cell illustrated in FIG. 72 according to an embodiment of the present invention.

FIG. 75 schematically illustrates an exemplary waveform that can be applied to the selected WL2 terminal 72, selected BL terminals 76, and selected WL1 terminal 70. There is a time delay $t_{delay}$ between the time the access transistor 42' is turned on (by applying a negative voltage to the selected WL2 terminal 72) and the memory transistor 40 is turned on. Before the memory cell 40 is turned on, the access transistor 42' will pass the voltage applied to the BL terminal 76 to the drain region 18 of the memory transistor 40. For memory cell 1200a, a negative bias condition is now applied to the drain region 18, and the p-n junction between the floating body 24 and the drain region 18 is forward-biased, evacuating holes from the floating body 24. For memory cell 1200b, a positive bias condition is now applied to the drain region 18. After $t_{delay}$, the selected WL1 terminal is raised to a positive voltage. Under these bias conditions (positive voltage applied to the drain region 18 and the gate region 60), the memory cell 1200b will be written to logic-1 state through impact ionization mechanism or through capacitive coupling mechanism. The time delay $t_{delay}$ is configured such that the write logic-0 operation can be completed. In one particular non-limiting embodiment, the time delay $t_{delay}$ is 100 picoseconds, but may range from 10 picoseconds to 1 microsecond.

In one particular non-limiting embodiment, about −1.2 volts is applied to the selected WL2 terminal 72, about +1.2 volts is applied to the selected WL1 terminal about +1.2 volts and about −0.2 volts is applied to the selected BL terminal 76 for write logic-1 and write logic-0 operations, respectively, about +1.2 volts is applied to the selected BW terminal 78, and about 0.0 volts is applied to the SUB terminal 80. For the unselected cells, about +1.2 volts is applied to the unselected WL2 terminal 72, about 0.0 volts is applied to the unselected WL1 terminal 70, about 0.0 volts is applied to the unselected BL terminal 76, about +1.2 volts is applied to the selected BW terminal 78, and about 0.0 volts is applied to the SUB terminal 80.

From the foregoing it can be seen that a memory cell having an electrically floating body has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

That which is claimed is:

1. A semiconductor memory cell comprising:
   a bi-stable floating body transistor having a floating body region and a back-bias region configured to generate impact ionization when said memory cell is in one of first and second states, and wherein said back-bias region is configured so as not to generate impact ionization when said memory cell is in the other of said first and second states;
   wherein said bi-stable floating body transistor is insulated from adjacent memory cells by an insulating layer in one direction and by a dummy transistor in another direction.

2. The semiconductor memory cell of claim 1, where said bi-stable floating body transistor comprises a gate region and said dummy transistor comprises a dummy gate region.

3. The semiconductor memory cell of claim 2, wherein a zero or negative voltage is applied to said dummy gate region.

4. The semiconductor memory cell of claim 2, wherein said semiconductor memory cell comprises fin regions.

5. The semiconductor memory cell of claim 4, wherein said dummy gate covers a first surface area of a first fin region of said fin regions and said gate region of said floating body transistor covers a second surface area of a second fin region of said fin regions, and wherein said first surface area is greater than said second surface area.

6. The semiconductor memory cell of claim 2, wherein said dummy gate region comprises regions having at least two different work functions.

7. The semiconductor memory cell of claim 6, wherein an upper region of said dummy gate region has a work function that can suppress electron flow and a lower region of said dummy gate region has a work function that can suppress penetration of excess holes.

8. The semiconductor memory cell of claim 1, wherein said dummy transistor is in an off state.

9. The semiconductor memory cell of claim 1, comprising an insulating layer with different depths.

10. The semiconductor memory cell of claim 9, wherein said different depths comprise a first depth of said insulating layer adjacent to said dummy transistor that is shorter than a second depth of said insulating layer adjacent to said bi-stable floating body transistor.

11. The semiconductor memory cell of claim 1, wherein said dummy transistor comprises a nanowire.

12. A semiconductor memory array comprising:
a plurality of semiconductor memory cells arranged in a matrix of rows and columns, wherein at least two of said semiconductor memory cells each include:
a bi-stable floating body transistor having a first floating body region and a back-bias region configured to generate impact ionization when said memory cell is in one of first and second states, and wherein said back-bias region is configured so as not to generate impact ionization when said memory cell is in the other of said first and second states;
wherein said bi-stable floating body transistor is insulated from adjacent memory cells by an insulating layer in one direction and by a dummy transistor in another direction.

13. The semiconductor memory array of claim 12, where said floating body transistor comprises a gate region and said dummy transistor comprises a dummy gate region.

14. The semiconductor memory array of claim 13, wherein said semiconductor memory cell comprises fin regions.

15. The semiconductor memory array of claim 14, wherein said dummy gate covers a first surface area of a first fin region of said fin regions and said gate region of said floating body transistor covers a second surface area of a second fin region of said fin regions, and wherein said first surface area is greater than said second surface area.

16. The semiconductor memory array of claim 13, wherein said dummy gate region comprises regions having at least two different work functions.

17. The semiconductor memory array of claim 16, wherein an upper region of said regions has a work function that can suppress electron flow and a lower region of said regions has a work function that can suppress penetration of excess holes.

18. The semiconductor memory array of claim 12, wherein said dummy transistor is in an off state.

19. The semiconductor memory array of claim 13, wherein a zero or negative voltage is applied to said dummy gate region.

20. The semiconductor memory array of claim 12, comprising an insulating layer with different depths.

21. The semiconductor memory array of claim 20, wherein a first depth of said different depths of said insulating layer adjacent to said dummy transistor is less than a second depth of said different depths of said insulating layer adjacent to said bi-stable floating body transistor.

22. The semiconductor memory array of claim 12, wherein said dummy transistor comprises a nanowire.

* * * * *